United States Patent
Yang

(10) Patent No.: US 10,355,658 B1
(45) Date of Patent: Jul. 16, 2019

(54) AUTOMATIC VOLUME CONTROL AND LEVELER

(71) Applicant: Amazon Technologies, Inc., Seattle, WA (US)

(72) Inventor: Jun Yang, Seattle, WA (US)

(73) Assignee: Amazon Technologies, Inc, Seattle, WA (US)

( * ) Notice: Subject to any disclaimer, the term of this patent is extended or adjusted under 35 U.S.C. 154(b) by 0 days.

(21) Appl. No.: 16/138,540

(22) Filed: Sep. 21, 2018

(51) Int. Cl.
H03G 3/00 (2006.01)
H03G 3/30 (2006.01)
H04R 29/00 (2006.01)
G10L 25/21 (2013.01)

(52) U.S. Cl.
CPC ............ *H03G 3/301* (2013.01); *G10L 25/21* (2013.01); *H03G 3/002* (2013.01); *H04R 29/001* (2013.01); *H03G 2201/103* (2013.01)

(58) Field of Classification Search
CPC ............ H03G 3/00; H03G 3/002; H03G 3/02; H03G 3/20; H03G 3/301; H03G 3/3089; H03G 2201/50; H03G 2201/103; H03G 2201/106; H03G 3/001; H03G 3/32; H03G 3/005; H03G 3/04; H03G 7/00; H04R 29/00; H04R 29/001; G06F 17/00; G06F 17/3074; G06F 17/30743
USPC ........... 381/104, 105, 107, 108, 109; 700/94
See application file for complete search history.

(56) References Cited

U.S. PATENT DOCUMENTS

| | | | | |
|---|---|---|---|---|
| 4,381,488 A | * | 4/1983 | Fricke | H03G 7/004 333/14 |
| 5,949,886 A | * | 9/1999 | Nevins | H03G 3/32 381/104 |
| 8,565,908 B2 | * | 10/2013 | Sabin | H03G 5/165 381/58 |
| 9,253,586 B2 | * | 2/2016 | Nystrom | H04S 7/307 |
| 9,391,575 B1 | * | 7/2016 | Yang | H03G 3/3005 |
| 9,401,685 B2 | * | 7/2016 | Krishnaswamy | H03G 3/20 |
| 9,431,982 B1 | * | 8/2016 | Yang | H03G 3/20 |
| 9,559,650 B1 | * | 1/2017 | Skovenborg | H03G 3/3005 |
| 2011/0274293 A1 | * | 11/2011 | Yue | H04M 1/60 381/107 |
| 2013/0061143 A1 | * | 3/2013 | Eppolito | G06F 3/04847 715/716 |
| 2013/0136277 A1 | * | 5/2013 | Sudo | H03G 3/3005 381/107 |

* cited by examiner

*Primary Examiner* — Xu Mei
(74) *Attorney, Agent, or Firm* — Pierce Atwood LLP

(57) ABSTRACT

A system that performs automatic volume control and leveling (AVCL) based on audio category and desired volume level. The system may select different settings for audio data associated with different audio sources (e.g., content providers), audio categories (e.g., types of audio data, such as music, voice, etc.), genres, and/or the like. For example, the system may distinguish between music signals and voice signals (e.g., speech) and may apply a first gain curve for the music and a second gain curve for the speech. The gain curve may include an adaptive noise gate to reduce in-channel noise, such as by attenuating quiet sounds. The system may select the gain curve based on a desired volume level, and in some examples may modify the gain curve based on a signal-to-noise ratio (SNR) of the input audio and/or based on environmental noise.

20 Claims, 34 Drawing Sheets

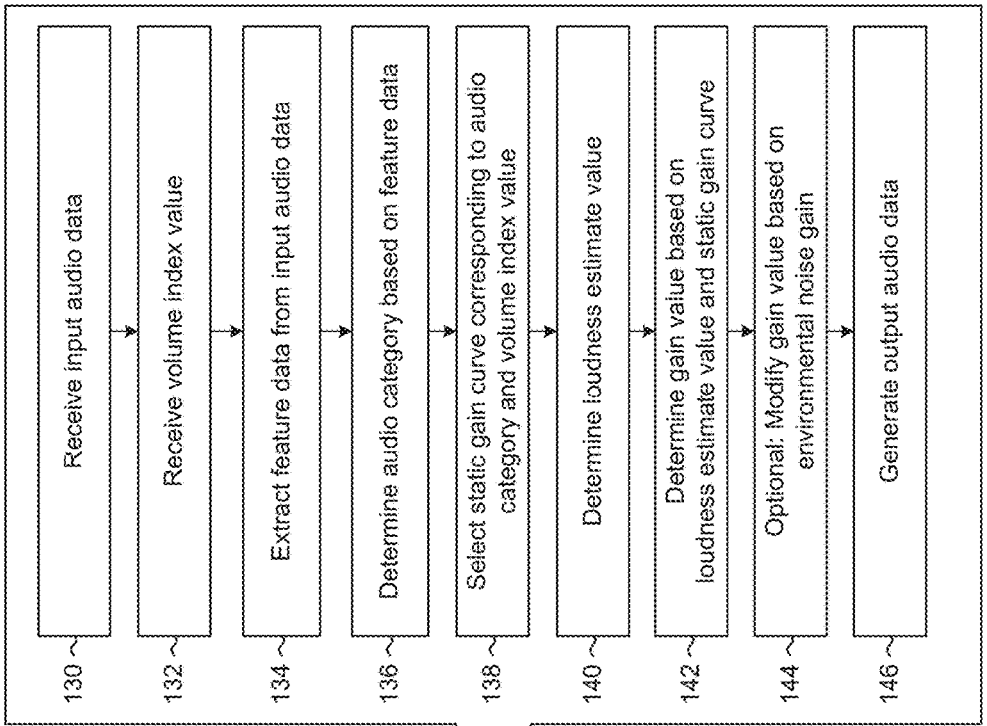
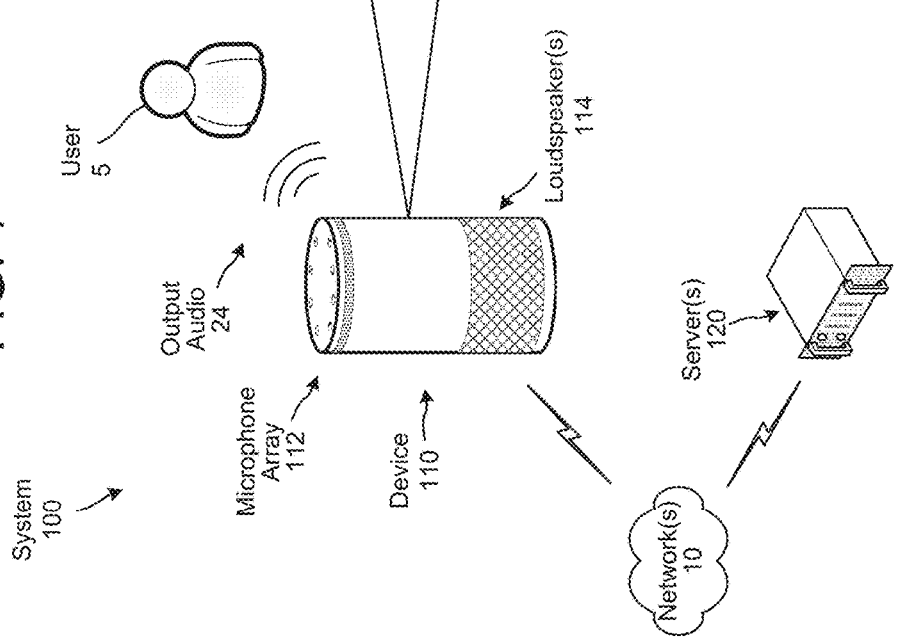
FIG. 1

FIG. 2
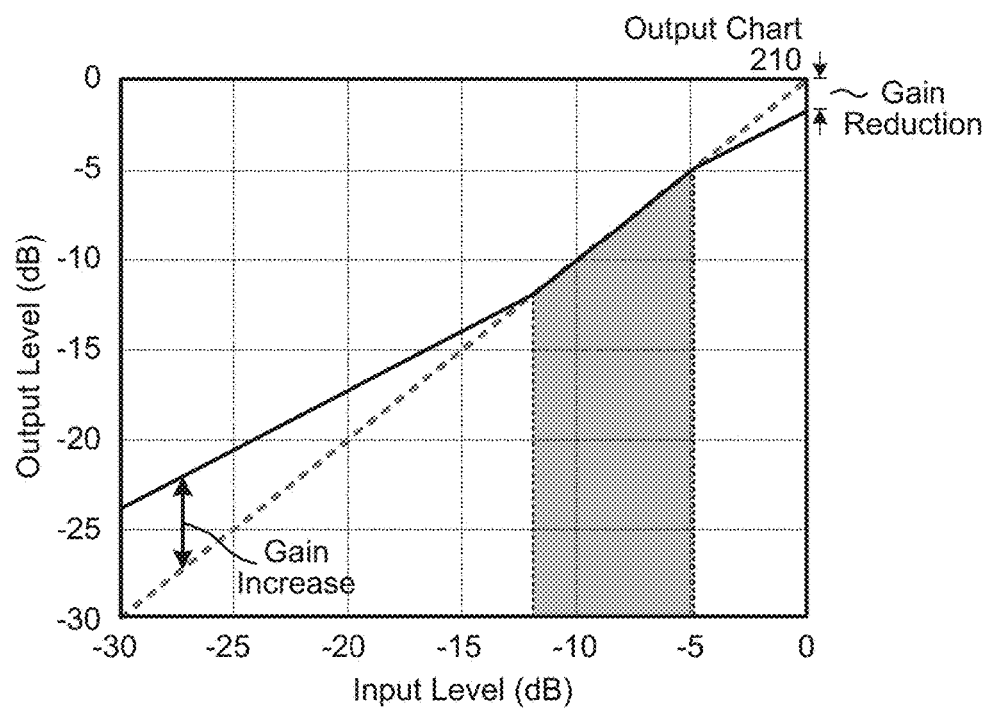
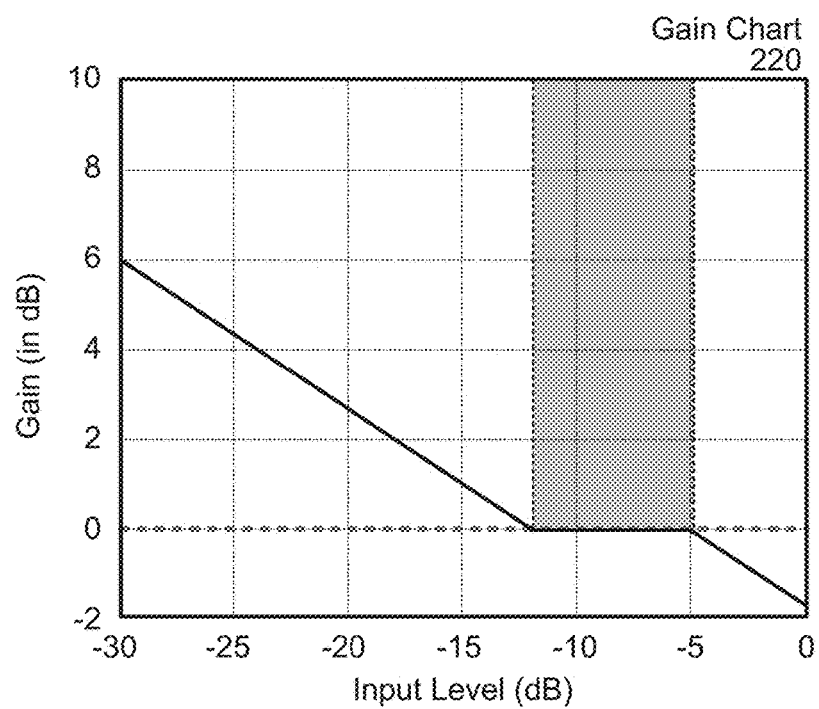

FIG. 3
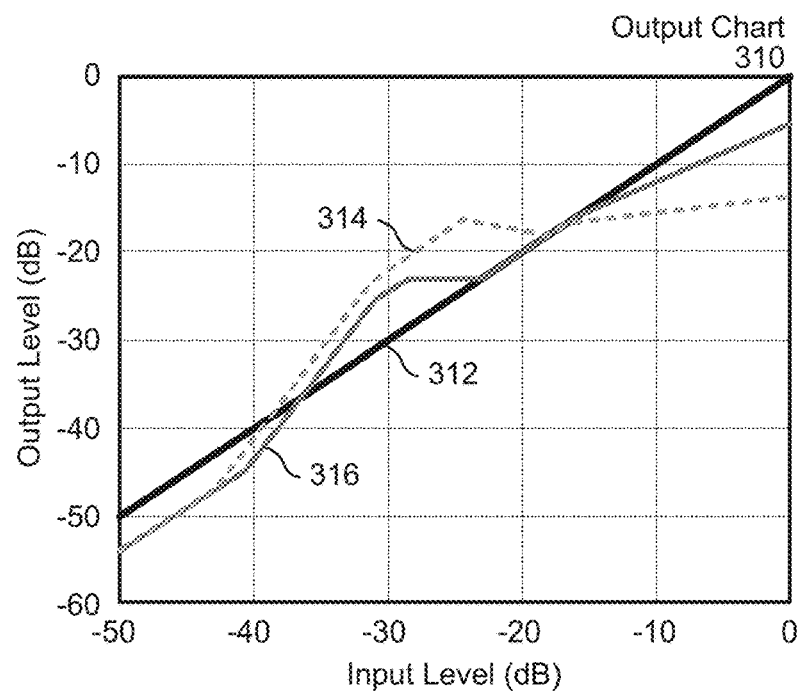
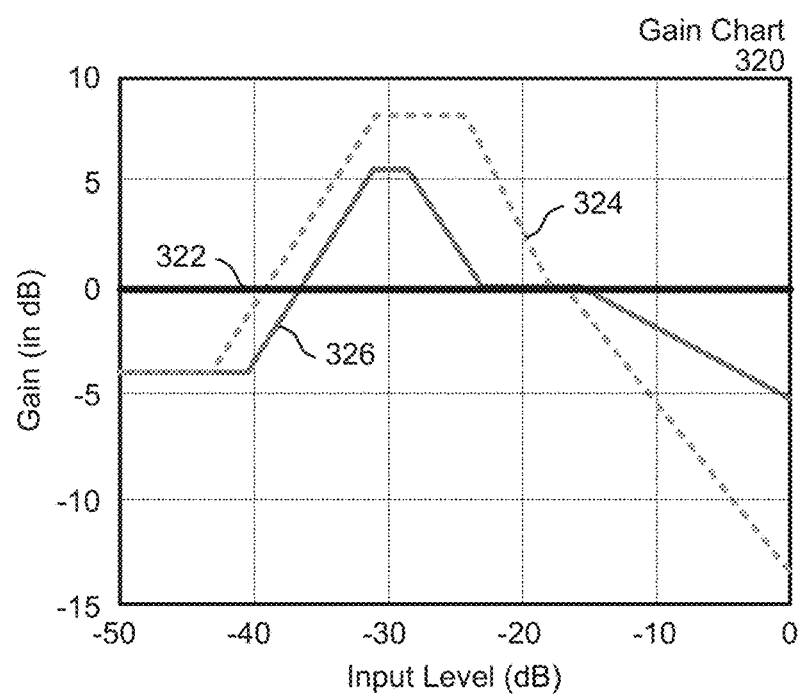

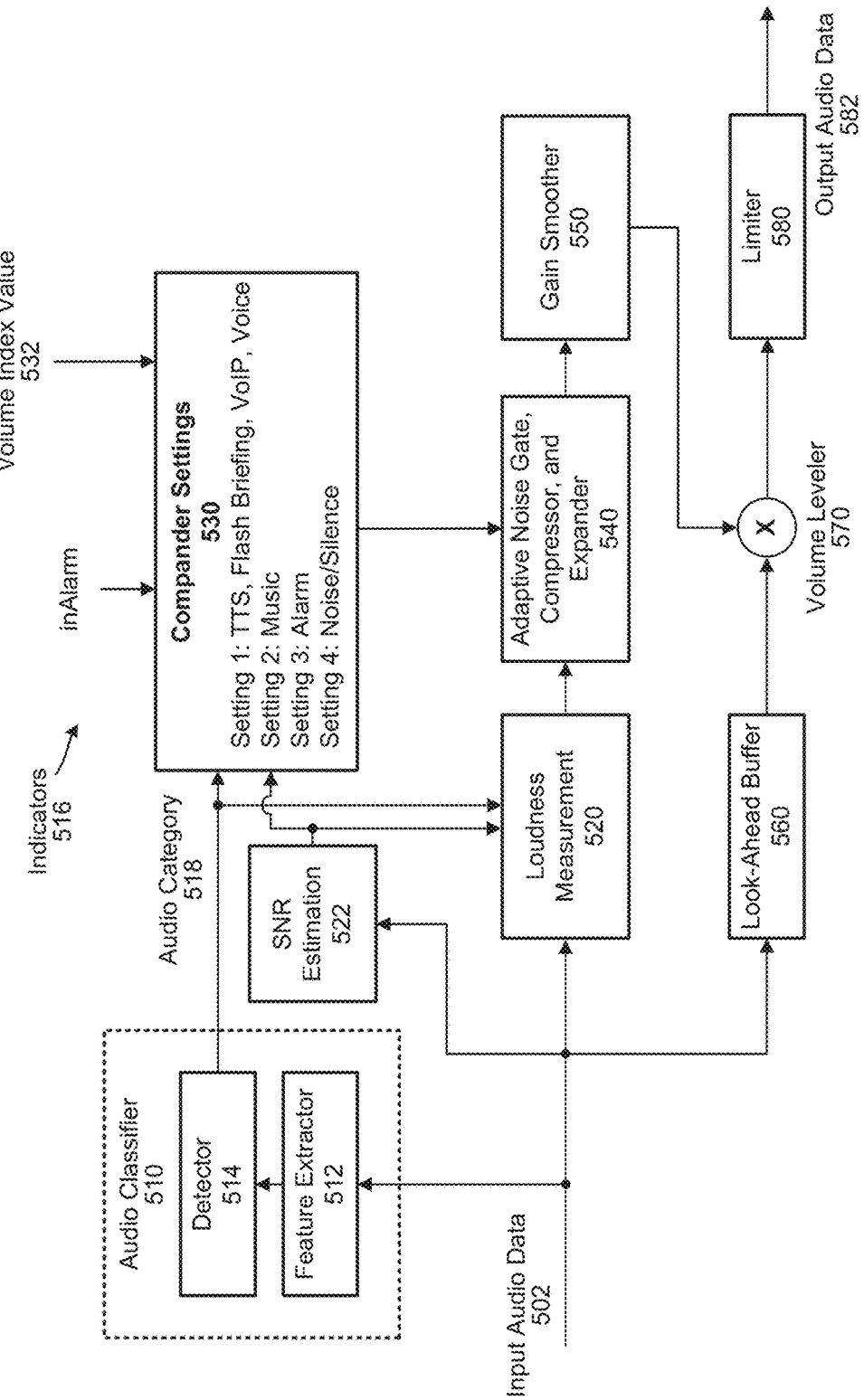

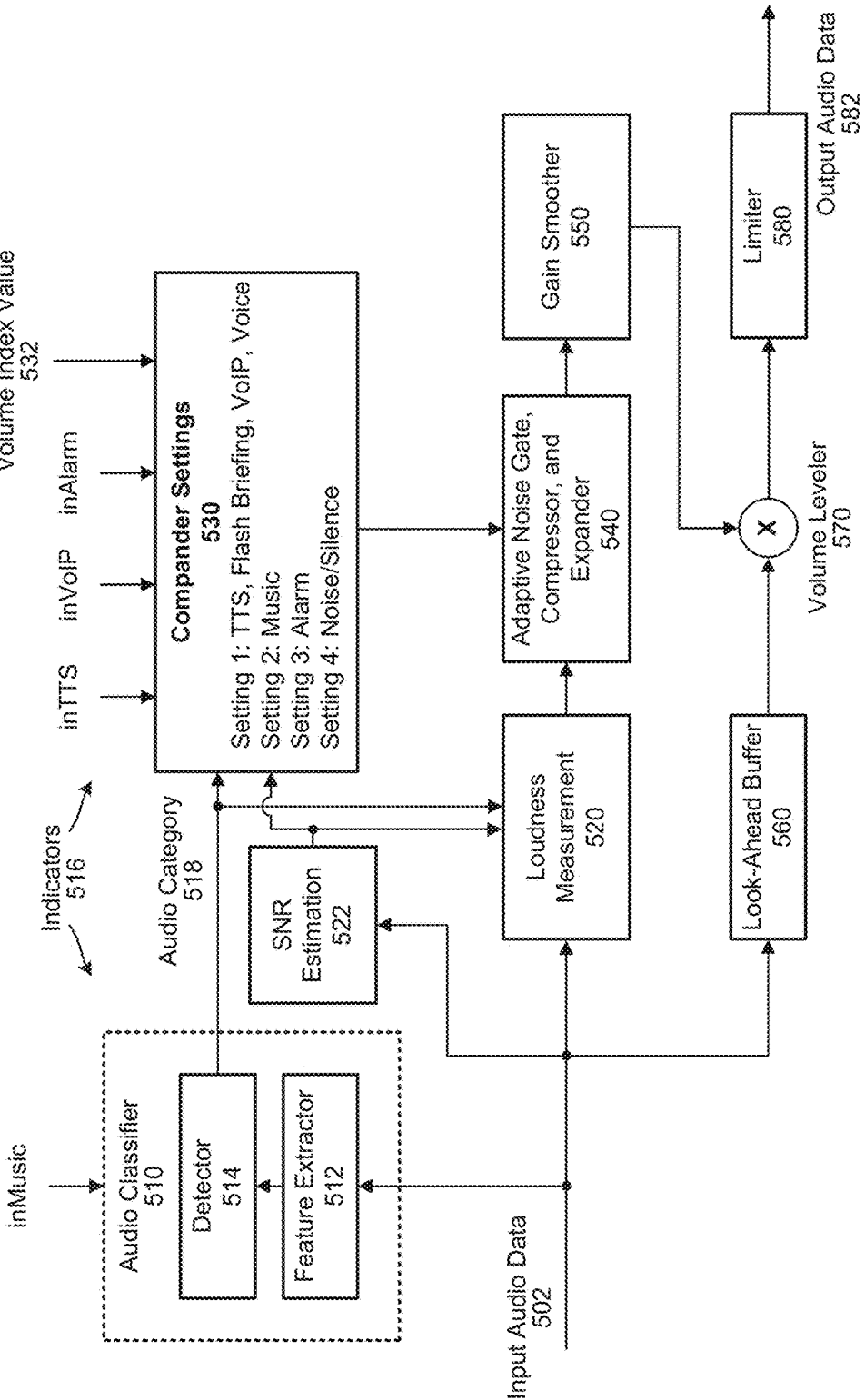

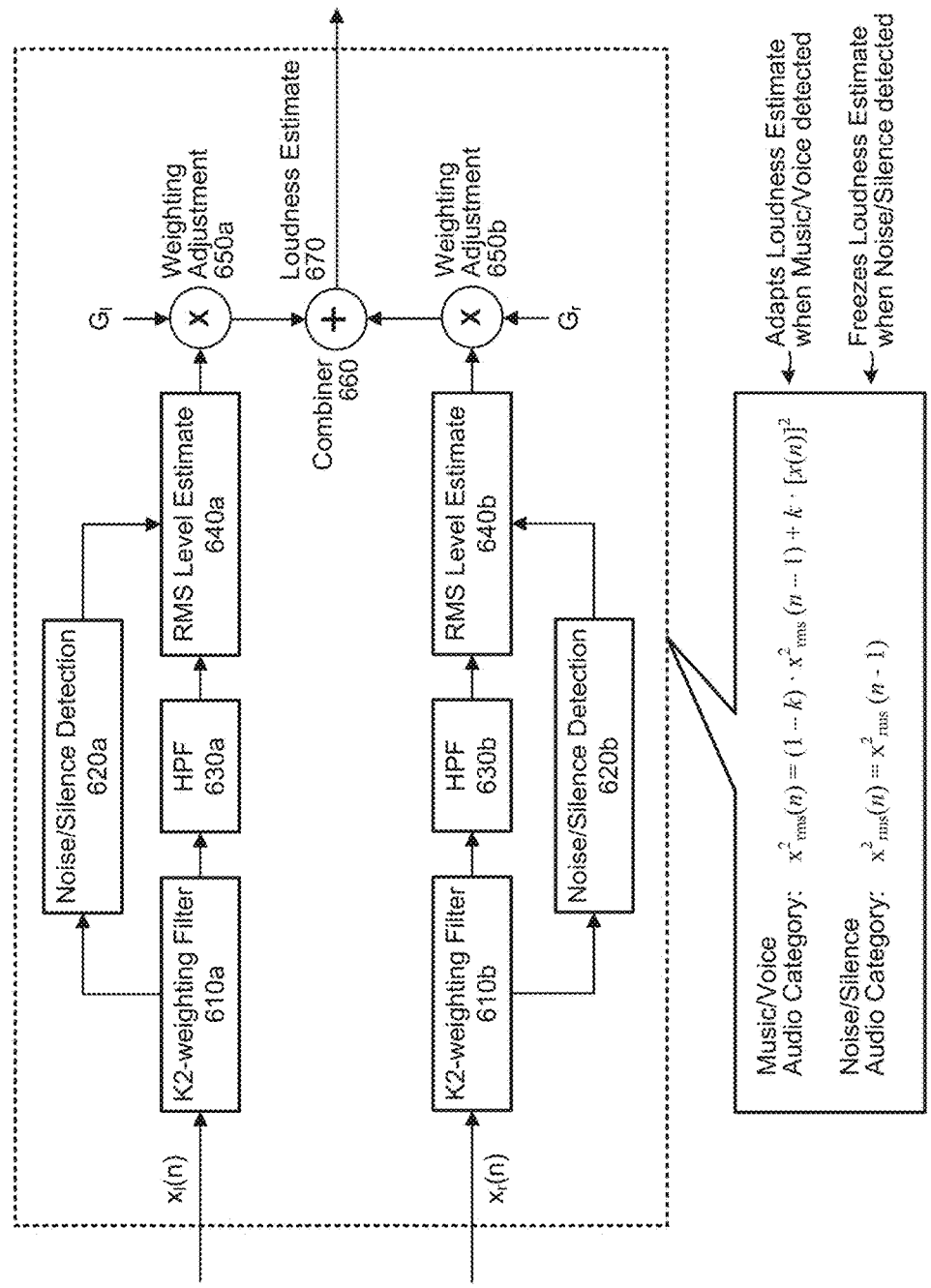

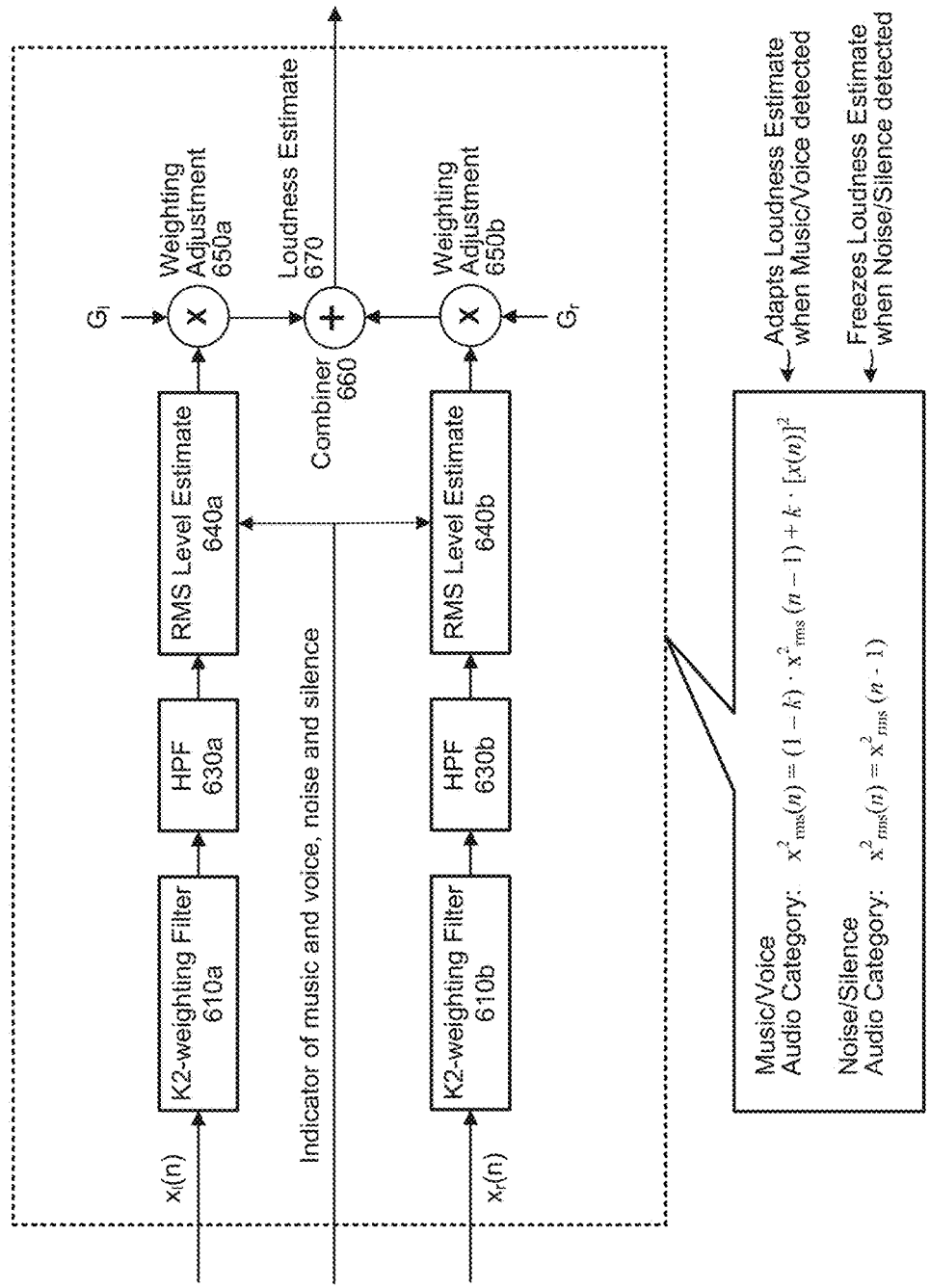

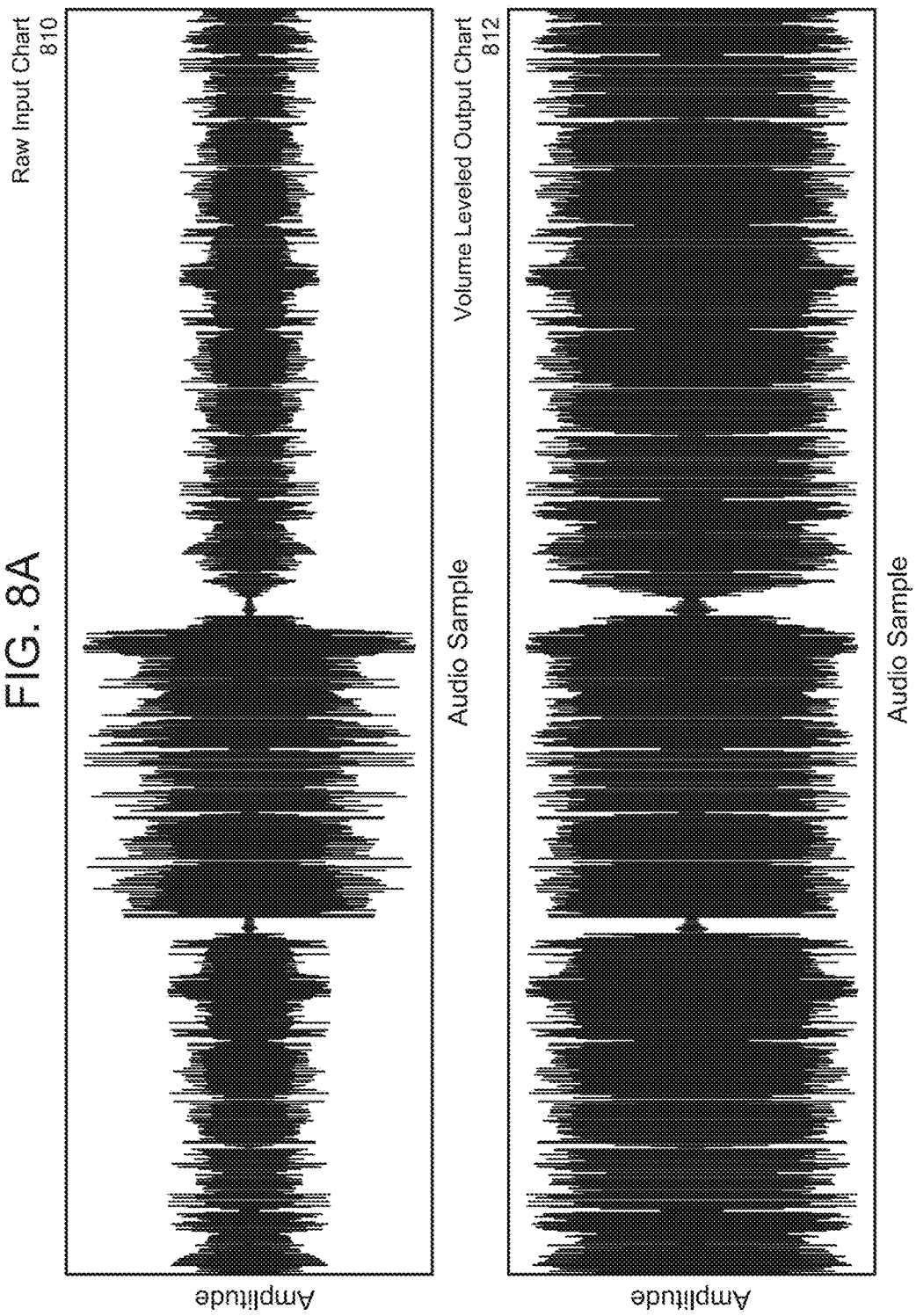

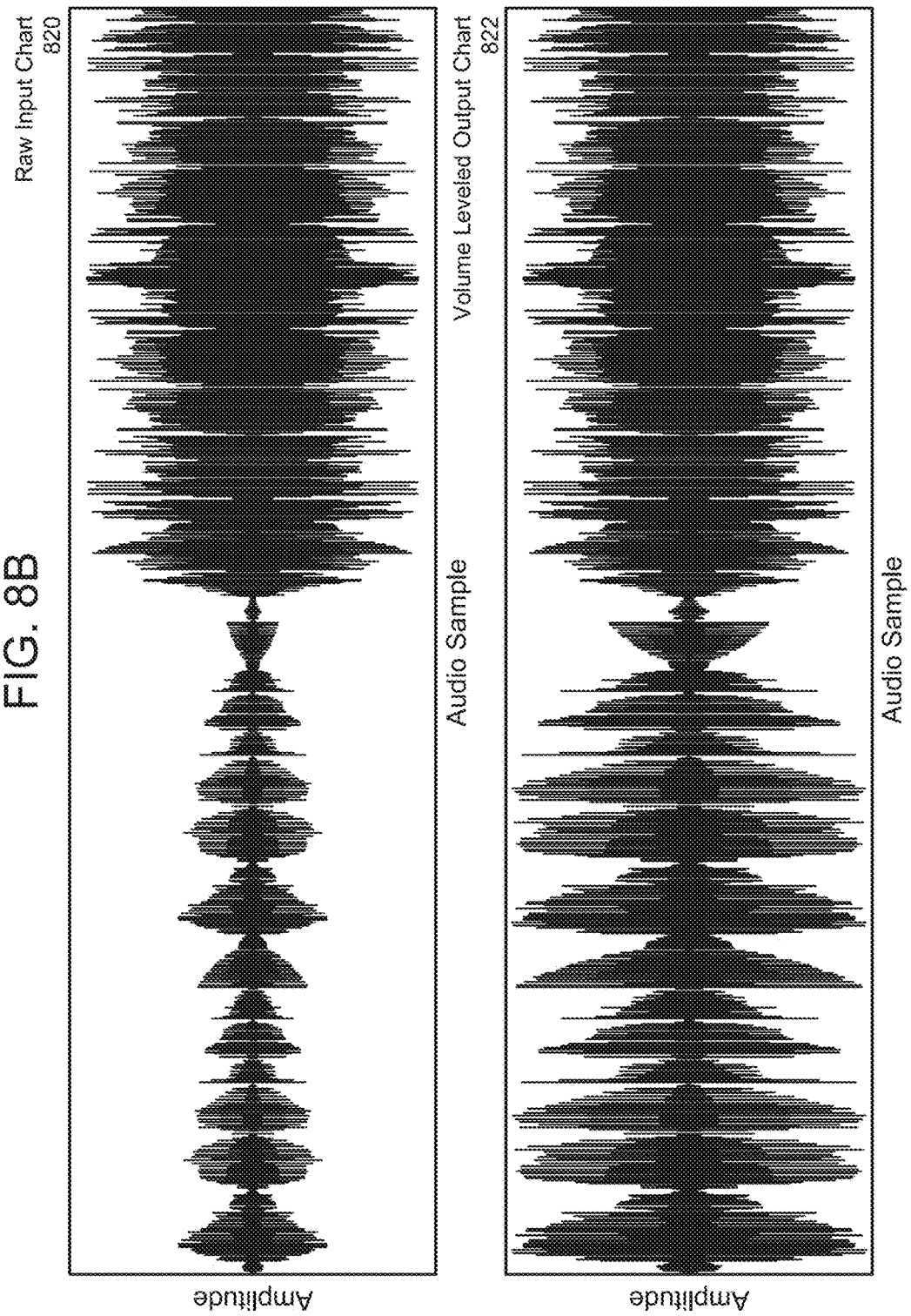

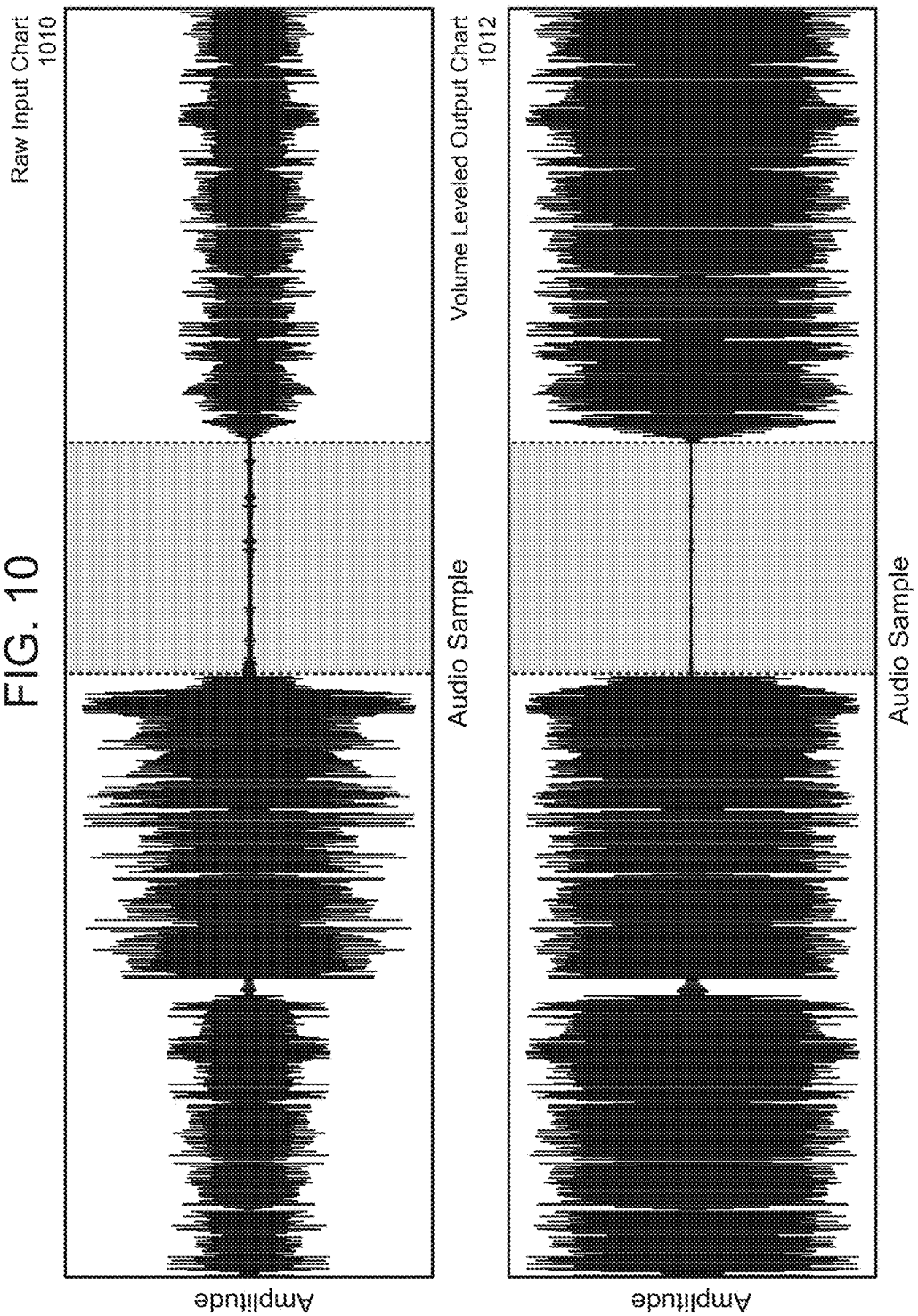

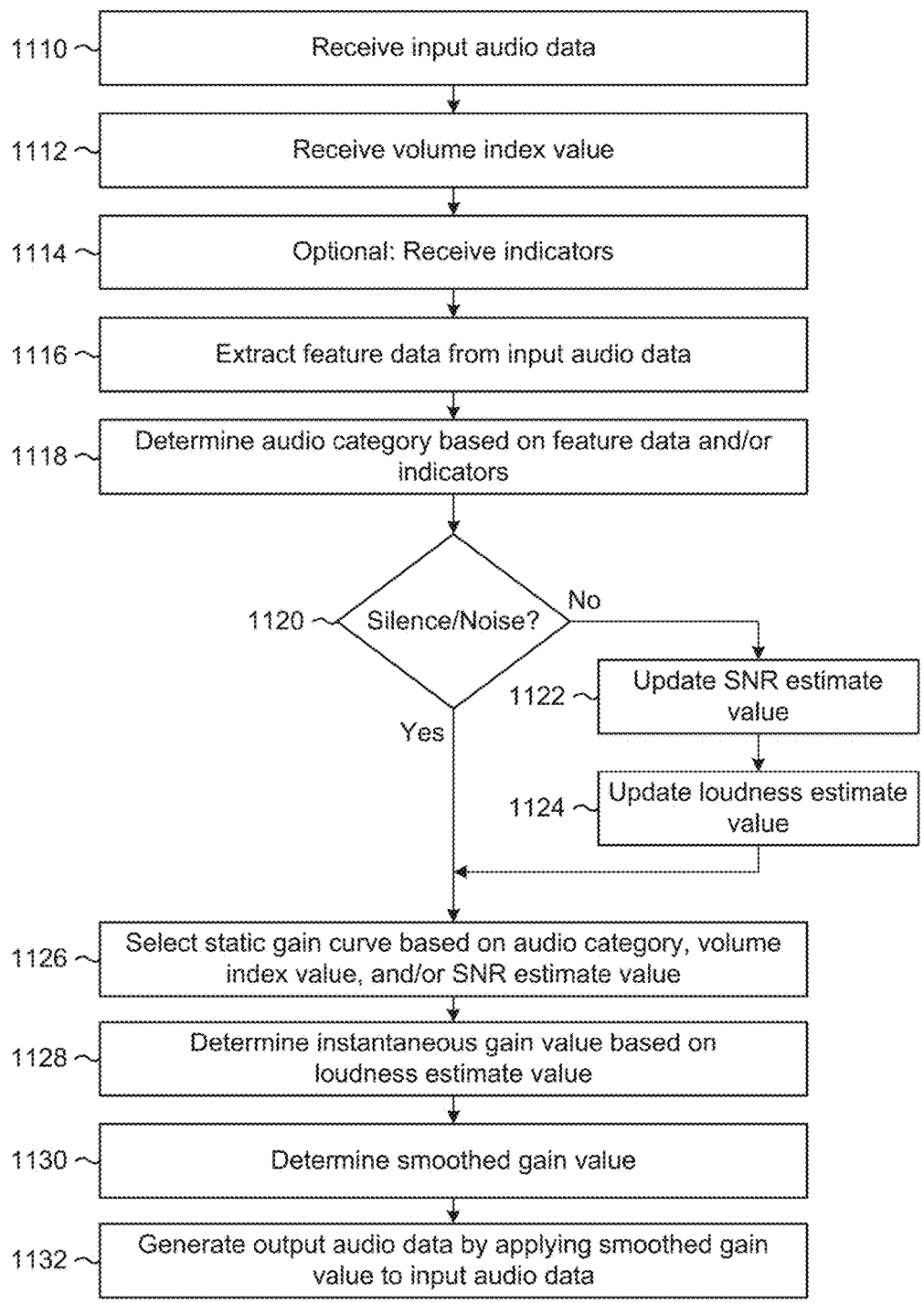

(Input ≤ TH₁): Adaptive Noise Gate 1220
Gain = Slope$_{Noise}$ * (Input − TH$_1$) + MaxGain
if (Gain < MinGain) then Gain = MinGain

(TH₁ < Input < TH₂): Adaptive Expander 1222
Gain = Slope$_{Exp}$ * (TH$_2$ − Input)
if (Gain > MaxGain), then Gain = MaxGain

(TH₂ ≤ Input ≤ TH₃): Linear Region 1224
Gain = 0.0 dB

(TH₃ < Input): Adaptive Compressor 1226
Gain = Slope$_{Comp}$ * (TH$_3$ − Input)

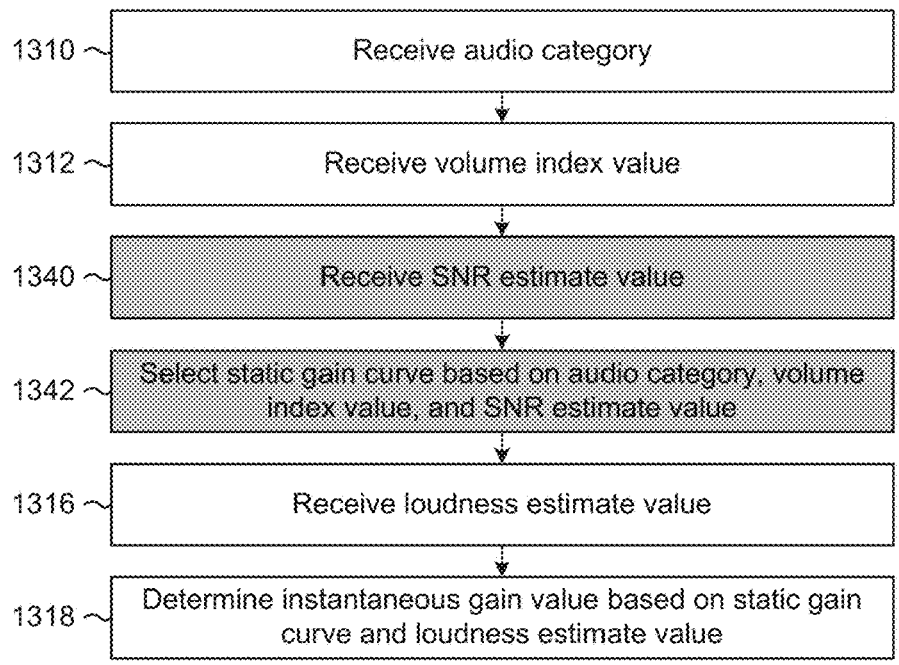
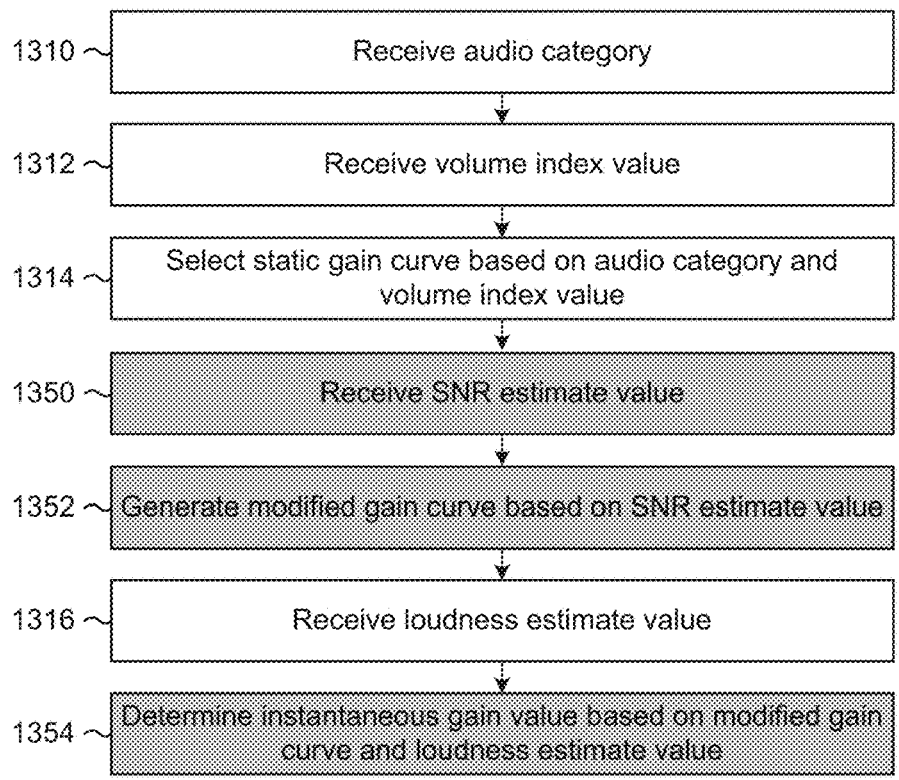

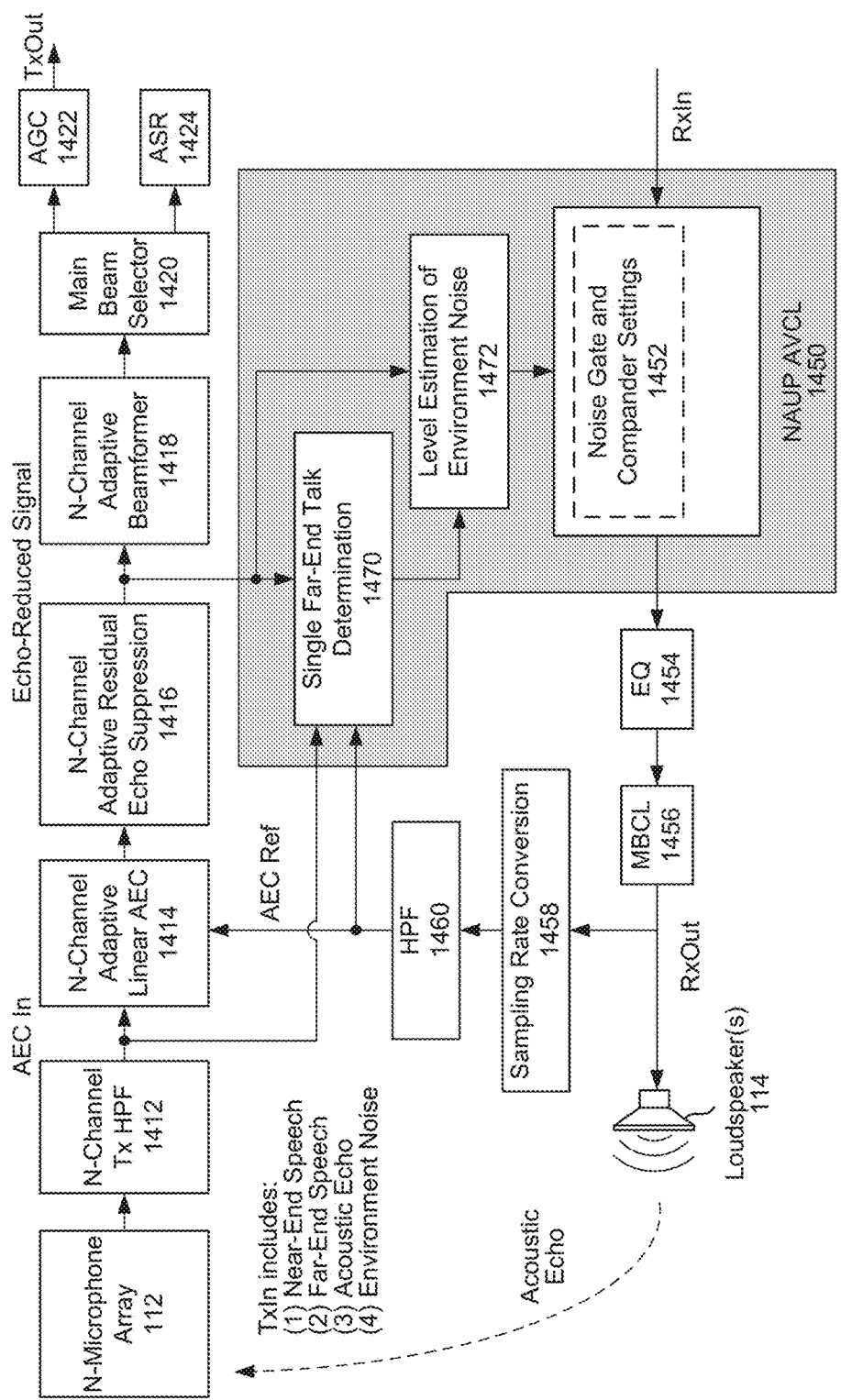

FIG. 15
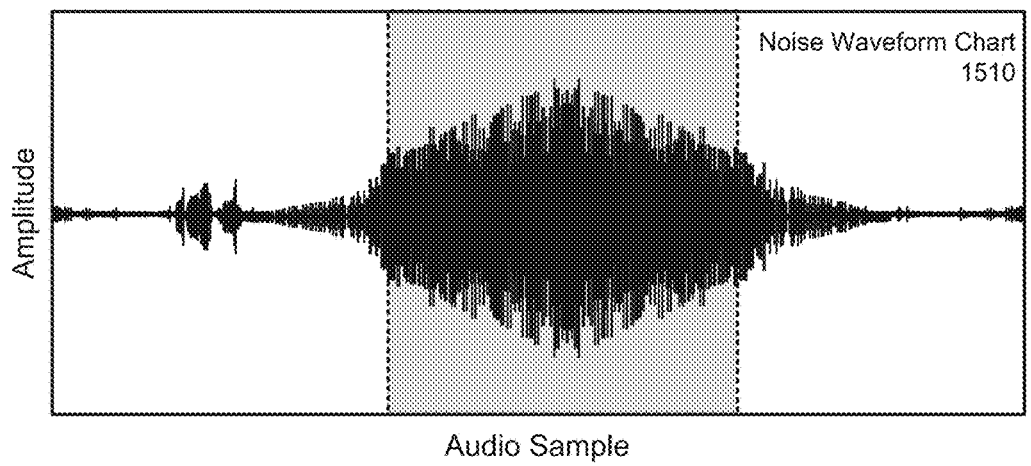
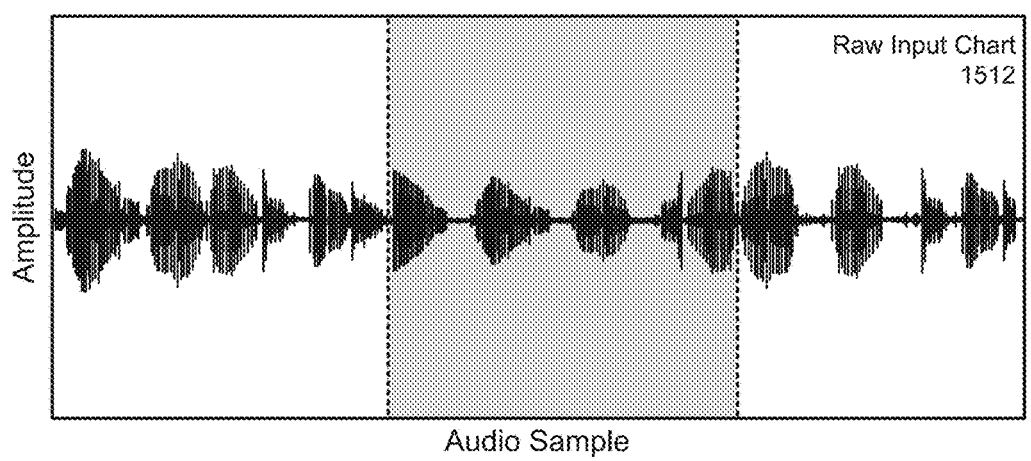
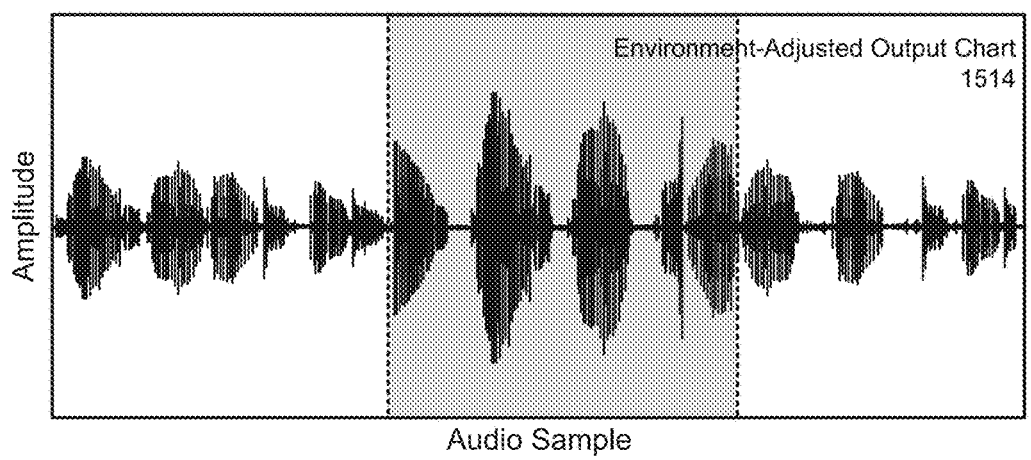

AUTOMATIC VOLUME CONTROL AND LEVELER

BACKGROUND

With the advancement of technology, the use and popularity of electronic devices has increased considerably. Electronic devices are commonly used to receive audio data and generate output audio based on the received audio data. Described herein are technological improvements to such systems, among other things.

BRIEF DESCRIPTION OF DRAWINGS

For a more complete understanding of the present disclosure, reference is now made to the following description taken in conjunction with the accompanying drawings.

FIG. 1 illustrates a system for performing automatic volume control and leveling based on audio categories according to embodiments of the present disclosure.

FIG. 2 illustrates an example of an output chart and a corresponding gain chart that illustrate dynamic range compression.

FIG. 3 illustrates example output and gain charts for different audio categories according to embodiments of the present disclosure.

FIGS. 5A-5D illustrate example component diagrams for performing automatic volume control and leveling according to embodiments of the present disclosure.

FIGS. 6A-6B illustrate example component diagrams for determining a loudness estimate according to embodiments of the present disclosure.

FIGS. 8A-8B illustrate examples of volume-leveled output data according to embodiments of the present disclosure.

FIG. 10 illustrates an example of volume-leveled output data with in-channel noise reduction according to embodiments of the present disclosure.

FIGS. 11A-11B are flowcharts conceptually illustrating example methods for generating volume-leveled output audio data according to embodiments of the present disclosure.

FIGS. 13A-13D are flowcharts conceptually illustrating example methods for determining an instantaneous gain value according to embodiments of the present disclosure.

FIG. 14 illustrates an example component diagram for performing environment-aware adaptive gain according to embodiments of the present disclosure.

FIG. 15 illustrates an example of volume-leveled output data with environment-aware adaptive gain applied according to embodiments of the present disclosure.

DETAILED DESCRIPTION

Figure 4:
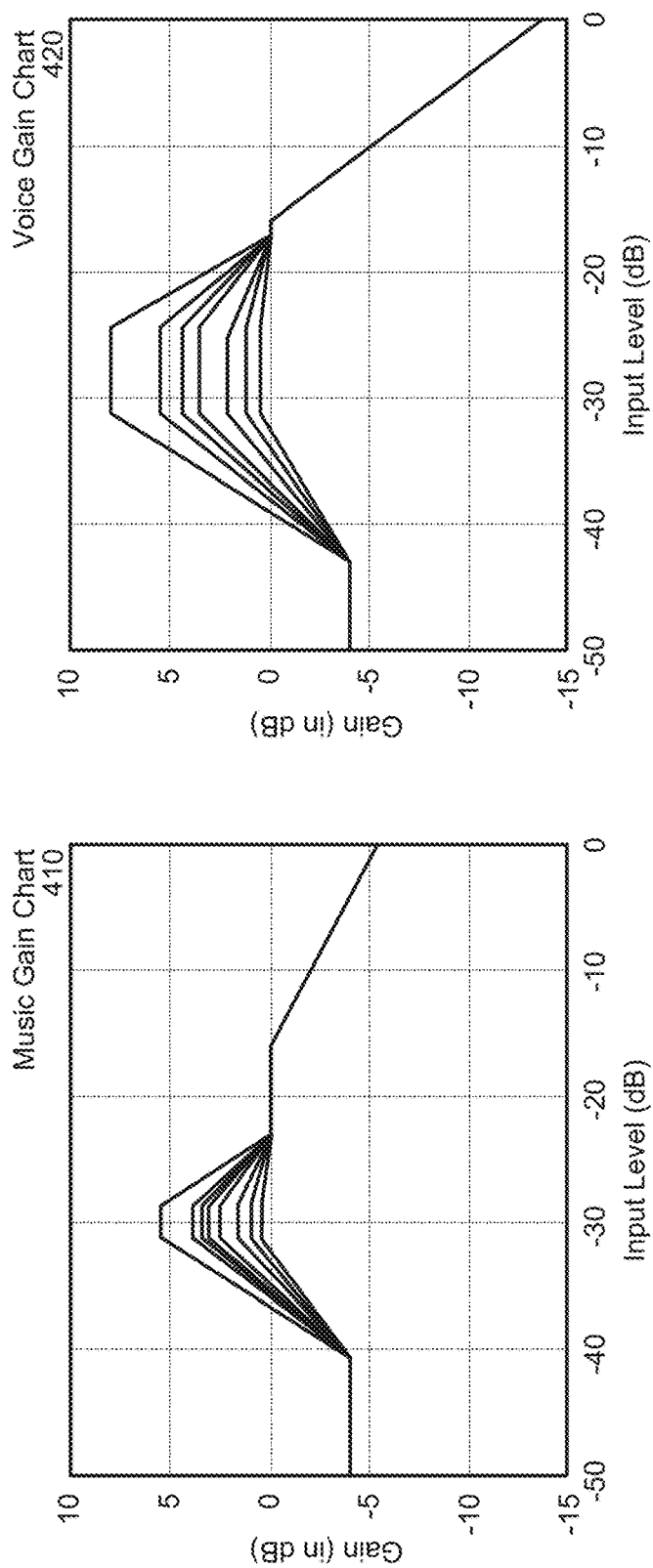
FIG. 4 illustrates example gain charts for different volume levels and different audio categories according to embodiments of the present disclosure.

Electronic devices may be used to receive audio data and generate audio corresponding to the audio data. For example, an electronic device may receive audio data from various audio sources (e.g., content providers) and may generate the audio using loudspeakers. The audio data may have large level changes (e.g., large changes in volume) within a song, from one song to another song, between different voices during a conversation, from one content provider to another content provider, and/or the like. For example, a first portion of the audio data may correspond to music and may have a high volume level (e.g., extremely loud volume), whereas a second portion of the audio data may correspond to a talk radio station and may have a second volume level (e.g., quiet volume).

However, a listener may prefer a consistent and balanced loudness experience (e.g., audio at a consistent volume level) regardless of the level changes that occur in the audio data. Some devices maintain a consistent volume level between different types of audio data by performing automatic volume leveling (AVL) to boost the audio data to a desired volume level. For example, AVL may modify the audio data so that both the first portion and the second portion have a desired volume level. Thus, output audio will maintain a consistent volume level when transitioning between the first portion and the second portion.

While AVL maintains a consistent volume level, conventional techniques may modify the audio data using a similar process for both the first portion and the second portion. Thus, the first portion (e.g., music signals) is volume-leveled using a similar gain curve as the second portion (e.g., voice signals). While performing AVL improves a user experience by removing sudden changes in volume level within the output audio, applying the same process to dissimilar sources of audio may degrade the user experience and/or cause distortion. For example, applying a gradual gain curve may improve a dynamic range for the music signals, but may not be optimal for the voice signals as a higher volume level may be beneficial in hearing and/or understanding speech represented in the voice signals. However, a steeper gain curve may increase the volume level for the voice signals to enable a user to better hear and/or understand the speech represented in the voice signals, but may reduce the dynamic range and/or cause distortion for the music signals.

To improve a user experience and sound quality of output audio, devices, systems and methods are disclosed that perform automatic volume control and leveling (AVCL) using different gain curves for audio data from different audio sources (e.g., different content providers), audio categories (e.g., different types of audio data, such as music, voice, etc.), genres (e.g., musical genres), or the like. For example, the system may distinguish between music signals and voice signals (e.g., speech) and may apply a first gain curve for the music and a second gain curve for the speech. Additionally or alternatively, the system may distinguish between different genres of music and may apply different gain curves based on the genre. Further, the system may select a gain curve based on a desired volume level. Therefore, output audio data generated by performing AVCL may be optimized based on the audio category, audio source, genre, desired volume level, and/or the like.

To further improve the user experience and/or sound quality of the output audio, the AVCL may include an adaptive noise gate to reduce in-channel noise, such as by attenuating quiet undesired sounds. In addition, the gain curve may be modified based on a signal-to-noise ratio (SNR) of the input audio and/or based on environmental noise. In this way the AVCL can boost sounds that are in a desired range (where the range is appropriate to the setting) and soften sounds that are above or below that range.

FIG. 1 illustrates a system for performing automatic volume control and leveling based on audio categories according to embodiments of the present disclosure. As illustrated in FIG. 1, a system 100 may include a device 110 and/or server(s) 120 that may communicate via network(s) 10. While FIG. 1 illustrates the device 110 being a speech controlled device, the disclosure is not limited thereto and the system 100 may include any smart device capable of connecting to a wireless network. As illustrated in FIG. 1, the device 110 may include a microphone array 112 and one or more loudspeaker(s) 114.

The device 110 may be configured to receive input audio data from the server(s) 120 and, using the input audio data, may generate output audio 24 for a user 5. For example, the server(s) 120 may send input audio data corresponding to music, text-to-speech (TTS) (e.g., TTS source(s)), news (e.g., radio broadcasts, flash briefings, daily briefings, etc.), streaming radio broadcasts (e.g., streaming radio source(s), talk radio station(s), music station(s), etc.), Voice-over-Internet Protocol (VoIP) communication sessions, or the like.

The input audio data may have large volume level changes within a single song, between a first song and a second song, between a normal broadcast and advertisements, between a first content provider (e.g., first audio source) and a second content provider (e.g., second audio source), or the like. However, a listener (e.g., the user 5) may prefer a consistent and balanced loudness experience (e.g., consistent volume level) regardless of the level changes that occur in the audio material.

To improve a user experience and maintain a consistent volume level between different portions of the input audio data, the device 110 may perform automatic volume control and leveling (AVCL) to boost or attenuate the input audio data to a desired volume level. For example, a first portion of the input audio data may correspond to music and may have a first energy level (e.g., first volume level), whereas a second portion of the input audio data may correspond to a talk radio station and may have a second energy level (e.g., second volume level) that is very different from the first energy level. If the device 110 generated the output audio 24 without performing AVCL to modify the input audio data, the first portion may be extremely loud and the second portion may be quiet, or vice versa. Instead, the device 110 may perform AVCL to modify the input audio data so that both the first portion and the second portion have a third volume level (e.g., desired volume level). Thus, the output audio 24 will maintain a consistent volume level when transitioning between the first portion and the second portion.

While AVCL maintains a consistent volume level, conventional techniques may modify the input audio data using a similar process for both the first portion and the second portion. Thus, the first portion (e.g., music signals) is volume-leveled using a similar gain curve as the second portion (e.g., voice signals). While performing AVCL improves a user experience by removing sudden changes in volume level between different sources of audio data, applying the same process to dissimilar sources of audio may degrade the user experience and/or cause distortion. For example, applying a gradual gain curve (e.g., applying a static level curve that has piecewise linear gain based on an input energy level) may improve a dynamic range for the music signals, but may not be optimal for the voice signals as a higher volume level may be beneficial in hearing and/or understanding speech represented in the voice signals. However, a steeper gain curve (e.g., applying a static level curve that has a larger slope and exhibits gain compression) may increase the volume level for the voice signals to enable the user 5 to better hear and/or understand the speech represented in the voice signals, but may reduce the dynamic range and/or cause distortion for the music signals.

To improve a user experience, the device 110 may perform AVCL using different gain curves for audio data from different audio sources (e.g., different content providers), audio categories (e.g., different types of audio data, such as music, voice, etc.), genres (e.g., musical genres), or the like. For example, the device 110 may distinguish between music and voice (e.g., speech) and may apply a first gain curve for the music and a second gain curve for the speech. Additionally or alternatively, the device 110 may distinguish between different genres of music and may apply different gain curves based on the genre and/or may apply different equalizer settings based on the genre. Therefore, the output audio data generated by performing AVCL may be optimized based on the audio category, audio source, genre, or the like and improve the user experience.

In addition to selecting different gain curves based on audio source, audio category, genre, or the like, the device 110 may also select different gain curves based on a desired volume level (e.g., volume scale) input by the user 5. For example, if the user 5 controls the device 110 to select a first desired volume level (e.g., volume level 4 on a scale of 1-10), the device 110 may select a first gain curve and perform AVCL to generate the output audio data using the first gain curve. However, if the user 5 controls the device 110 to select a second desired volume level (e.g., volume level 8 on a scale of 1-10), the device 110 may select a second gain curve and perform AVCL to generate the output audio data using the second gain curve. To illustrate an example, the first gain curve may correspond to a quiet volume level and may have a gradual slope with reduced distortion, whereas the second gain curve may correspond to a loud volume level and have a steep slope with gain compression.

As used herein, an input energy level corresponds to a value of the input audio data at a particular point in time (e.g., sound level). Thus, the input energy level may correspond to air pressure (e.g., sound pressure), displacement, power, voltage, intensity, amplitude, and/or the like and is associated with different volume levels of the output audio (e.g., larger energy level corresponds to a higher volume level). Energy levels may be illustrated using decibels (dB), although the disclosure is not limited thereto and energy levels may be measured using any technique known to one of skill in the art.

As used herein, a desired volume level may be input to the device 110 as a volume index value (e.g., volume value). For example, the volume index value may be an integer between 1 and 10, with a higher volume index value corresponding to higher gain values and therefore larger output energy levels, as described in greater detail below. The volume index value may be input to the device 110 directly by the user 5 (e.g., using touch inputs, voice commands, and/or other input techniques), indirectly by the user 5 directly from a second device (e.g., user 5 inputs the volume index value to the second device and the second device sends the volume index value to the device 110) indirectly by the user 5 via the server(s) 120 (e.g., user 5 inputs the volume index value to the second device, the second device sends the volume index value to the server(s) 120, and the server(s) 120 sends the volume index value to the device 110), based on user preferences and/or historical data (e.g., the device 110 identifies a previously stored volume index value, the server(s) 120 determine the volume index value and send the volume index value to the device 110, etc.), and/or the like. Thus, the user 5 may select the volume index value using voice commands, physical input, external remote controls, secondary devices, and/or the like without departing from the disclosure.

A gain value is an amount of gain (e.g., amplification or attenuation) to apply to the input audio data to generate output audio data. For example, the device 110 may apply the gain value to the input audio data to generate output audio data. A positive dB gain value corresponds to amplification (e.g., increasing a power or amplitude of the output audio data relative to the input audio data), whereas a negative dB gain value corresponds to attenuation (decreasing a power or amplitude of the output audio data relative to the input audio data). For example, a gain value of 6 dB corresponds to the output energy level being twice as large as the input energy level, whereas a gain value of −6 dB corresponds to the output energy level being half as large as the input energy level.

As used herein, automatic volume leveling (AVL) and/or automatic volume control and leveling (AVCL) corresponds to controlling an output energy level for varying input energy levels. For example, the device 110 may measure an average amplitude of the input energy levels associated with a first time range of the input audio data and may dynamically adjust the input-to-output gain to a suitable value to generate output audio data at a desired output energy level (e.g., desired output average amplitude). The average amplitude can be a simple measurement of average power, such as a root mean square (RMS) value that is defined as a square root of mean square (e.g., arithmetic mean of squares of a set of numbers), which may also be referred to as a quadratic mean. Thus, AVCL may be correspond to loudness normalization, variable-gain amplification, automatic gain control (AGC), and/or automatic volume control (AVC). Performing AVCL results in dynamic range compression, as AVCL reduces the volume of loud sounds and amplifies quiet sounds, thus reducing or compressing the dynamic range of the output audio data relative to the input audio data.

FIG. 2 illustrates an example of an output chart and a corresponding gain chart that illustrate dynamic range compression. Output chart 210 illustrates a relationship between input levels and output levels, measured in dB, with input levels along the horizontal axis (e.g., x-coordinates) and output levels along the vertical axis (e.g., y-coordinates). Similarly, gain chart 220 illustrates a relationship between input levels and gain values, measured in dB, with input levels along the horizontal axis (e.g., x-coordinates) and gain values along the vertical axis (e.g., y-coordinates).

The output chart 210 represents a first output curve (e.g., gray line) that corresponds to a first gain curve (e.g., gray line) represented in the gain chart 220. As illustrated in FIG. 2, the first gain curve corresponds to a uniform gain value (e.g., 0 dB) that is constant regardless of input level (e.g., slope of zero) and therefore does not exhibit dynamic range compression. Thus, the first output curve has a slope value of one (e.g., gain value of 0 dB), which corresponds to a 1:1 ratio of the input level to the output level, such that a first input level of −30 dB corresponds to a first output level of −30 dB and a second input level of 0 dB corresponds to a second output level of 0 dB.

In contrast to the first gain curve, AVCL determines gain values dynamically based on the input level, increasing the gain at lower input levels (e.g., amplifying quiet desired sounds) and decreasing the gain at higher energy levels (e.g., attenuating loud sounds). An example of this is illustrated in FIG. 2 as a second gain curve represented by the solid black line in the gain chart 220. As illustrated in FIG. 2, the second gain curve which has a first slope value (e.g., first negative slope) from −30 dB input level to a first threshold value (e.g., −12 dB), a second slope value (e.g., slope of zero) from the first threshold value to a second threshold value (e.g., −5 dB), and a third slope value (e.g., second negative slope) from −5 dB input level onward. Thus, the second gain curve exhibits upward compression (e.g., expansion) to increase the loudness of sounds below the first threshold value and downward compression to decrease the loudness of sounds above the second threshold value. An example output generated based on the second gain curve is illustrated in FIG. 2 as a second output curve represented by the solid black line in the output chart 210. As illustrated in FIG. 2, a first input level of −30 dB corresponds to a first output level of −24 dB (e.g., gain amplification of 6 dB), a second input level of −10 dB corresponds to a second output level of −10 dB (e.g., gain of 0 dB), and a third input level of 0 dB corresponds to a third output level of −2 dB (e.g., gain attenuation of 2 dB).

The device 110 may select different gain curves based on an audio category associated with the input audio data. In some examples, the device 110 may distinguish between two audio categories, such as music and voice, selecting between a first plurality of gain curves and a second plurality of gain curves. For example, the device 110 may select the first plurality of gain curves for first input audio data associated with a first audio category (e.g., music) and may select the second plurality of gain curves for second input audio data associated with a second audio category (e.g., voice). In this example, the first plurality of gain curves would have gradual slopes and exhibit less dynamic range compression to retain the dynamic range of the music represented in the first input audio data, whereas the second plurality of gain curves would have steeper slopes and exhibit more dynamic range compression to amplify quiet sounds at the cost of dynamic range of the second input audio data.

FIG. 3 illustrates example gain charts for different audio categories according to embodiments of the present disclosure. As illustrated in FIG. 3, an output chart 310 includes a first output curve 312 (represented by the black solid line) corresponding to a first audio category (e.g., alarms, notifications, etc.), a second output curve 314 (represented by a dashed gray line) corresponding to a second audio category (e.g., voice or speech), and a third output curve 316 (represented by a solid gray line) corresponding to a third audio category (e.g., music).

The first output curve 312 is linear processing, with a slope value of one (e.g., gain value of 0 dB), which corresponds to a 1:1 ratio of the input level to the output level. Thus, a first input level of −30 dB corresponds to a first output level of −30 dB and a second input level of 0 dB corresponds to a second output level of 0 dB. The first output curve 312 corresponds to a first gain curve 322, which is represented in gain chart 320 as having a value of 0 dB. Thus, the first gain curve 322 corresponds to a uniform gain value (e.g., 0 dB) that is constant regardless of input level (e.g., slope of zero) and therefore does not exhibit dynamic range compression.

In contrast to the first gain curve 322, automatic volume control and leveling (AVCL) determines gain values dynamically based on the input level, increasing the gain at lower input levels (e.g., amplifying quiet sounds) and decreasing the gain at higher energy levels (e.g., attenuating loud sounds). A second output curve 314 corresponding to speech and a third output curve 316 corresponding to music are examples of audio data generated by performing AVCL.

The second output curve 314 is not linear processing, with different portions corresponding to different gains, which are represented by a second gain curve 324. For example, the second gain curve 324 may be separated into six different sections, with a first section (e.g., −50 dB to −42 dB input level) having a gain value of −4 dB, a second section (e.g., −42 dB to −32 dB input level) having a first slope value (e.g., first positive slope), a third section (e.g., −32 dB to −24 dB input level) having a gain value of 8 dB, a fourth section (e.g., −24 dB to −18 dB input level) having a second slope value (e.g., first negative slope), a fifth section (e.g., −18 dB to −16 dB input level) having a gain value of 0 dB, and a sixth section (e.g., −16 dB to 0 dB input level) having a third slope value (e.g., second negative slope). Thus, the second gain curve 324 applies an adaptive noise gate to input audio data having a level of −32 dB and below (with attenuation applied −40 dB level and below), applies upward compression (e.g., expansion) to input audio data having a level between −32 dB and −18 dB (e.g., to increase the loudness of sounds), applies constant gain (e.g., 0 dB) to input audio data having a level between −18 dB and −16 dB, and applies downward compression to input audio data having a level above −16 dB (e.g., to decrease the loudness of sounds).

The third output curve 316 is not linear processing, with different portions corresponding to different gains, which are represented by a third gain curve 326. For example, the third gain curve 326 may be separated into six different sections, with a first section (e.g., −50 dB to −40 dB input level) having a gain value of −4 dB, a second section (e.g., −40 dB to −32 dB input level) having a first slope value (e.g., first positive slope), a third section (e.g., −32 dB to −28 dB input level) having a gain value of 5 dB, a fourth section (e.g., −28 dB to −24 dB input level) having a second slope value (e.g., first negative slope), a fifth section (e.g., −24 dB to −15 dB input level) having a gain value of 0 dB, and a sixth section (e.g., −15 dB to 0 dB input level) having a third slope value (e.g., third negative slope). Thus, the third gain curve 326 applies an adaptive noise gate to input audio data having a level of −32 dB and below (with attenuation applied −37 dB level and below), applies upward compression (e.g., expansion) to input audio data having a level between −32 dB and −24 dB (e.g., to increase the loudness of sounds), applies constant gain (e.g., 0 dB) to input audio data having a level between −24 dB and −15 dB, and applies downward compression to input audio data having a level above −15 dB (e.g., to decrease the loudness of sounds).

As illustrated in FIG. 3, the device 110 may select different gain curves based on an audio category associated with the input audio data. For example, FIG. 3 illustrates the device 110 selecting the first gain curve 322 for alarms, the second gain curve 324 for speech, and the third gain curve 326 for music. As illustrated in FIG. 3, the third gain curve 326 exhibits more dynamic range than the second gain curve 324, allowing quiet portions of music to remain quiet. In contrast, the second gain curve 324 performs aggressive volume leveling to ensure that speech is output at a consistent level.

While the output chart 310 and the gain chart 320 illustrate input levels between −50 dB and 0 dB, the disclosure is not limited thereto. For example, the output chart 310 and the gain chart 320 may include input levels below −50 dB without departing from the disclosure.

In some examples, the device 110 may distinguish between two audio categories, such as music and voice, selecting between a first plurality of gain curves and a second plurality of gain curves. For example, the device 110 may select the first plurality of gain curves for first input audio data associated with a first audio category (e.g., music) and may select the second plurality of gain curves for second input audio data associated with a second audio category (e.g., voice). In this example, the first plurality of gain curves would have gradual slopes and exhibit less dynamic range compression to retain the dynamic range of the music represented in the first input audio data, whereas the second plurality of gain curves would have steeper slopes and exhibit more dynamic range compression to amplify quiet sounds at the cost of dynamic range reduction of the second input audio data.

FIG. 4 illustrates example gain charts for different volume levels and different audio categories according to embodiments of the present disclosure. As illustrated in FIG. 4, music gain chart 410 includes a first plurality of gain curves (e.g., multiple static gain curves) corresponding to different volume index values for first input audio data that is associated with music signals. For example, a minimum volume index value (e.g., volume level 1) may correspond to the lowest gain curve and a maximum volume index value (e.g., volume level 10) may correspond to the highest gain curve. Similarly, voice gain chart 420 includes a second plurality of gain curves corresponding to different volume index values for second input audio data associated with voice signals. The first plurality of gain curves correspond to the third gain curve 326 associated with music, whereas the second plurality of gain curves correspond to the second gain curve 324 associated with speech.

As illustrated in FIG. 4, the first plurality of gain curves represented in the music gain chart 410 have lower gain values overall and more gradual slopes at different volume index values, which retains the dynamic range of the music signals. Thus, the first plurality of gain curves represented in the music gain chard 410 correspond to less dynamic range compression than the second plurality of gain curves represented in the voice gain chart 420.

In contrast, the second plurality of gain curves represented in the voice gain chart 420 have higher gain values overall and steeper slopes at corresponding volume index values, resulting in more aggressive dynamic range compression overall. The second plurality of gain curves result in more loudness normalization (e.g., quieter sounds are amplified more) and higher volume levels for the voice signals relative to the music signals, as consistent volume levels are prioritized at the cost of dynamic range reduction. Thus, the second plurality of gain curves result in less variation in volume levels between different voices (e.g., different users speaking) and/or between words or sentences.

The gain curves illustrated in FIG. 4 are intended only as examples of different gain curves selected by the device 110 and the disclosure is not limited thereto. In addition, while FIG. 4 only illustrates selecting between two different audio categories (e.g., first plurality of gain curves for a first audio category and second plurality of gain curves for a second audio category), the disclosure is not limited thereto and the device 110 may select from a plurality of audio categories based on different feature data, indicators, and/or the like. While the music gain chart 410 and the voice gain chart 420 illustrate input levels between −50 dB and 0 dB, the disclosure is not limited thereto. For example, the music gain chart 410 and the voice gain chart 420 may include input levels below −50 dB without departing from the disclosure.

In some examples, the device 110 may not only distinguish between voice and music, but may also distinguish between different genres of music or the like. For example, the device 110 may select a different plurality of gain curves for each genre of music without departing from the disclosure. In some examples, the device 110 may apply different equalization settings based on the genre and volume index value. Thus, the device 110 may generate two different indicators, a first indicator indicating the audio category and a second indicator indicating the genre or other subcategory. Additionally or alternatively, the device 110 may identify one or more additional audio categories associated with alarms, timers, notifications, and/or the like without departing from the disclosure. For example, the device 110 may determine that the input audio data corresponds to an alarm and may select a gain curve associated with the alarm.

While the examples described above refer to selecting different gain curves based on the audio category, the disclosure is not limited thereto and the device 110 may select different gain curves based on a source of the audio data (e.g., content provider). For example, the device 110 may select from a first plurality of gain curves for first input audio data originating from a first source (e.g., first content provider) and may select from a second plurality of gain curves for second input audio data originating from a second source (e.g., second content provider), even when both the first input audio data and the second input audio data are associated with the same audio category (e.g., music). Thus, the device 110 may select different gain curves for a first internet radio station and a second internet radio station, a first application (e.g., first process running on the device 110) and a second application (e.g., second process running on the device 110), and/or the like, without departing from the disclosure.

For ease of illustration, the following examples will describe the device 110 selecting a plurality of gain curves based on an audio category associated with the input audio data. For example, many of the drawings and corresponding description illustrate the device 110 distinguishing between a first audio category (e.g., music) and a second audio category (e.g., voice). However, as mentioned above, the disclosure is not limited thereto and the device 110 may select a plurality of gain curves based on the audio category, the genre of music, the source of the audio data, and/or the like. Thus, "audio category" may be used as a proxy for any of these classifications and similar techniques may be used regardless of what criteria the device 110 uses to select the plurality of gain curves.

In some examples, the device 110 may select a single gain curve regardless of the volume index value. Thus, the device 110 may apply the same gain values regardless of the volume index value and the output audio data is generated at similar output energy levels (e.g., output volume levels) for all volume index values. Additionally or alternatively, the device 110 may select a single gain value regardless of the volume index value and/or the input energy level. For example, the device 110 may select a gain value of 0 dB for all volume index values and/or input energy levels when the audio category is associated with a specific application or process, such that the output energy level of the output audio data is controlled by the application or process. Thus, an alarm application may control the output energy level for a notification alerting the user 5 of the alarm, regardless of the volume index value selected by the user 5.

In order to perform AVCL dynamically based on volume level, audio sources, audio categories, genres, and/or the like, the device 110 may receive a volume index value (e.g., desired volume level), may determine an audio category associated with the input audio data, and may select a gain curve based on the volume index value and the audio category. For example, the device 110 may determine a first plurality of gain curves corresponding to a first audio category (e.g., music) and select a first gain curve from the first plurality of gain curves based on a first volume index value (e.g., volume level 4). To generate the output audio data, the device 110 may determine a first input energy level associated with a first time range of the input audio data, may determine a first gain value based on the first gain curve and the first input energy level, and may apply the first gain value to generate a first time range of the output audio data. If the energy level associated with the input audio data changes, the device 110 may determine a second input energy level associated with a second time range of the input audio data, may determine a second gain value based on the first gain curve and the second input energy level, and may apply the second gain value to generate a second time range of the output audio data.

Similarly, if the user 5 inputs a second volume index value (e.g., volume level 8) during the second time range of the input audio data, the device 110 may select a second gain curve from the first plurality of gain curves based on the second volume index value. Using the second gain curve, the device 110 may determine a third gain value based on the second gain curve and the second input energy level and may apply the third gain value to generate the second time range of the output audio data.

If the device 110 determines that a third time range of the input audio data corresponds to a second audio category (e.g., voice), the device 110 may determine a second plurality of gain curves based on the second audio category and select a third gain curve from the second plurality of gain curves based on the second volume index value. The device 110 may determine a third input energy level associated with the third time range of the input audio data, may determine a fourth gain value based on the third gain curve and the third input energy level, and may apply the fourth gain value to generate a third time range of the output audio data.

As illustrated in FIG. 1, the device 110 may receive (130) input audio data and receive (132) a volume index value (e.g., volume value). For example, the volume index value may be an integer between 1 and 10, with a higher volume index value corresponding to higher gain values and therefore larger output energy levels, as described in greater detail below. For example, the volume index value may correspond to a percentage of a maximum output volume level, although the disclosure is not limited thereto. As discussed above, the volume index value may be input to the device 110 directly by the user 5 (e.g., using touch inputs, voice commands, and/or other input techniques), indirectly by the user 5 from a second device (e.g., user 5 inputs the volume index value to the second device and the second device sends the volume index value to the device 110) indirectly by the user 5 via the server(s) 120 (e.g., user 5 inputs the volume index value to the second device, the second device sends the volume index value to the server(s) 120, and the server(s) 120 sends the volume index value to the device 110), based on user preferences and/or historical data (e.g., the device 110 identifies a previously stored volume index value, the server(s) 120 determine the volume index value and send the volume index value to the device 110, etc.), and/or the like.

The device 110 may extract (134) feature data from the input audio data and may determine (136) an audio category based on the feature data. These steps will be described in greater detail below with regard to FIGS. 5A-5D.

The device 110 may select (138) a static gain curve corresponding to the audio category and the volume index value. For example, the device 110 may determine a first plurality of gain curves corresponding to a first audio category (e.g., music) and select a first gain curve from the first plurality of gain curves based on a first volume index value (e.g., volume level 4).

The device 110 may determine (140) a loudness estimate value (e.g., loudness value) associated with the input audio data and may determine (142) a gain value based on the loudness estimate value and the first gain curve. For example, the device 110 may select the gain value in the first gain curve that corresponds to the loudness estimate value. In some examples, the device 110 may optionally modify (144) the gain value based on an environmental noise gain. For example, as will be discussed in greater detail below with regard to FIGS. 14-17, the device 110 may determine an environmental noise estimate value when near-end speech is not present and may determine the environmental noise gain in order to compensate for an increase in the environmental noise. Thus, by modifying the gain value based on the environmental noise gain, the device 110 may increase the gain only during periods of loud environmental noise. The device 110 may then generate (146) output audio data using the gain value and the input audio data.

The device 110 may continue to perform the steps illustrated in FIG. 1 to generate the first output audio data. For example, as the input energy levels of the input audio data change, the device 110 may determine a current loudness estimate value and update the gain value with a new gain value that corresponds to the current loudness estimate value. If the device 110 receives an indication of a change in the volume index value, the device 110 may determine a current volume index value and update the gain value with a new gain value using the current loudness estimate value and a new gain curve corresponding to the current volume index value. Finally, if the audio category changes (e.g., input audio data changes from music signals to voice signals, or from a first audio source to a second audio source, etc.), the device 110 may determine a current audio category and may update the gain value with a new gain value using the current loudness estimate value and a new gain curve corresponding to the current volume index value and the current audio category.

Figure 5B:
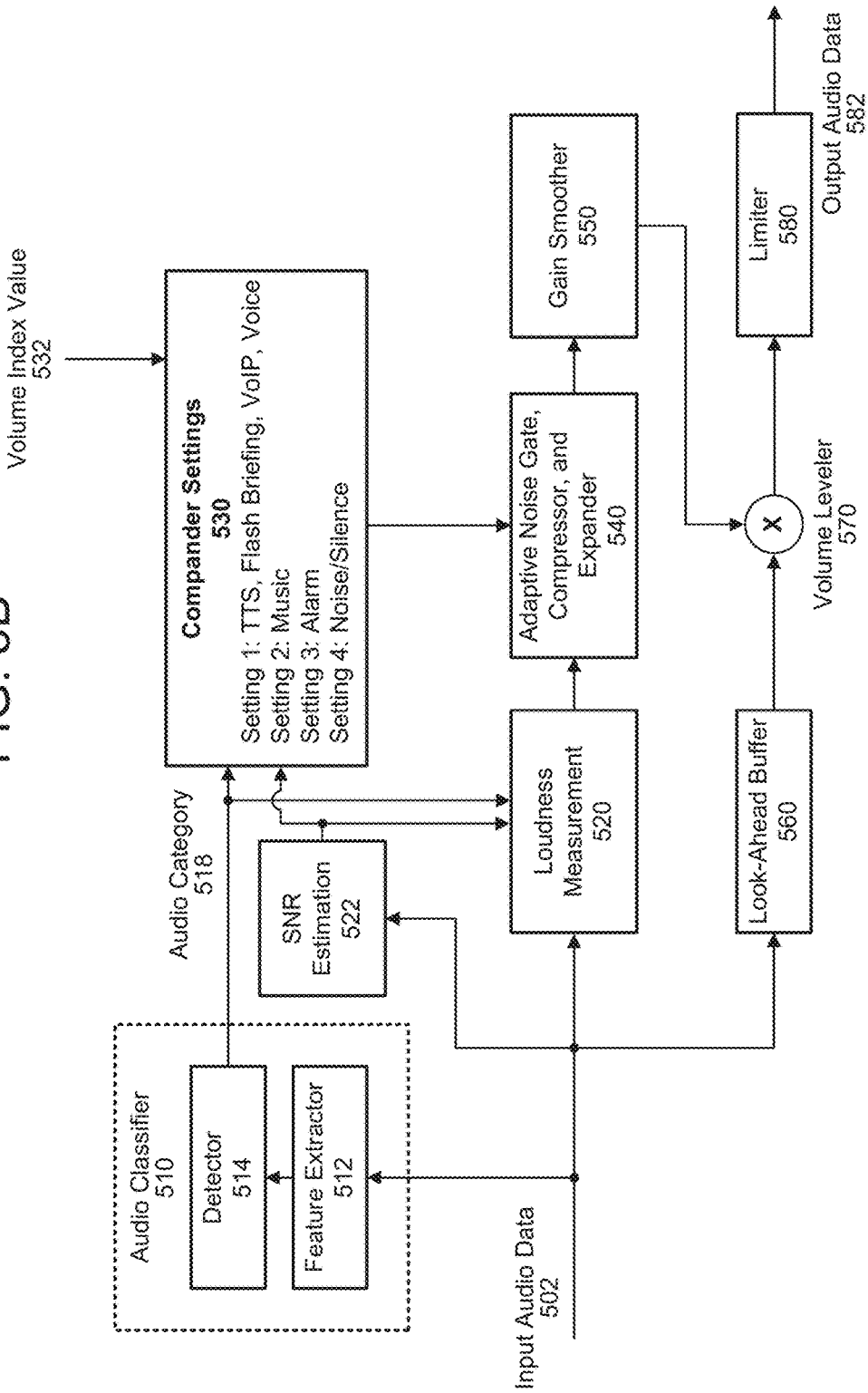

FIGS. 5A-5D illustrate example component diagrams for performing automatic volume control and leveling according to embodiments of the present disclosure. As illustrated in FIG. 5A, the device 110 may determine an audio category based on feature data extracted from the input audio data. For example, the device 110 may receive input audio data 502 and may determine an audio category 518 associated with the input audio data 502.

To determine the audio category 518, the device 110 may include an audio classifier 510 that includes a feature extractor 512 and a detector 514. The feature extractor 512 may determine feature data associated with the input audio data 502, as will be described in greater detail below, and may pass the feature data to the detector 514 to classify the input audio data into different audio categories.

To illustrate an example, the feature extractor 512 may determine a first energy level value for all frequency bands of the input audio data 502 (e.g., full-band energy level value), may determine a second energy level value for a first frequency band (e.g., 300 Hz to 3 kHz) of the input audio data, and may determine a third energy level value for a second frequency band (e.g., 8 kHz to 16 kHz) of the input audio data. The feature extractor 512 may determine a first energy level ratio between the first frequency band and the full-band (e.g., ratio between the second energy level value and the first energy level value) and may determine a second energy level ratio between the second frequency band and the full-band (e.g., ratio between the third energy level value and the first energy level value). The first energy level value (e.g., full-band energy of the input audio data) may be a first portion of the feature data that is used to differentiate between silence and music/voice signals, whereas the first energy level ratio and the second energy level ratio may be a second portion of the feature data that is used to differentiate between voice signals and music signals.

The feature extractor 512 may determine an upper envelope value of the input audio data (e.g., upper audio energy envelope value corresponding to a maximum amplitude of the input audio data) and may determine a lower envelope value (e.g., floor) of the input audio data (e.g., lower audio energy envelope value) and may determine an envelope ratio value (e.g., ratio between the upper envelope value and the lower envelope value). For example, the upper envelope value corresponds to the output of a fast-attack slow-release filter with the absolute value of input audio data 502 as the input, the lower envelope value corresponds to the output of a slow-attack fast-release filter with the absolute value of input audio data 502 as the input, and the envelope ratio value indicates an estimate of signal-to-noise ratio of the input audio data 502. The envelope ratio value may be a third portion of the feature data that is used to differentiate between noise/silence and voice signals.

The feature extractor 512 may estimate a zero-crossing rate (ZCR) value for the input audio data 502 (e.g., rate of sign-changes along the input audio data 502, such as the rate at which the input audio data 502 includes an amplitude value change from a positive value to a negative value or from a negative value to a positive value). The ZCR value may be a fourth portion of the feature data that is used to differentiate between noise and music/voice signals.

The detector 514 may receive the feature data from the feature extractor 512 and may determine whether the first energy level value is above a first threshold value. For example, the detector 514 may use the first energy level value (e.g., full-band energy of the input audio data) to differentiate between silence and music/voice signals, with the first threshold value corresponding to a value between first energy level values associated with silence and second energy levels associated with the music/voice signals (e.g., first energy level values are lower than second energy level values).

The detector 514 may determine whether the ZCR value is below a second threshold value. For example, the detector 514 may use the ZCR value to differentiate between noise and music/voice signals, with the second threshold value corresponding to a value between first ZCR values associated with music/voice signals and second ZCR values associated with noise (e.g., second ZCR values are higher than first ZCR values).

The detector 514 may determine whether the envelope ratio value is above a third threshold value. For example, the detector 514 may use the envelope ratio to differentiate between noise/silence and voice signals, with the third threshold value corresponding to a value between first envelope ratio values associated with noise/silence and second envelope ratio values associated with voice signals (e.g., second envelope ratio values are higher than first envelope ratio values).

The detector 514 may determine a difference between the first energy level ratio and the second energy level ratio and determine whether the difference is positive. For example, the difference is positive when the first energy level ratio is larger than the second energy level ratio, which corresponds to voice signals, and the difference is negative when the first energy level ratio is smaller than the second energy level ratio, which corresponds to music signals. Thus, the detector 514 may identify voice signals as the lower frequency bands have more energy relative to the full-band signal than music signals, and the detector 514 may identify music signals as the higher frequency bands have more energy relative to the full-band signal than voice signals.

Based on the feature data, the detector 514 may determine an audio category associated with the input audio data 502. For example, the device 110 may identify silence based on the first energy level value, may identify noise based on the ZCR value, may distinguish between silence/noise and voice signals based on the envelope ratio value, and may distinguish between voice signals and music signals based on the first energy level ratio and the second energy level ratio.

While the above examples describe comparing the feature data to threshold values, the disclosure is not limited thereto and the detector 514 may compare the feature data to any reference data, range of values, and/or the like or use any other technique known to one of skill in the art to determine an audio category associated with the input audio data 502. Further, while the examples only illustrate distinguishing between noise/silence, voice signals, and music signals, the disclosure is not limited thereto and the detector 514 may distinguish between genres of music signals or different types of voice signals without departing from the disclosure. Thus, in some examples, the detector 514 may generate a first indicator indicating the audio category and a second indicator indicating the genre or other subcategory, which may be sent to the compander settings 530 or to a different component without departing from the disclosure. Additionally or alternatively, the detector 514 may classify the input audio data 502 as an audio category while also detecting periods of noise/silence within the input audio data 502. Thus, noise/silence may not be its own audio category, but may occur within audio data associated with other audio categories without departing from the disclosure.

In some examples, the device 110 may determine the audio category 518 based on indicators 516 received by the device 110. For example, the indicators 516 may include one or more indicators of a source and/or a type of the input audio data 502. Thus, the audio classifier 510 and/or the compander settings 530 may receive the indicators 516 and use them to determine the audio category 518 and/or to select a gain curve.

FIG. 5A illustrates a first example in which the only indicator 516 that the device 110 receives is inAlarm (e.g., an indicator of an alarm audio path that includes audio data corresponding to alarm sounds, timer sounds, notifications, etc.). When inAlarm is true (e.g., first binary value, such as a value of one), the device 110 may select an audio category corresponding to the alarm audio path (e.g., Setting 3) and may set a gain value of 0.0 dB, regardless of a volume index value 532 (e.g., volume value) corresponding to the input audio data 502. This passes the audio data corresponding to alarm sounds, timer sounds, notifications, and/or the like without applying any gain. When inAlarm is true, the device 110 may select the first audio category corresponding to the alarm audio path (e.g., Setting 3) without performing any additional processing of the input audio data 502. For example, the audio classifier 510, the SNR estimation 522, and/or the loudness measurement 520 may be disabled (e.g., instructed not to process the input audio data 502) as a result of the inAlarm being true.

In contrast, when inAlarm is false (e.g., second binary value, such as a value of zero), the device 110 may process the input audio data 502 to determine the audio category 518 as discussed above. For example, the audio classifier 510, the SNR estimation 522, and/or the loudness measurement 520 may be enabled (e.g., instructed to process the input audio data 502) as a result of inAlarm being false.

As discussed above, inAlarm may correspond to an alarm audio path that includes audio data corresponding to alarm sounds, timer sounds, notifications, reminders, etc. However, the disclosure is not limited thereto and inAlarm may only corresponds to alarm sounds and additional indicators 516 may be used to indicate the additional sounds (e.g., inTimer indicating timer sounds, inNotification indicating notifications, etc.). In this example, each of these types of input are treated similarly and given a gain value of 0.0 dB, although the disclosure is not limited thereto.

FIG. 5B illustrates a second example in which the device 110 may determine the audio category 518 associated with the input audio data 502 and perform automatic volume control and leveling to generate the output audio data 582 without the indicators 516. Each of the components illustrated in FIG. 5B operate as described above with regard to FIG. 5A, except that the device 110 does not receive the indicators 516 and the audio classifier 510 always extracts the feature data and determines the audio category 518 for the input audio data 502. For example, the audio classifier 510 is always enabled and all input audio data 502 is processed by the audio classifier 510 to determine the audio category 518. Additionally or alternatively, SNR estimation 522 and/or loudness measurement 520 are always enabled in the second example illustrated in FIG. 5B.

FIG. 5C illustrates a third example in which the device 110 receives the indicators 516, which are received by both the audio classifier 510 and the compander settings 530. For example, the audio classifier 510 may receive inMusic, whereas the compander settings 530 may receive inTTS, inVoIP, and/or inAlarm. When inMusic is true (e.g., first binary value, such as a value of one), the audio classifier 510 may determine the audio category 518 in order to distinguish between music and speech (e.g., voice). When inMusic is false (e.g., second binary value, such as a value of zero), the audio classifier 510 may be disabled. The other indicators (e.g., inTTS, inVoIP, inAlarm) may be used by the compander settings 530 to select a corresponding settings regardless of the audio category 518 output by the audio classifier 510.

Figure 5D:
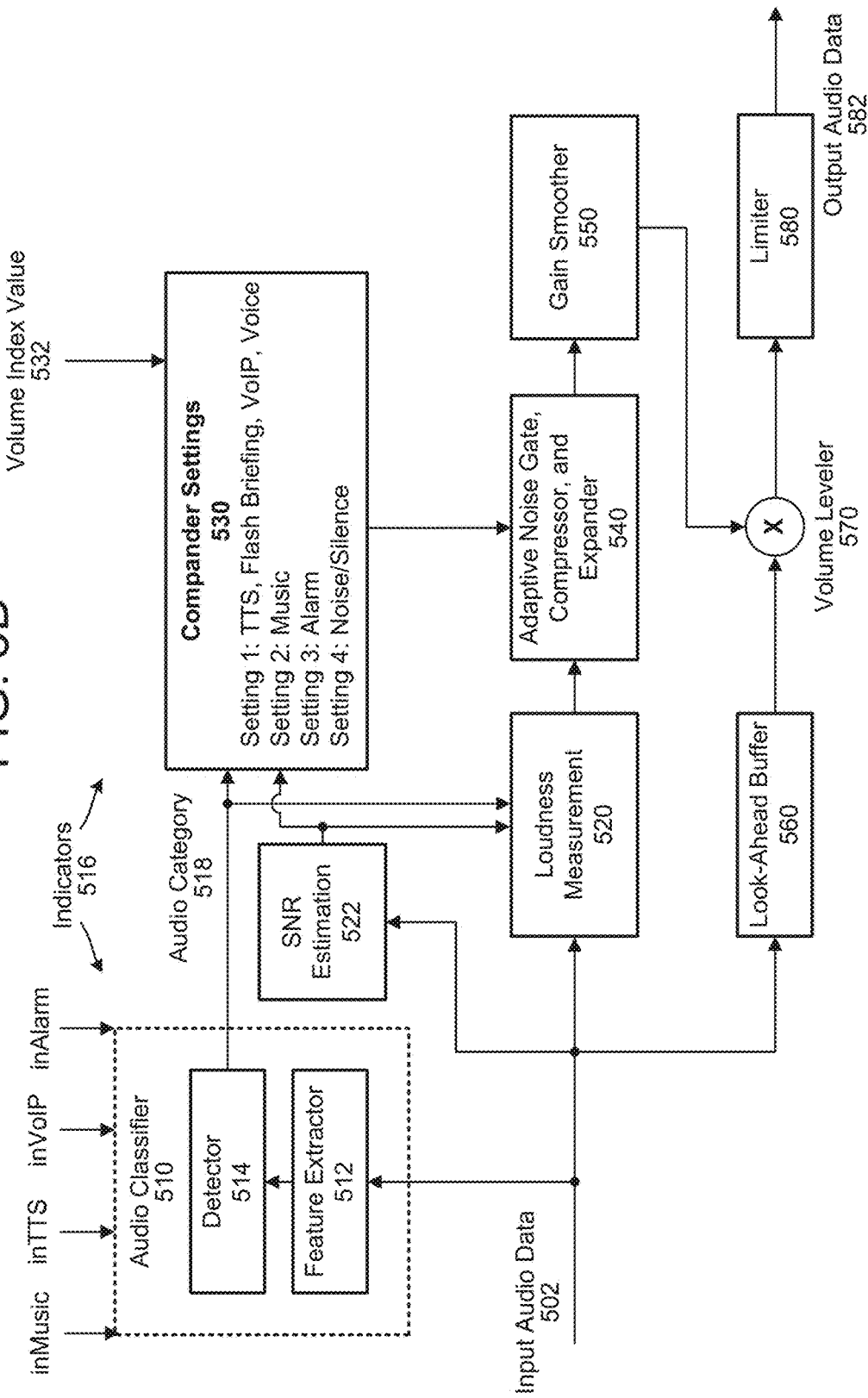

FIG. 5D illustrates a fourth example in which the device 110 receives the indicators 516, which are all received by the audio classifier 510. For example, the audio classifier 510 may receive inMusic, inTTS, inVoIP, and/or inAlarm, and may use each of these indicators 516 to assist in determining the audio category 518. Thus, the compander settings 530 receives the audio category 518 from the audio classifier 510, but none of the indicators 516.

The indicators 516 may include one or more indicators of a source and/or a type of the input audio data 502. For example, FIG. 5C-5D illustrate the indicators 516 including inMusic (e.g., a first indicator of a first audio path that includes music signals, voice signals, and/or noise/silence), inTTS (e.g., a second indicator of a text-to-speech audio path that includes voice signals and/or noise/silence), inVoIP (e.g., a third indicator of a voice-over-internet-protocol (VoIP) audio path that includes voice signals and/or noise/silence), and/or inAlarm (e.g., a fourth indicator of an alarm audio path that includes audio data corresponding to alarm sounds, timer sounds, notifications, etc.). However, the disclosure is not limited thereto, and the indicators 516 may include other examples without departing from the disclosure. For example, the indicators 516 may include inFlashBriefing (e.g., a fifth indicator of an audio path that includes voice signals corresponding to a news report or the like), inTimer (e.g., a sixth indicator specific to timer sounds), inAudioBook (e.g., a seventh indicator indicating voice signals corresponding to an audiobook), and/or the like. Thus, the indicators 516 may include any type of input, any source of input, and/or any other information that is known to the server(s) 120 and may be used by the device 110 to distinguish between different types of speech, music, or other sounds. For example, the indicators 516 may identify a genre of music (e.g., based on a source of the audio data, such as a streaming radio station or the like), style of voice signals (e.g., news report, audiobook, communication session, etc.), or the like without departing from the disclosure.

When either inTTS or inVoIP are true (e.g., first binary value, such as a value of one), the device 110 may select a first audio category (e.g., Setting 1) corresponding to voice signals. However, the disclosure is not limited thereto and in some examples the device 110 may distinguish between audio data corresponding to TTS and audio data corresponding to speech originating from a human, as the audio data may benefit from different gain curves. In some examples, the device 110 may receive additional indicators 516 such as inFlashBriefing or inAudioBook that may also correspond to voice signals. The device 110 may distinguish between different types of voice signals (e.g., human speech, TTS, news reports, audio books, communication sessions, etc.) and may apply different gain curves accordingly.

When inMusic is true, the device 110 may extract the feature data and/or analyze the feature data to detect an audio category 518, as discussed in greater detail above. For example, the device 110 may determine whether the input audio data 502 corresponds to the first audio category (e.g., voice signals, such as Setting 1), a second audio category (e.g., music signals, such as Setting 2), and/or noise/silence. In some examples, noise/silence may be a unique audio category (e.g., Setting 4), but the disclosure is not limited thereto and noise/silence may be detected within the first audio category or the second audio category. As discussed above, the device 110 may use the feature data to differentiate between two audio categories (e.g., music or voice), three audio categories (e.g., music, voice or noise/silence), and/or a plurality of audio categories (e.g., different genres of music, additional audio categories, etc.) without departing from the disclosure.

When inAlarm is true, the device 110 may select a third audio category (e.g., Setting 3) corresponding to the alarm audio path and may set a gain value of 0.0 dB, regardless of a volume index value 532 corresponding to the input audio data 502. This passes the audio data corresponding to alarm sounds, timer sounds, notifications, and/or the like without applying any gain. As discussed above, inAlarm may correspond to an alarm audio path that includes audio data corresponding to alarm sounds, timer sounds, notifications, reminders, etc. However, the disclosure is not limited thereto and inAlarm may only corresponds to alarm sounds and additional indicators 516 may be used to indicate the additional sounds (e.g., inTimer indicating timer sounds, inNotification indicating notifications, etc.). In this example, each of these types of input are treated similarly and given a gain value of 0.0 dB, although the disclosure is not limited thereto.

While noise/silence is illustrated as a fourth audio category (e.g., Setting 4) in FIGS. 5A-5D, the disclosure is not limited thereto. Instead, the device 110 may classify the input audio data 502 into other audio categories (e.g., music or voice) but also identify noise/silence within the input audio data 502. For example, a portion of the input audio data 502 may be associated with a first audio category (e.g., music), and gain curves associated with the first audio category may be used to determine gain value(s) and perform AVCL. However, when noise/silence is detected within the portion of the input audio data 502, the device 110 may freeze adaptation of the loudness estimate value and select a gain value using an adaptive noise gate portion of the gain curve. In some examples, the device 110 may override the selected gain curve to select a gain value of 0 dB when noise/silence is detected, but the disclosure is not limited thereto. Thus, the device 110 may detect noise/silence and generate a noise/silence indicator that is separate from the audio category 518.

In some examples, the audio classifier 510 may be used to detect noise/silence and generate the noise/silence indicator without determining the audio category 518. For example, when the device 110 receives the indicators 516 and is able to select an audio category based only on the indicators 516, the noise/silence indicator may be beneficial. For example, if a first indicator (e.g., inMusic) is false and a second indicator (e.g., inTTS) is true, the device 110 may determine that the audio category 518 corresponds to voice signals and may select a corresponding gain curve. However, within the input audio data 502 will be moments of silence where speech is not present and the audio classifier 510 may generate the noise/silence indicator to prevent adaptation of the loudness estimate value and/or override the selected gain curve to select a gain value of 0 dB during these moments of silence.

As discussed above, the audio classifier 510 may output one or more signals. For example, the audio classifier 510 may generate a first indicator (e.g., audio category 518) indicating an audio category associated with the input audio data 502. In some examples, however, the audio classifier 510 may also generate a second indicator (e.g., noise/silence indicator) indicating moments of silence within the input audio data 502. Additionally or alternatively, the audio classifier 510 may also generate a third indicator indicating a subcategory (e.g., genre, type of voice signals, etc.) that may be used by the compander settings 530 to select a gain curve and also sent to an additional component to select equalization settings or the like.

In some examples, when inMusic is false (e.g., second binary value, such as a value of zero), the audio classifier 510 may not extract the feature data and/or detect audio categories in the input audio data 502. However, the disclosure is not limited thereto and in some examples the audio classifier 510 may operate even when inMusic is false. For example, the audio classifier 510 may detect voice signals, music signals, and/or noise/silence in the input audio data 502 to assist and/or confirm the audio category indicated by indicators 516. Thus, the audio classifier 510 may determine that portions of the input audio data 502 correspond to noise/silence even when inMusic is false and inTTS or inVoIP is true without departing from the disclosure.

The audio classifier 510 may pass the audio category 518 to loudness measurement 520 and/or compander settings 530. The loudness measurement determines a loudness estimate value corresponding to the input audio data 502, as discussed in greater detail below with regard to FIG. 6A, and passes the loudness measurement estimate to an adaptive noise gate, compressor, and expander 540.

The signal-to-noise ratio (SNR) estimation 522 determines an SNR estimate value corresponding to the input audio data 502 and passes the SNR estimate value to the compander settings 530 and/or the loudness measurement 520. For example, the SNR estimation 522 may detect a first energy level (e.g., upper envelope of the input audio data 502, which corresponds to a maximum amplitude), detect a second energy level (e.g., noise floor associated with the input audio data 502), and may determine the SNR estimate value by dividing the first energy level by the second energy level. However, the disclosure is not limited thereto and the SNR estimation 522 may determine the SNR estimate value using any technique known to one of skill in the art.

As will be discussed in greater detail below with regard to FIGS. 13C-13D, the SNR estimate value generated by the SNR estimation 522 may be used to adjust a degree of "compander effect" for speech and music (e.g., reduce the expansion/compression of a static gain curve). For example, if the SNR estimate value is small, the "compander effect" may be reduced by adjusting the maximum gain (e.g., MaxGain), adjusting slope values associated with portions of the gain curve (e.g., $Slope_{Noise}$, $Slope_{Exp}$, and/or $Slope_{Comp}$), and/or adjusting the threshold(s) and/or range(s) included in the static gain curve.

The compander settings 530 identify different settings based on the audio category 518. As illustrated in FIG. 5A, these settings may correspond to a first setting (e.g., Setting 1: TTS, flash briefing, VoIP, or other voice signals), a second setting (e.g., Setting 2: Music), a third setting (e.g., Setting 3: Alarm), a fourth setting (e.g., Setting 4: Noise/Silence), and/or the like. While FIG. 5A only illustrates these four settings, the disclosure is not limited thereto and the compander settings may associate the audio category 518 with any number of different settings without departing from the disclosure.

The compander settings 530 may receive the audio category 518 from the audio classifier 510, a volume index value 532, and/or the SNR estimate value from the SNR estimation 522. The compander settings 530 may select a static gain curve based on the audio category 518, the volume index value 532, and/or the SNR estimate value 522. In some examples, the device 110 may select a plurality of gain curves corresponding to the audio category 518 and the SNR estimate value and then select a gain curve from the plurality of audio gain curves based on the volume index value 532. Thus, if the volume index value changes, the device 110 may select a different gain curve from the plurality of gain curves that corresponds to the updated volume index value.

In other examples, the device 110 may select a plurality of gain curves corresponding to the audio category 518 and then select a gain curve from the plurality of audio gain curves based on the volume index value 532. Using the selected gain curve and the SNR estimate value, the device 110 may generate a modified gain curve based on a magnitude of the SNR estimate value. For example, a large SNR estimate value may correspond to aggressive compander settings, such as a higher maximum gain (e.g., MaxGain), larger slope values (e.g., $Slope_{Noise}$, $Slope_{Exp}$, and/or $Slope_{Comp}$), shorter period of constant gain (e.g., the linear processing region), etc., whereas a small SNR estimate value may correspond to more gradual compander settings, such as a lower maximum gain (e.g., MaxGain), smaller slope values (e.g., $Slope_{Noise}$, $Slope_{Exp}$, and/or $Slope_{Comp}$), longer period of constant gain (e.g., the linear processing region), etc.

The adaptive noise gate, compressor, and expander 540 may receive the selected gain curve from the compander settings 530, may receive the loudness estimate value from the loudness measurement 520, and may determine an instantaneous gain value based on the static gain curve and the loudness estimate value. For example, the adaptive noise gate, compressor, and expander 540 may select the gain value along the static gain curve that corresponds to the loudness estimate value. While FIG. 5A illustrates the compander settings 530 as being separate from the adaptive noise gate, compressor, and expander 540, the disclosure is not limited thereto and the adaptive noise gate, compressor, and expander 540 may include the compander settings 530 without departing from the disclosure.

The adaptive noise gate, compressor, and expander 540 may output the instantaneous gain value to a gain smoother 550, and the gain smoother 550 may generate a smoothed gain value. For example, the gain smoother 550 may determine the smoothed gain value using the equation shown below:

$$g(n)=\alpha*g(n-1)+(1-\alpha)*\text{gain} \quad [1]$$

where the factor $\alpha$ is between 0.0 and 1.0.

Thus, the gain smoother 550 incorporates previous gain values to reduce the variation of the dynamic gain, with an amount of previous gains determined based on the value chosen for the factor $\alpha$. For example, $\alpha=0$ corresponds to only using the instantaneous gain value, $\alpha=1$ corresponds to using the previous gain value, and $0<\alpha<1$ corresponds to a variable amount of smoothing. As a result, the gain smoother 550 ramps between different gain values when the compander settings 530 dynamically switches between different settings for various audio categories and/or volume index values.

A look-ahead buffer 560 may receive the input audio data 502 and generate delayed audio data corresponding to the input audio data 502. For example, the look-ahead buffer 560 introduces a slight delay that allows the device 110 to generate predictive level control, such that the gain decreases before any loud noises or other large variations in volume.

The device 110 may generate volume-leveled audio data by applying the smoothed gain value to the delayed audio data. For example, a volume leveler 570 may receive the delayed input audio data from the look-ahead buffer 560 and may multiply the delayed input audio data by the smoothed gain value. Finally, the device 110 may modify the volume-leveled audio data to avoid clipping using a limiter 580 in order to generate output audio data 582.

FIG. 6A illustrates an example component diagram for determining a loudness estimate according to embodiments of the present disclosure. The loudness measurement 520 may include K2-weighting filter(s) 610, noise/silence detection 620, high pass filter(s) (HPF) 630, RMS level estimate(s) 640, weighting adjustment(s) 650, and/or a combiner 660. As illustrated in FIG. 6A, the loudness measurement 520 may determine a loudness estimate value (e.g., loudness value) for two or more audio channels. For example, the loudness measurement 520 may receive first audio data corresponding to a first channel of the input audio data (e.g., $x_l(n)$) and second audio data corresponding to a second channel of the input audio data (e.g., $x_r(n)$).

As illustrated in FIG. 6A, the K2-weighting filter 610a may receive the first audio data (e.g., $x_l(n)$) and may generate second audio data by filtering the first audio data. For example, the K2-weighting filter 610a may filter the first audio data using a second order infinite impulse response (IIR) filter with a 100 Hz cutoff frequency, although the disclosure is not limited thereto. The K2-weighting filter 610a may output the second audio data to noise/silence detection 620a and to HPF 630a.

The HPF 630a may generate third audio data by filtering the second audio data using a high-pass filter. For example, the HPF 630a may filter the second audio data using a cutoff frequency chosen based on a size of the loudspeaker(s) associated with the device 110, such as a 60 Hz cutoff frequency or a 300 Hz cutoff frequency.

The noise/silence detection 620a may determine if noise/silence is detected in the first audio data. For example, the noise/silence detection 620a may use the techniques discussed above with regard to the audio classifier 510 to detect noise/silence. If noise/silence is not detected, a RMS level estimate 640a may determine a root mean square (RMS) level estimate using the third audio data. For example, the RMS level estimate 640a may determine the RMS level estimate in a first time range of the third audio data. If silence/noise was detected by the noise/silence detection 620a, the RMS level estimate 640a may freeze adaptation of the RMS level estimate and not update the RMS level estimate (e.g., not calculate a current loudness estimate during periods of noise/silence).

The RMS level estimate 640a may output the RMS level estimate to a weighting adjustment 650a, which may apply a weight value to the RMS level estimate to generate a channel loudness estimate. For example, for the stereo implementation illustrated in FIG. 6A, the weight value may correspond to a value of 0.5, whereas for a five channel implementation, the weight value may correspond to a value of 0.2.

The loudness measurement 520 may perform the steps described above to determine a channel loudness estimate for each channel of the input audio data. For example, FIGS. 6A-6B illustrate a second channel that includes the same components as described above to generate a second channel loudness estimate. A combiner 660 may combine the first channel loudness estimate 670, which is output to the adaptive noise gate, compressor, and expander 540.

As discussed above, the loudness measurement 520 may determine whether noise/silence is detected and, if not (e.g., audio data corresponds to music, voice, and/or other audio categories), may update the loudness estimate 670. For example, the loudness measurement 520 may determine the loudness estimate 670 using the following equation:

$$x^2_{rms}(n) = (1-k) \cdot x^2_{rms}(n-1) + k \cdot [x(n)]^2 \quad [2]$$

where x(n) is the input audio data, factor k=1−exp(−2.2/(fs*t/1000)), t is a time constant in milliseconds (e.g., 50 ms), and fs is the sampling rate (e.g., 48 kHz).

If the loudness measurement 520 has not determined a previous loudness estimate value, the loudness measurement 520 may use an initial loudness estimate value. Once the loudness measurement 520 has determined a previous loudness estimate value, the loudness measurement 520 may update or "adapt" the loudness estimate value using Equation [2]. However, when the loudness measurement 520 determines that noise/silence is detected, then adaptation of the loudness estimate value is frozen. For example, the loudness estimate 670 would be determined using the following equation:

$$x^2_{rms}(n) = x^2_{rms}(n-1) \quad [3]$$

While FIG. 6A illustrates a first example component diagram that includes noise/silence detection 620, the disclosure is not limited thereto. Instead, FIG. 6B illustrates a second example component diagram that does not include the noise/silence detection 620. Each of the components illustrated in FIG. 6B operate as described above with regard to FIG. 6A, except that the second example component diagram illustrated in FIG. 6B receives an indicator of music and voice, noise and silence, which is sent to RMS level estimate 640.

Figure 7A:
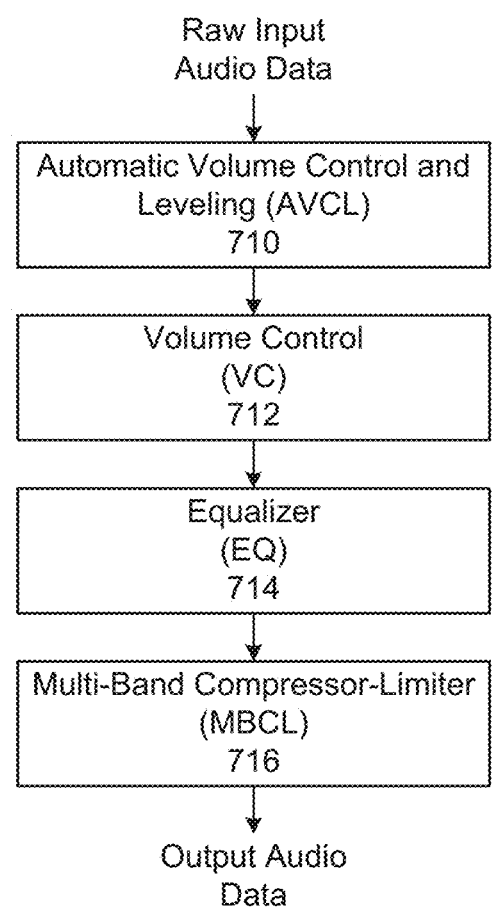
FIGS. 7A-7B illustrate example component diagrams for performing automatic volume control and leveling in different audio paths according to embodiments of the present disclosure.
Figure 7B:
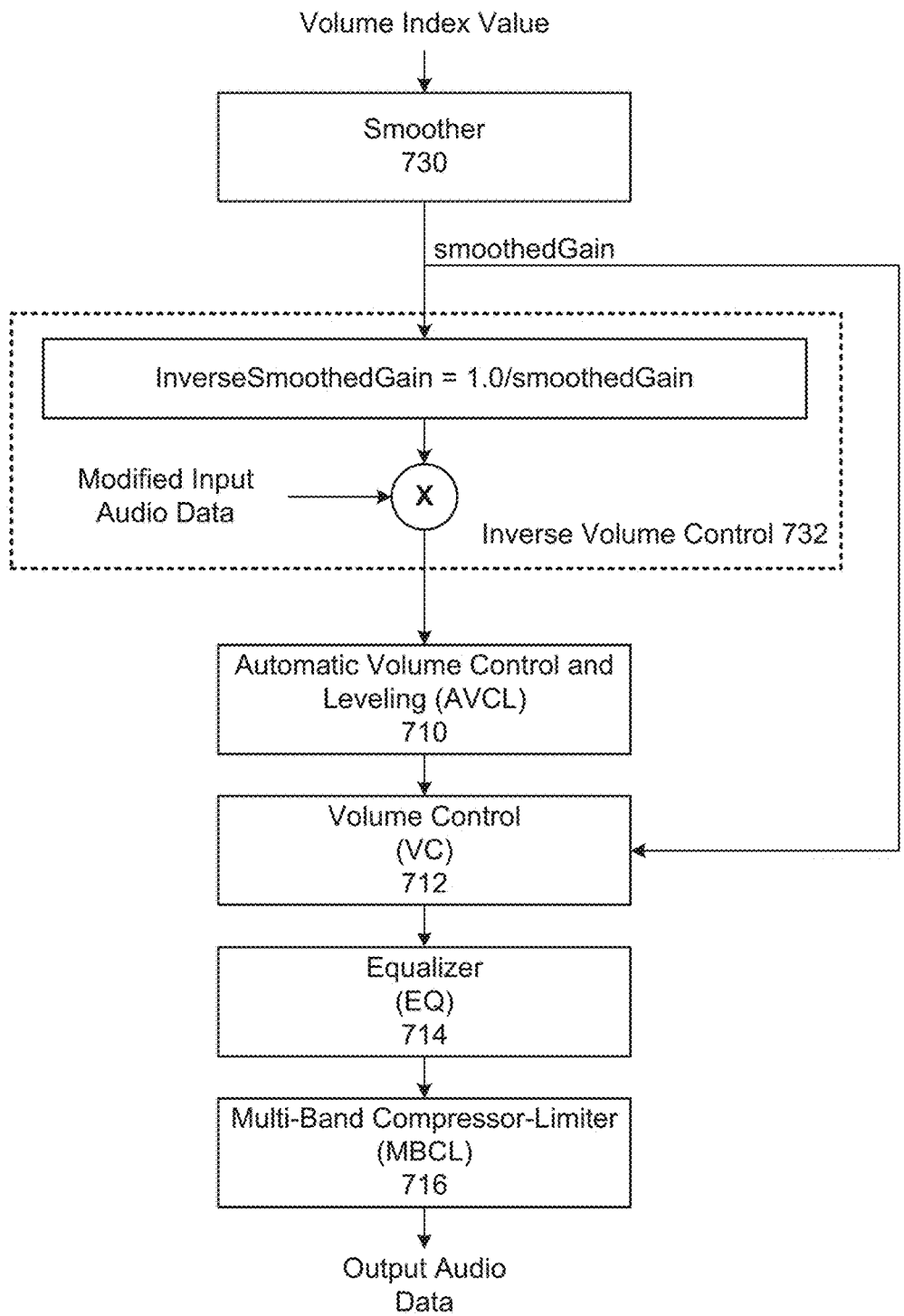

FIGS. 7A-7B illustrate example component diagrams for performing automatic volume control and leveling in different audio paths according to embodiments of the present disclosure. In some examples, the device 110 may receive raw input audio data prior to any volume control or any other processing that would modify the raw input audio data. FIG. 7A illustrates a first example corresponding to receiving raw input audio data and performing automatic volume control and leveling (AVCL) and other audio processing to generate output audio data. In other examples, however, the device 110 may receive modified input audio data that has already been processed with volume control or other audio processing. FIG. 7B illustrates a second example corresponding to receiving modified input audio data, wherein the device 110 may perform an inverse operation to recover the raw input audio data prior to performing AVCL and the other audio processing to generate the output audio data.

As illustrated in FIG. 7A, an automatic volume control and leveler 710 may receive raw input audio data and perform AVCL to generate first audio data, which is output to a volume control (VC) 712. The VC 712 may perform volume control (e.g., embedded volume control) to generate second audio data, which is output to an equalizer (EQ) 714. The EQ 714 may perform equalization (e.g., apply different gain values to different frequency bands of the second audio data) to generate third audio data, which is output to a multi-band compressor-limiter (MBCL) 716. The MBCL 716 may perform multi-band compression/limiting (e.g., maximize loudness and bass, prevent loudspeaker audio from overflow and clipping, and reduce total harmonic distortion that is unique to one or more loudspeaker(s) associated with the device 110) to generate fourth audio data, which is output as output audio data to be sent to the one or more loudspeaker(s). The one or more loudspeaker(s) may generate output audio based on the output audio data.

The AVCL 710 performs audio processing specific for the raw input audio data (or portions of the raw input audio data)

based on the audio source, the audio category, the volume index value, and/or the like. Thus, the audio processing performed by the AVCL 710 changes dynamically based on the raw input audio data. In contrast, the MBCL 716 performs audio processing specific for the one or more loudspeaker(s) that are associated with the device 110 and used to generate the output audio. Thus, the audio processing performed by the MBCL 716 is static for the device 110.

The audio processing performed by the VC 712 is intended to convert volume levels from a logarithmic scale (e.g., decibels) to a linear scale (e.g., volume value between 0.0-1.0). For example, the VC 712 may correspond to embedded volume control that apply the linear scale volume to the first audio data to generate the second audio data.

The audio processing performed by the EQ 714 depends on settings and/or user preferences stored by the device 110 and/or applications running on the device 110. For example, equalization settings may be static for the device 110, may be genre-specific (e.g., equalization settings change based on the genre of music identified by the audio classifier 510), may be user-specific (e.g., equalization settings change based on user profile), may be application or process specific (e.g., each process running on the device 110 has different equalization settings), and/or may be controlled by a user interface (e.g., enabling the user 5 to easily change the equalization settings). Thus, in some examples the equalization settings may vary depending on a time of day, a source of audio, an application, a genre of music, and/or the like. To illustrate an example of the equalization settings varying based on genre, the audio classifier 510 may determine that the input audio data 502 corresponds to a first audio category (e.g., music) and further to a first subcategory (e.g., genre of music). The audio classifier 510 may send the first audio category and/or the first subcategory to the compander settings 530 in order to select an appropriate gain curve for the adaptive noise gate, compressor, and expander 540. In addition, the audio classifier 510 and/or the compander settings 530 may send the first subcategory to the EQ 714 in order to select appropriate equalization settings. Thus, the EQ 714 may apply first equalization settings for a first genre of music (e.g., jazz) and second equalization settings for a second genre of music (e.g., rock).

As discussed above, FIG. 7B illustrates a second example corresponding to receiving modified input audio data, wherein the device 110 may perform an inverse operation to recover the raw input audio data prior to performing AVCL and the other audio processing to generate the output audio data. As illustrated in FIG. 7B, a smoother 730 may receive a volume index value used to generate the modified input audio data and may determine a smoothed gain (e.g., smoothedGain) based on the volume index value. In some examples, the smoothed gain may be an entire volume curve (e.g., the volume curve corresponding to the volume index value, which was applied by volume control to generate the modified input audio data), although the disclosure is not limited thereto and the smoothed gain may be a single value without departing from the disclosure.

Using the smoothed gain, the device 110 may perform inverse volume control to recover the raw input audio data. For example, inverse volume control 732 determines an inverse smoothed gain based on the smoothed gain (e.g., InverseSmoothedGain=1.0/smoothedGain) and then uses the inverse smooth gain and the modified input audio data to generate raw input audio data. The raw input audio data corresponds to the input audio data prior to volume control being performed.

Then the automatic volume control and leveler 710 may receive the raw input audio data and perform AVCL to generate first audio data, which is output to the volume control (VC) 712. The VC 712 may perform volume control (e.g., embedded volume control) to generate second audio data, which is output to an equalizer (EQ) 714. As illustrated in FIG. 7B, the VC 712 may perform volume control using the smoothed gain determined by the smoother 730.

The EQ 714 may perform equalization (e.g., apply different gain values to different frequency bands of the second audio data) to generate third audio data, which is output to a multi-band compressor-limiter (MBCL) 716. The MBCL 716 may perform multi-band compression/limiting (e.g., maximize loudness and bass, prevent loudspeaker audio from overflow and clipping, and reduce total harmonic distortion that is unique to one or more loudspeaker(s) associated with the device 110) to generate fourth audio data, which is output as output audio data to be sent to the one or more loudspeaker(s).

FIGS. 8A-8B illustrate examples of volume-leveled output data according to embodiments of the present disclosure. As illustrated in FIG. 8A, a first input chart 810 illustrates an example of first input audio data corresponding to music signals and a first volume leveled output chart 812 illustrates an example of first output audio data generated based on a first gain curve associated with music signals. As represented in the first input chart 810, the first input audio data can be separated into three distinct portions that are associated with different input amplitudes (e.g., input energy levels); a first portion associated with a first input amplitude, a second portion associated with a second input amplitude that is higher than the first input amplitude, and a third portion associated with a third input amplitude that is significantly lower than the second input amplitude and appears to be lower than the first input amplitude. The device 110 may select the first gain curve based on the first audio category (e.g., music signals) and a current volume index value, may determine first loudness estimate values based on the input amplitudes, may determine first gain values corresponding to the first loudness estimate values, and may generate the first output audio data using the first gain values. As represented in the first volume leveled output chart 812, the first output audio data has relatively consistent output amplitudes, with each of the three portions of the first input audio data corresponding to a similar volume level in the first output audio data.

As illustrated in FIG. 8B, a second input chart 820 illustrates an example of second input audio data corresponding to voice signals and a second volume leveled output chart 822 illustrates an example of second output audio data generated based on a second gain curve associated with voice signals. As represented in the second input chart 820, the second input audio data can be separated into two distinct portions that are associated with different input amplitudes (e.g., input energy levels); a first portion that is associated with a first input amplitude and a second portion that is associated with a second input amplitude that is higher than the first input amplitude. The device 110 may select a second gain curve based on the second audio category (e.g., voice signals) and a current volume index value, may determine second loudness estimate values based on the input amplitudes, may determine second gain values corresponding to the second loudness estimate values, and may generate the second output audio data using the second gain values. As represented in the second volume leveled output chart 822, the second output audio data has relatively consistent output amplitudes, with both portions of the second input audio data corresponding to a similar volume level in the second output audio data.

As illustrated in FIGS. 8A-8B, an envelope of the raw input audio data includes rapid fluctuations, whereas the envelope of the output audio data does not. Therefore, the automatic volume control and leveling system has improved the audio level consistency.

Figure 9:
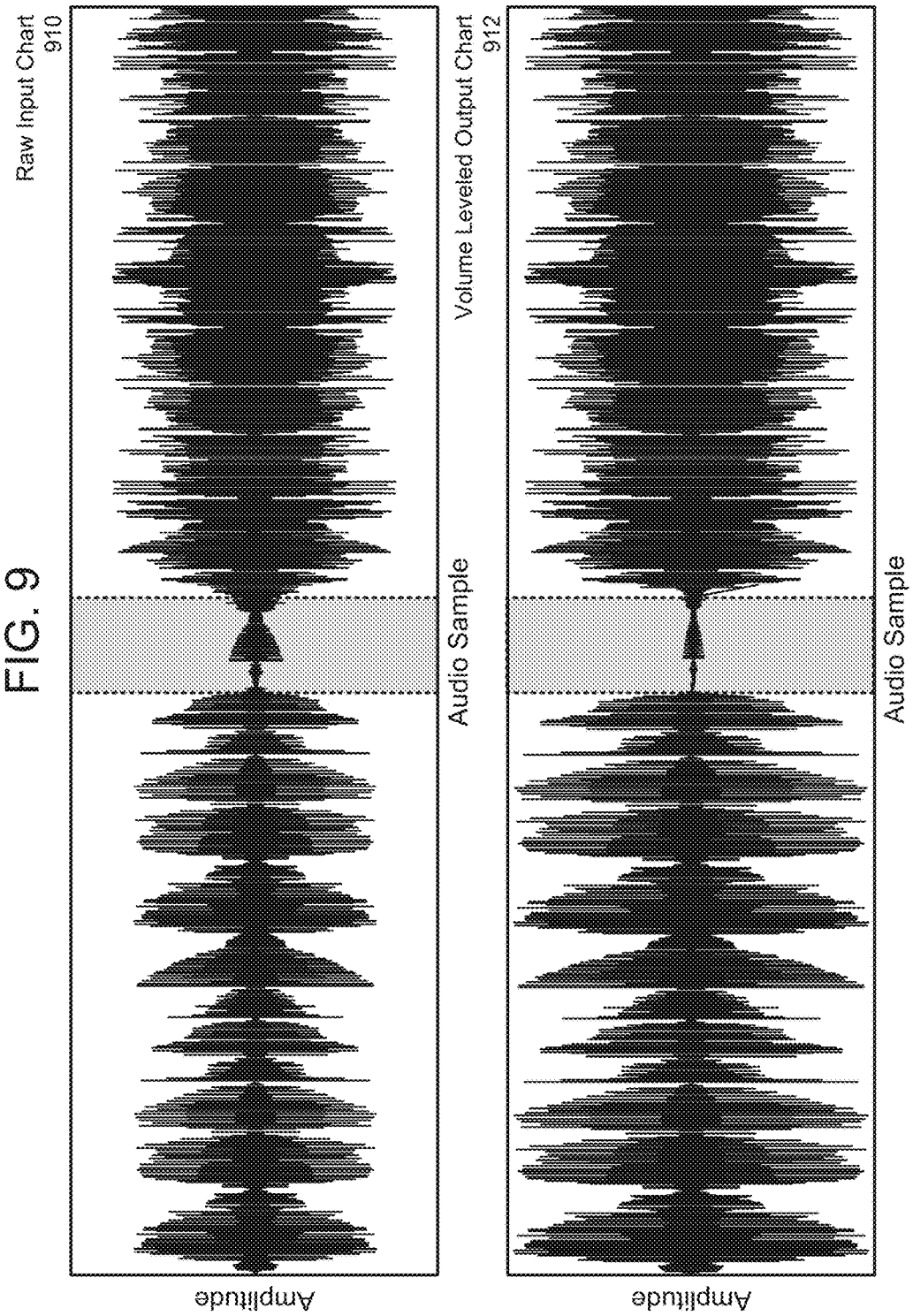
FIG. 9 illustrates an example of volume-leveled output data with in-channel noise reduction according to embodiments of the present disclosure.

FIG. 9 illustrates an example of volume-leveled output data with in-channel noise reduction according to embodiments of the present disclosure. As illustrated in FIG. 9, a raw input chart 910 illustrates an example of raw input audio data corresponding to voice signals and a volume leveled output chart 912 illustrates an example of output audio data generated based on a gain curve associated with voice signals. As represented in the raw input chart 910, the raw input audio data can be separated into three distinct portions that are associated with different input amplitudes (e.g., energy levels); a first portion that is associated with a first input amplitude, a second portion that is associated with a much lower second input amplitude, and a third portion that is associated with a third input amplitude that is higher than the first input amplitude. The device 110 may select a gain curve based on the audio category (e.g., voice signals) and a current volume index value, may determine loudness estimate values based on the input amplitudes, may determine gain values corresponding to the loudness estimate values, and may generate the output audio data using the gain values.

As represented in the volume leveled output chart 912, the output audio data can also be separated into three distinct portions that are associated with different output amplitudes; a first portion that is associated with a first output amplitude, a second portion that is associated with a much lower second output amplitude, and a third portion that is associated with the first output amplitude. Thus, the first portion and the third portion of the output audio data have relatively consistent output amplitudes, as both the first portion and the third portion correspond to a similar volume level. However, the second portion of the output audio data is not amplified like the first portion and the third portion, and therefore the second output amplitude is very different than the first output amplitude. Instead, to reduce the in-channel noise present in the second portion of the raw input audio data, the device 110 attenuates the second portion such that the second output amplitude is even lower than the second input amplitude. For example, breathing noise or other noise included in the second portion of the raw input audio data is reduced in the output audio data.

FIG. 10 illustrates an example of volume-leveled output data with in-channel noise reduction according to embodiments of the present disclosure. As illustrated in FIG. 10, a raw input chart 1010 illustrates an example of raw input audio data corresponding to voice signals and a volume leveled output chart 1012 illustrates an example of output audio data generated based on a gain curve associated with voice signals. As represented in the raw input chart 1010, the raw input audio data can be separated into three distinct portions that are associated with different input amplitudes (e.g., energy levels); a first portion that is associated with a first input amplitude, a second portion that is associated with a much lower second input amplitude, and a third portion that is associated with a third input amplitude that is higher than the first input amplitude. The device 110 may select a gain curve based on the audio category (e.g., voice signals) and a current volume index value, may determine loudness estimate values based on the input amplitudes, may determine gain values corresponding to the loudness estimate values, and may generate the output audio data using the gain values.

As represented in the volume leveled output chart 1012, the output audio data can also be separated into three distinct portions that are associated with different output amplitudes; a first portion that is associated with a first output amplitude, a second portion that is associated with a much lower second output amplitude, and a third portion that is associated with the first output amplitude. Thus, the first portion and the third portion of the output audio data have relatively consistent output amplitudes, as both the first portion and the third portion correspond to a similar volume level. However, the second portion of the output audio data is not amplified like the first portion and the third portion, and therefore the second output amplitude is very different than the first output amplitude. Instead, to reduce the in-channel noise present in the second portion of the raw input audio data, the device 110 attenuates the second portion such that the second output amplitude is even lower than the second input amplitude. For example, the noise floor included in the second portion of the raw input audio data is reduced in the output audio data.

Figure 11B:
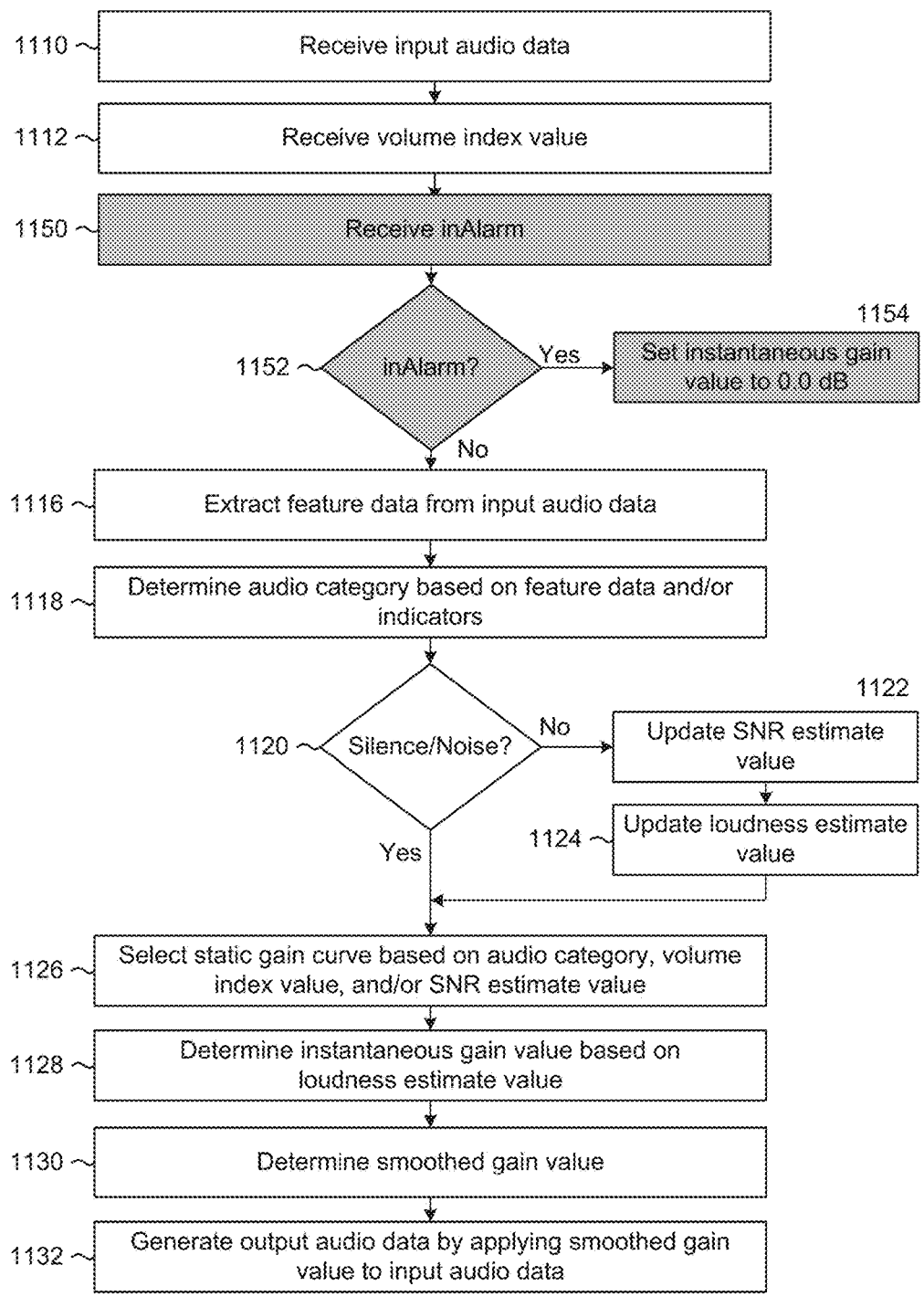

FIGS. 11A-11B are flowcharts conceptually illustrating example methods for generating volume-leveled output audio data according to embodiments of the present disclosure. As illustrated in FIG. 11A, the device 110 may receive (1110) input audio data, receive (1112) a volume index value, and may optionally receive (1114) indicators. The device 110 may determine an audio category without the indicators, but if the indicators are available they assist the device 110 in selecting an appropriate audio category and corresponding compander settings.

To determine the audio category, the device 110 may extract (1116) feature data from the input audio data and may determine (1118) the audio category based on the feature data and/or the indicators, as described in greater detail above with regard to FIGS. 5A-5D. As discussed above, the device 110 may use the feature data to differentiate between two audio categories (e.g., music or voice), three audio categories (e.g., music, voice or noise/silence), and/or a plurality of audio categories (e.g., different genres of music, additional audio categories, etc.) without departing from the disclosure.

While noise/silence is illustrated as an audio category in some examples, the disclosure is not limited thereto. Instead, the device 110 may classify audio data into other audio categories (e.g., music or voice) but also identify noise/silence within the audio data and select a gain value of 0 dB. For example, a portion of audio data may be associated with a first audio category (e.g., music), and gain curves associated with the first audio category may be used to determine gain value(s) and perform AVCL. However, whenever noise/silence is detected within the portion of the audio data, the device 110 may freeze adaptation of the loudness estimate value, freeze adaptation of the SNR estimate value, and/or override the selected gain curve to select a gain value of 0 dB. Thus, the device 110 may detect noise/silence and generate a noise/silence indicator that is separate from the audio category. This may be beneficial when the indicators are used to determine the audio category, as the device 110 may determine the audio category without using the audio classifier 510, but the audio classifier 510 may still be used to detect noise/silence and generate the noise/silence indicator. For example, if a first indicator (e.g., inMusic) is false (e.g., first binary value) and a second indicator (e.g., inTTS) is true (e.g., second binary value), the device 110 may determine that the audio category corresponds to voice signals and may select a corresponding gain curve. However, within the input audio data will be moments of silence where speech is not present and the audio classifier 510 may generate the noise/silence indicator to prevent adaptation of the loudness estimate value, adaptation of the SNR estimate value, and override the selected gain curve to select a gain value of 0 dB during these moments of silence.

The device 110 may determine (1120) whether noise/silence is detected and, if not (e.g., audio data corresponds to music, voice, and/or other audio categories), may update (1122) an SNR estimate value and update (1124) a loudness estimate value. For example, the loudness measurement 520 may determine the loudness estimate value for a specified time range, as discussed above with regard to FIGS. 6A-6B. If the loudness measurement 520 has determined a previous loudness estimate value, the loudness measurement 520 may update or "adapt" the loudness estimate value as discussed above. Similarly, the SNR estimation 522 may determine the SNR estimate value for a specified time range, as discussed above with regard to FIGS. 5A-5D. If the SNR estimation 522 has determined a previous SNR estimate value, the SNR estimation 522 may update or "adapt" the SNR estimate value as discussed above.

After updating the SNR estimate value in step 1122 and updating the loudness estimate value in step 1124, or if silence/noise is detected in step 1120, the device 110 may select (1126) a gain curve corresponding to the audio category, the volume index value, and/or the SNR estimate value. For example, the device 110 may select a plurality of gain curves based on the audio category and then select the gain curve from the plurality of gain curves based on the volume index value and/or the SNR estimate value. Thus, if the volume index value and/or the SNR estimate value change, the device 110 may select a different gain curve from the plurality of gain curves that corresponds to the updated volume index value and/or updated SNR estimate value.

Based on the selected gain curve, the device 110 may determine (1128) an instantaneous gain value using the loudness estimate value. For example, the device 110 may determine the gain value along the gain curve that corresponds to the loudness estimate value, as discussed above with regard to FIG. 4. The device 110 may then determine (1130) a smoothed gain value based on the instantaneous gain value, as discussed above with regard to the gain smoother 550 illustrated in FIGS. 5A-5D. For example, the gain smoother 550 incorporates previous gain values to reduce the variation of the dynamic gain, with an amount of previous gains determined based on the value chosen for a. Thus, $\alpha=0$ corresponds to only using the instantaneous gain value, $\alpha=1$ corresponds to using the previous gain value, and $0<\alpha<1$ corresponds to a variable amount of smoothing.

The device 110 may generate (1132) output audio data by applying the smoothed gain value to the input audio data. For example, the device 110 may receive delayed input audio data from the look-ahead buffer 560 and may multiply delayed input audio data by the smoothed gain value using the volume leveler 570, as illustrated in FIGS. 5A-5D. As part of generating the output audio data, the device 110 may modify the output audio data using the limiter 580 to avoid overflow and clipping.

FIG. 11B illustrates another example in which the device 110 only receives inAlarm as an indicator. As illustrated in FIG. 11B, the device 110 may receive (1110) the input audio data, receive (1112) the volume index value, and receive (1150) an inAlarm indicator. The device 110 may determine (1152) whether the inAlarm indicator is true, and if so, may set (1154) the instantaneous gain value to 0.0 dB and end processing. If the inAlarm indicator is not true, the device 110 may proceed to step 1116 and perform steps 1116-1132 as described above with regard to FIG. 11A.

Figure 12A:
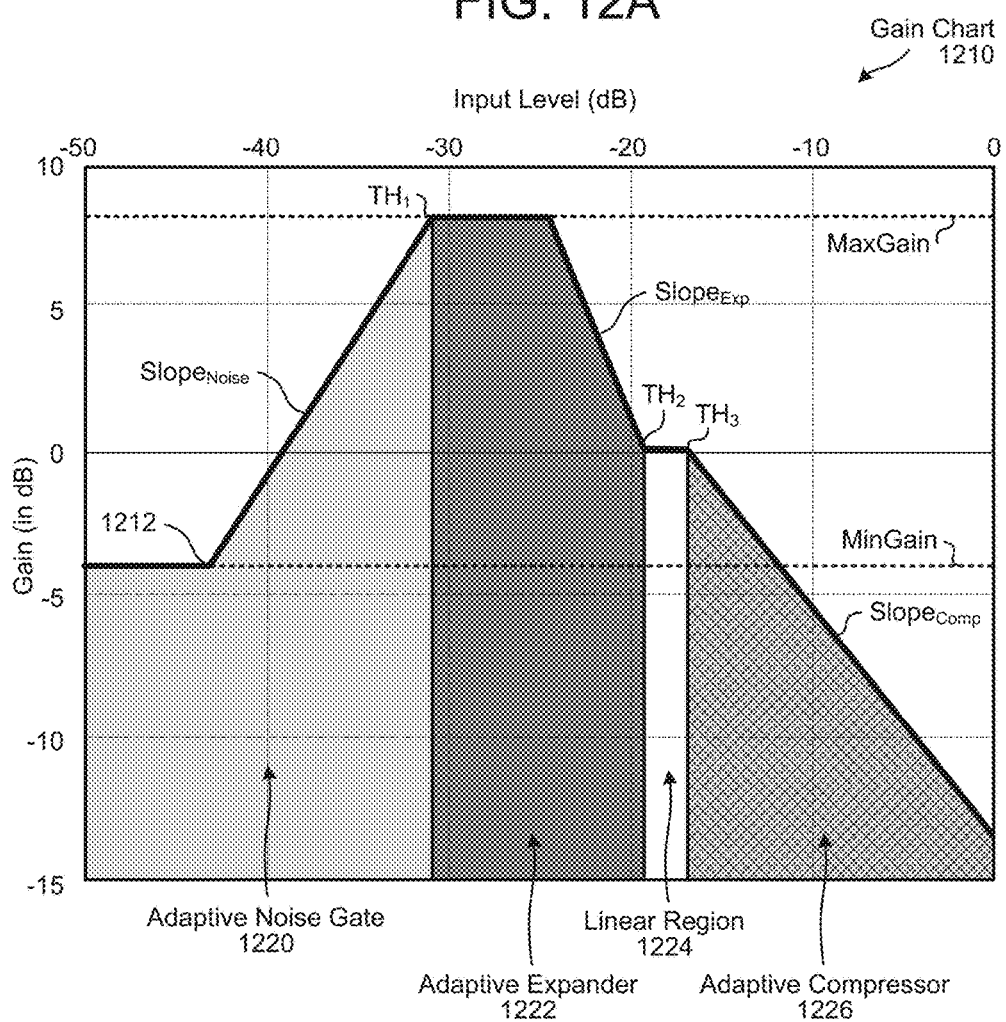
FIGS. 12A-12B illustrate an example of an adaptive gain chart and a corresponding flowchart conceptually illustrating an example method for determining adaptive gain according to embodiments of the present disclosure.
Figure 12B:
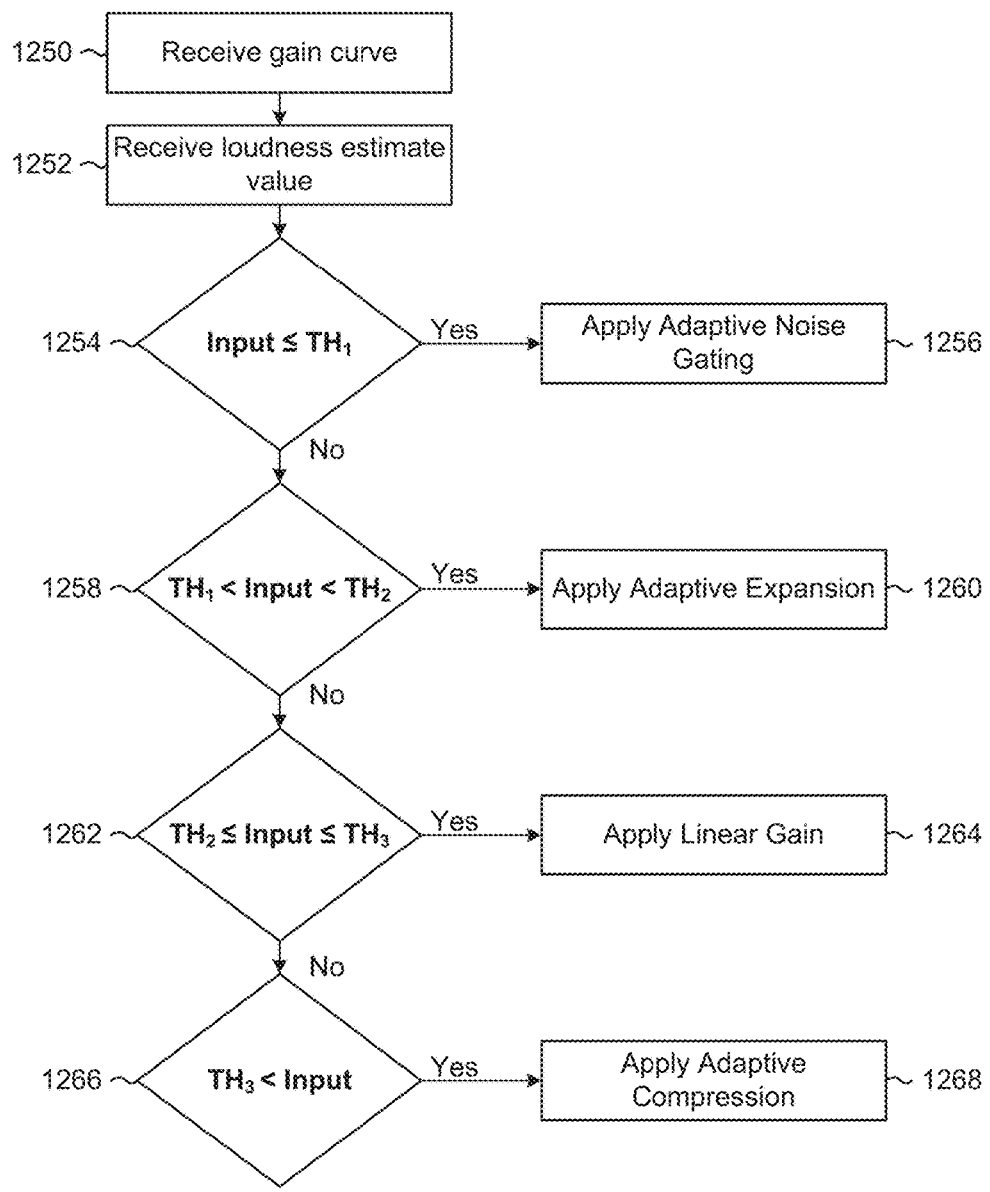

FIGS. 12A-12B illustrate an example of an adaptive gain chart and a corresponding flowchart conceptually illustrating an example method for determining adaptive gain according to embodiments of the present disclosure. As illustrated in FIG. 12A, a gain chart 1210 includes an example gain curve 1212 that may be applied when performing AVCL. For example, AVCL determines gain values dynamically based on the input level, increasing the gain at lower input levels (e.g., amplifying quiet sounds) and decreasing the gain at higher energy levels (e.g., attenuating loud sounds).

The gain curve 1212 represented in gain chart 1210 may be separated into six different sections based on energy ranges (e.g., input level ranges). For example, a first section (e.g., −50 dB to −43 dB input level) has a gain value of −4 dB (e.g., MinGain), a second section (e.g., −43 dB to −32 dB input level) has a first slope value $Slope_{Noise}$ (e.g., first positive slope), a third section (e.g., −32 dB to −24 dB input level) has a gain value of 8 dB (e.g., MaxGain), a fourth section (e.g., −24 dB to −19 dB input level) has a second slope value $Slope_{Exp}$ (e.g., first negative slope), a fifth section (e.g., −19 dB to −17 dB input level) has a gain value of 0 dB (e.g., linear processing), and a sixth section (e.g., −17 dB to 0 dB input level) has a third slope value $Slope_{Comp}$ (e.g., second negative slope). Thus, the gain curve applies an adaptive noise gate to input audio data having a level of −32 dB and below (with attenuation applied input level of −43 dB and below), applies upward compression (e.g., expansion) to input audio data having a level between −32 dB and −19 dB (e.g., to increase the loudness of sounds), applies constant gain (e.g., 0 dB) to input audio data having a level between −19 dB and −17 dB, and applies downward compression to input audio data having a level above −17 dB (e.g., to decrease the loudness of sounds).

The first section (e.g., first energy range corresponding to input levels between −50 dB to −43 dB) and the second section (e.g., second energy range corresponding to input levels between −43 dB to −32 dB) correspond to an adaptive noise gate 1220, the third section (e.g., third energy range corresponding to input levels between −32 dB to −24 dB) and the fourth section (e.g., fourth energy range corresponding to input levels between −24 dB to −19 dB) correspond to an adaptive expander 1222, the fifth section (e.g., fifth energy range corresponding to input levels between −19 dB to −17 dB) corresponds to a linear processing region 1224, and the sixth section (e.g., sixth energy range corresponding to input levels between −17 dB to 0 dB) corresponds to an adaptive compressor 1226. While the gain chart 1210 illustrates input levels between −50 dB and 0 dB, the disclosure is not limited thereto. For example, the gain chart 1210 may include input levels below −50 dB without departing from the disclosure.

Additionally or alternatively, while a description of the gain chart 1210 groups the first section and the second section together (e.g., associating them with the adaptive noise gate 1220) and groups the third section and the fourth section together (e.g., associating them with the adaptive expander 1222), the disclosure is not limited thereto. Instead, the system 100 may separate the gain chart 1210 based on whether the gain corresponds to upward compression or downward compression without departing from the disclosure. For example, the system 100 may group the first section and a first portion of the second section (e.g., where Gain≤0 dB), as corresponding gain values apply downward compression. Similarly, the system 100 may group a second portion of the second section (e.g., where Gain>0 dB) and the third section and the fourth section, as corresponding gain values apply upward compression.

The adaptive noise gate 1220 includes both upward compression (e.g., gain values above 0 dB for input levels from −38 dB to −32 dB) and downward compression (e.g., gain values below 0 dB for input levels below −38 dB), but the upward compression is reduced compared to the adaptive expander 1222. A gain value within the adaptive noise gate 1220 may be determined based on a first threshold value $TH_1$, a first slope value $Slope_{Noise}$, a minimum gain value MinGain, and a maximum gain value MaxGain, using the equation below:

$$Gain_1 = Slope_{Noise} * (Input - TH_1) + MaxGain \qquad [4]$$

if ($Gain_1$<MinGain) then $Gain_1$=MinGain where $Gain_1$ is the gain value selected within the adaptive noise gate 1220, $Slope_{Noise}$ is the first slope value of the second section, Input is the loudness estimate value of the input audio data, $TH_1$ is the first threshold value used to separate the adaptive noise gate 1220 and the adaptive expander 1222, MaxGain is a maximum gain value (e.g., value of the third section), and MinGain is a minimum gain value (e.g., value of the first section). Thus, the device 110 may determine that the loudness estimate value is less than or equal to the first threshold value $TH_1$ and calculate the instantaneous gain value using Equation [4], with the instantaneous gain value ranging between the minimum gain value and the maximum gain value based on the first slope value.

The adaptive expander 1222 applies adaptive expansion or simply "expansion" (e.g., gain values above 0 dB). A gain value within the adaptive expander 1222 may be determined based on the first threshold value $TH_1$, a second slope value $Slope_{Exp}$, a second threshold value $TH_2$, and the maximum gain value MaxGain, using the equation below:

$$Gain_2 = Slope_{Exp} * (TH_2 - Input) \qquad [5]$$

if ($Gain_2$>MaxGain), then $Gain_2$=MaxGain where $Gain_2$ is the gain value selected within the adaptive expander 1222, $Slope_{Exp}$ is the second slope value of the fourth section, $TH_2$ is the second threshold value used to separate the adaptive expander 1222 and the linear processing region 1224, Input is the loudness estimate value of the input audio data, and MaxGain is a maximum gain value (e.g., value of the third section). Thus, the device 110 may determine that the loudness estimate value is above the first threshold value $TH_1$ but below the second threshold value $TH_2$ and calculate the instantaneous gain value using Equation [5], with the instantaneous gain value ranging between the maximum gain value and 0.0 dB based on the second slope value.

The linear processing region 1224 applies constant gain (e.g., 0.0 dB). A gain value within the linear processing region 1224 may be determined based on the second threshold value $TH_2$ and a third threshold value $TH_3$, using the equation below:

$$Gain_3 = 0.0 \text{ dB} \qquad [6]$$

where $Gain_3$ is the gain value selected within the linear processing region 1224. Thus, the device 110 may determine that the loudness estimate value is greater than or equal to the second threshold value $TH_2$ but less than or equal to the third threshold value $TH_3$ and calculate the instantaneous gain value using Equation [6], setting the gain to 0.0 dB.

The adaptive compressor 1226 applies adaptive compression or simply "compression" (e.g., gain values below 0.0 dB). A gain value within the adaptive compressor 1226 may be determined based on the third threshold value $TH_3$, using the equation below:

$$Gain_4 = Slope_{Comp} * (TH_3 - Input) \qquad [7]$$

where $Gain_4$ is the gain value selected within the adaptive compressor 1226, $Slope_{Comp}$ is the third slope value of the sixth section, $TH_3$ is the third threshold value used to separate the linear processing region 1224 and the adaptive compressor 1226, and Input is the loudness estimate value of the input audio data. Thus, the device 110 may determine that the loudness estimate value is above the third threshold value $TH_3$ and calculate the instantaneous gain value using Equation [7], with the instantaneous gain value determined based on the third slope value.

As illustrated in FIG. 12B, the device 110 may receive (1250) a gain curve and may receive (1252) a loudness estimate value (e.g., Input). The device 110 may determine (1254) whether the loudness estimate value is less than or equal to the first threshold value $TH_1$, and if so, may apply (1256) adaptive noise gating using equation [4] above.

If the loudness estimate value is not below the first threshold value $TH_1$, the device 110 may determine (1258) whether the loudness estimate value is greater than the first threshold value $TH_1$ but less than the second threshold value $TH_2$, and if so, may apply (1260) adaptive expansion using equation [5] above.

If the loudness estimate value is greater than or equal to the second threshold value $TH_2$, the device 110 may determine (1262) whether the loudness estimate value is greater than or equal to the second threshold value $TH_2$ but less than or equal to the third threshold value $TH_3$, and if so, may apply (1264) constant gain using equation [6] above.

Finally, the device 110 may determine (1266) whether the loudness estimate value is above the third threshold value $TH_3$, and if so, may apply (1268) adaptive compression using equation [7] above.

Figure 13A:
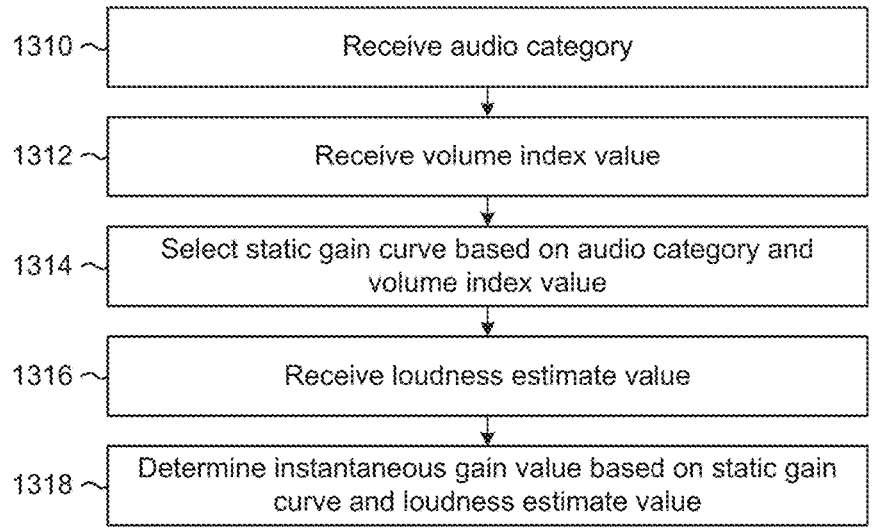

FIGS. 13A-13D are flowcharts conceptually illustrating example methods for determining an instantaneous gain value according to embodiments of the present disclosure. As illustrated in FIG. 13A, the device 110 may receive (1310) an audio category, may receive (1312) a volume index value and may select (1314) a static gain curve based on the audio category and the volume index value. For example, the device 110 may select a plurality of gain curves corresponding to the audio category and then select from the plurality of audio gain curves based on the volume index value.

The device 110 may receive (1316) a loudness estimate value and may determine (1318) an instantaneous gain value based on the static gain curve and the loudness estimate value. For example, the device 110 may select the gain value along the static gain curve that corresponds to the loudness estimate value.

Figure 13B:
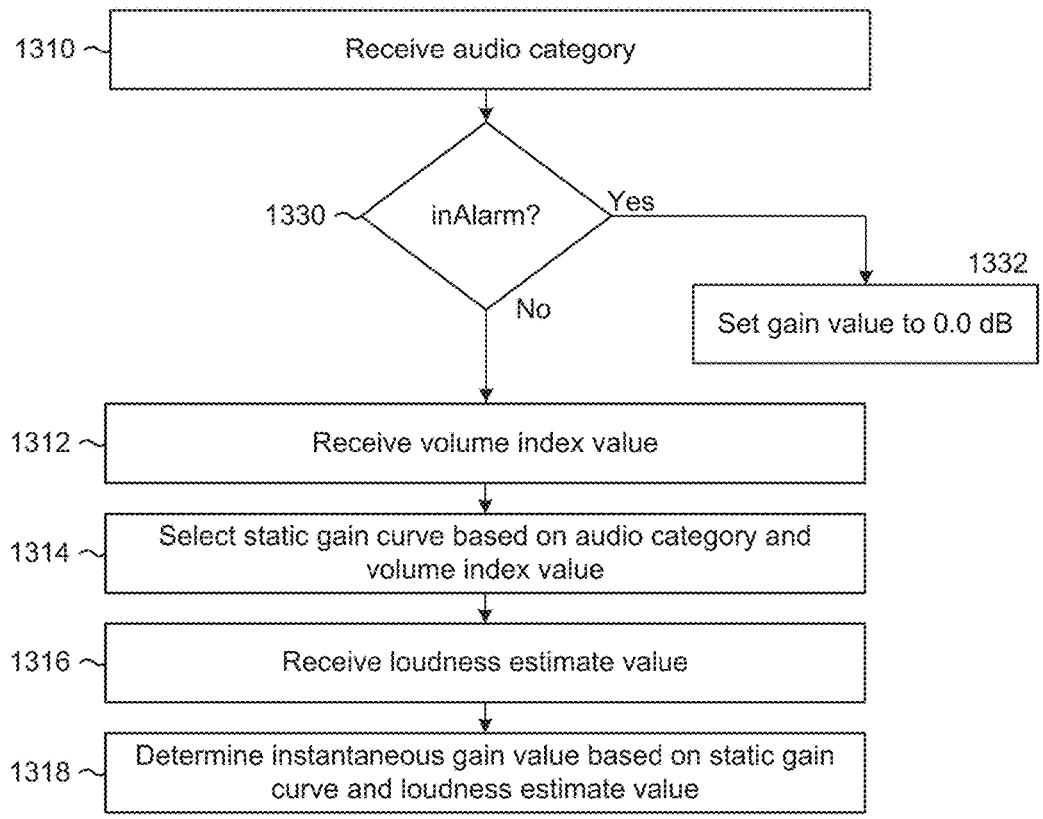

As illustrated in FIG. 13B, the device 110 may receive (1310) the audio category, may determine (1350) whether inAlarm is true (e.g., first binary value, such as a value of one), and may determine (1352) whether noise/silence is detected. If inAlarm is true or noise/silence is detected, the device 110 may set (1352) a gain value to 0.0 dB.

If inAlarm is false (e.g., second binary value, such as a value of zero) and noise/silence is detected, the device 110 may perform steps 1312-1318, as discussed above with regard to FIG. 13A.

While FIGS. 13A-13B illustrate examples of determining an instantaneous gain value based on an audio category, a volume index value, and a loudness estimate value, the disclosure is not limited thereto. For example, FIGS. 13C-13D illustrate examples of determining the instantaneous gain values based on the audio category, the volume index value, the loudness estimate value and a signal-to-noise ratio (SNR) estimate value. FIG. 13C illustrates a first example in which the SNR estimate value is used to select the static gain curve, while FIG. 13D illustrates a second example in which the SNR estimate value is used to modify the selected gain curve.

As illustrated in FIG. 13C, the device 110 may receive (1310) an audio category, may receive (1312) a volume index value, may receive (1340) an SNR estimate value, and may select (1342) a static gain curve based on the audio category, the volume index value and the SNR estimate value. For example, the device 110 may select a plurality of gain curves corresponding to the audio category and then select from the plurality of audio gain curves based on the volume index value and/or the SNR estimate value, although the disclosure is not limited thereto.

The device 110 may receive (1316) a loudness estimate value and may determine (1318) an instantaneous gain value based on the static gain curve and the loudness estimate value. For example, the device 110 may select the gain value along the static gain curve that corresponds to the loudness estimate value.

As illustrated in FIG. 13D, the device 110 may receive (1310) an audio category, may receive (1312) a volume index value and may select (1314) a static gain curve based on the audio category and the volume index value. For example, the device 110 may select a plurality of gain curves corresponding to the audio category and then select from the plurality of audio gain curves based on the volume index value.

The device 110 may receive (1350) an SNR estimate value and may generate (1352) a modified gain curve based on the SNR estimate value. For example, the device 110 may modify a maximum gain value (e.g., MaxGain), slope values (e.g., $Slope_{Noise}$, $Slope_{Exp}$, and/or $Slope_{Comp}$), threshold values, and/or the like based on the SNR estimate value. For example, if the SNR estimate value is small, the "compander effect" may be reduced by reducing the maximum gain (e.g., MaxGain), reducing slope values associated with portions of the gain curve (e.g., $Slope_{Noise}$, $Slope_{Exp}$, and/or $Slope_{Comp}$), and/or adjusting the threshold(s) and/or range(s) included in the static gain curve.

The device 110 may then receive (1316) a loudness estimate value and determine (1354) an instantaneous gain value based on the modified gain curve and the loudness estimate value. For example, the device 110 may select the gain value along the modified gain curve that corresponds to the loudness estimate value.

FIG. 14 illustrates an example component diagram for performing environment-aware adaptive gain according to embodiments of the present disclosure. Environment-aware adaptive gain corresponds to modifying the instantaneous gain, which is selected during automatic volume control and leveling (AVCL) by the adaptive noise gate, compressor, and expander 540, based on environmental noise around the device. For example, if the device 110 is a mobile device in transit from a quiet environment to a noisy environment, the device 110 may increase the gain to compensate for the environment noise increase. Additionally or alternatively, if the environment noise increases temporarily (e.g., a passing truck, a construction site, etc.), the device 110 may increase the gain temporarily while the environment noise is increased.

FIG. 14 illustrates an example component diagram including a transmission path (e.g., components associated with processing input audio data captured by microphone(s) 112 to generate output audio data) and a receiving path (e.g., components associated with receiving playback audio data and processing the playback audio data to generate playback audio by loudspeaker(s) 114).

As illustrated in FIG. 14, the transmission path may include N-microphone array 112, N-channel transmission (Tx) High-Pass filter (HPF) 1412, N-channel adaptive linear acoustic echo cancellation (AEC) 1414, N-channel adaptive residual echo suppression (RES) 1416, N-channel adaptive beamformer 1418, main beam selector 1420, automatic gain control (AGC) 1422 and automatic speech recognition (ASR) 1424. The transmission path components capture input audio data, process the input audio data and generate output audio data (TxOut) to be sent to a remote device.

The receiving path may include in-channel noise-adaptive and user preference-based (NAUP) automatic volume control and leveling (AVCL) 1450 (which includes Noise Gate and Compander Settings 1452), Equalizer (EQ) 1454, multi-band compressor-limiter (MBCL) 1456, sampling rate conversion 1458, High-pass filter 1460, and loudspeaker(s) 114. The receiving path components receive playback audio data (RxIn), process the playback audio data to generate modified playback audio data, and output the playback audio data as playback audio using the loudspeaker(s) 114.

The N-microphone array 112 may capture audio to generate input audio data (TxIn). The input audio data may include (1) near-end speech from a nearby user, (2) far-end speech from a remote user (e.g., echo signal corresponding to far-end speech output by the loudspeaker(s) 114), (3) acoustic echo (e.g., echo signal corresponding to other sounds output by the loudspeaker(s) 114), and/or (4) environment noise including background speech.

The transmission path components may process the input audio data to isolate the near-end speech. For example, the N-channel adaptive linear AEC 1414 and the N-channel adaptive residual echo suppression 1416 are configured to process the input audio data to reduce and/or remove the far-end speech and the acoustic echo. As illustrated in FIG. 14, the input audio data may be input to the N-channel Tx HPF 1412, which performs high-pass filtering of the input audio data to generate filtered input audio data. The filtered input audio data may be input to N-channel adaptive linear AEC 1414, which may perform acoustic echo cancellation using the filtered input audio data (e.g., AEC in) as a target signal and modified playback audio data (e.g., AEC Ref) as a reference signal. The output of the N-channel adaptive linear AEC 1414 may be input to the N-channel adaptive RES 1416, which applies residual echo suppression to further remove the echo signal and generate an echo-reduced signal.

The echo-reduced signal is input to the N-channel adaptive beamformer 1418, which performs adaptive beamforming to generate beamformed audio data in a plurality of directions. The beamformed audio data is input to main beam selector 1420, which selects beamformed audio data associated with a single direction and/or combines beamformed audio data associated with multiple directions to generate an output signal. Depending on the intended recipient, the output signal is input to the AGC 1422 (e.g., for voice communication) and/or the ASR 1424 (e.g., for speech processing of a voice command). For example, during a communication session with a remote device, the output signal may be input to the AGC 1422 to generate output audio data (TxOut) that is optimized for voice communication. In contrast, when the device 110 is sending the output audio data to remote server(s) for speech processing to determine a voice command, the output signal may be input to the ASR 1424 to generate second output audio data that is optimized for speech recognition.

The receiving path components may process the playback audio data to output playback audio using the loudspeaker(s) 114. For example, the NAUP AVCL 1450 may receive the playback audio data and apply volume control and leveling to generate first modified playback audio data, as discussed above with regard to FIG. 5A-5D. The first modified playback audio data may be input to the EQ 1454, which may perform equalization (e.g., apply different gain values to different frequency bands of the first modified playback audio data) to generate second modified playback audio data. The second modified playback audio data may be input to the MBCL 1456, which may perform multi-band compression/limiting (e.g., maximize loudness and bass, prevent loudspeaker audio from overflow and clipping, and reduce total harmonic distortion that is unique to one or more loudspeaker(s) associated with the device 110) to generate third modified playback audio data.

The third modified playback audio data may be output to the loudspeaker(s) 114 to generate the playback audio. In addition, the third playback audio data may be input to the sampling rate conversion 1458 and to the high-pass filter 1460 to generate the reference signal (AEC Ref) used by the N-channel adaptive linear AEC 1414. Thus, the device 110 may perform acoustic echo cancellation using the third modified playback audio data that generated the playback audio.

To implement environment-aware adaptive gain, the NAUP AVCL 1450 may include additional components that detect environment noise and adjust the gain applied by the noise gate and compander settings 1452. For example, the NAUP AVCL 1450 may include single far-end talk determination 1470 and level estimation of environment noise 1472 to determine an amount of gain to apply to compensate for environment noise.

The single far-end talk determination 1470 may determine when the playback audio data corresponds to far-end single-talk. For example, the single far-end talk determination 1470 may receive first input audio data output from the N-channel Tx HPF 1412, second input audio data output by the N-channel adaptive residual echo suppression 1416, and the third modified playback audio data output by the HPF 1460. In some examples, the single far-end talk determination 1470 may correspond to a double-talk detector (DTD) or similar components that distinguish between no talk (e.g., no speech detected), near-end single-talk (e.g., only local speech detected), far-end single-talk (e.g., only remote speech detected), and double-talk (e.g., both local speech and remote speech detected). To remove near-end speech from environment noise estimation, the device 110 only adapts an estimate of environment noise when near-end speech is not detected (e.g., far-end single-talk conditions). Thus, the output of the single far-end talk determination 1470 is used by the level estimation of environment noise 1472 to determine when to adapt the environment noise estimate value.

The level estimation of environment noise 1472 receives the output from the single far-end talk determination 1470 and input audio data output by the N-channel adaptive residual echo suppression 1416 and determines an environment noise estimate value. For example, the level estimation of environment noise 1472 may generate an environment noise estimate signal corresponding to the environment noise estimate and output the environment noise estimate signal to the noise gate and compander settings 1452, which may adjust the instantaneous gain based on the environment noise estimate signal. In some examples, the environment noise estimate signal corresponds to an adaptive gain, such that the noise gate and compander settings 1452 adds the adaptive gain to the instantaneous gain selected based on a static gain curve. However, the disclosure is not limited thereto, and the environment noise estimate signal may correspond to a magnitude of audio energy associated with the environment noise and the noise gate and compander settings 1452 may adjust the instantaneous gain based on the magnitude without departing from the disclosure.

FIG. 15 illustrates an example of volume-leveled output data with environment-aware adaptive gain applied according to embodiments of the present disclosure. As illustrated in FIG. 15, noise waveform chart 1510 represents a waveform of the environment noise, which includes a noticeable increase in audio energy during a period of time indicated by gray shading. Raw input chart 1512 represents the audio data prior to applying environment-aware adaptive gain, whereas environment-adjusted output chart 1514 represents the audio data after applying the environment-aware adaptive gain. As illustrated in FIG. 15, the environment-adjusted output chart 1514 has an increased amplitude corresponding to the increased energy represented in the noise waveform 1510. Thus, the playback audio will be output at a higher volume to compensate for the environment noise during the period of time indicated by gray shading.

Figure 16:
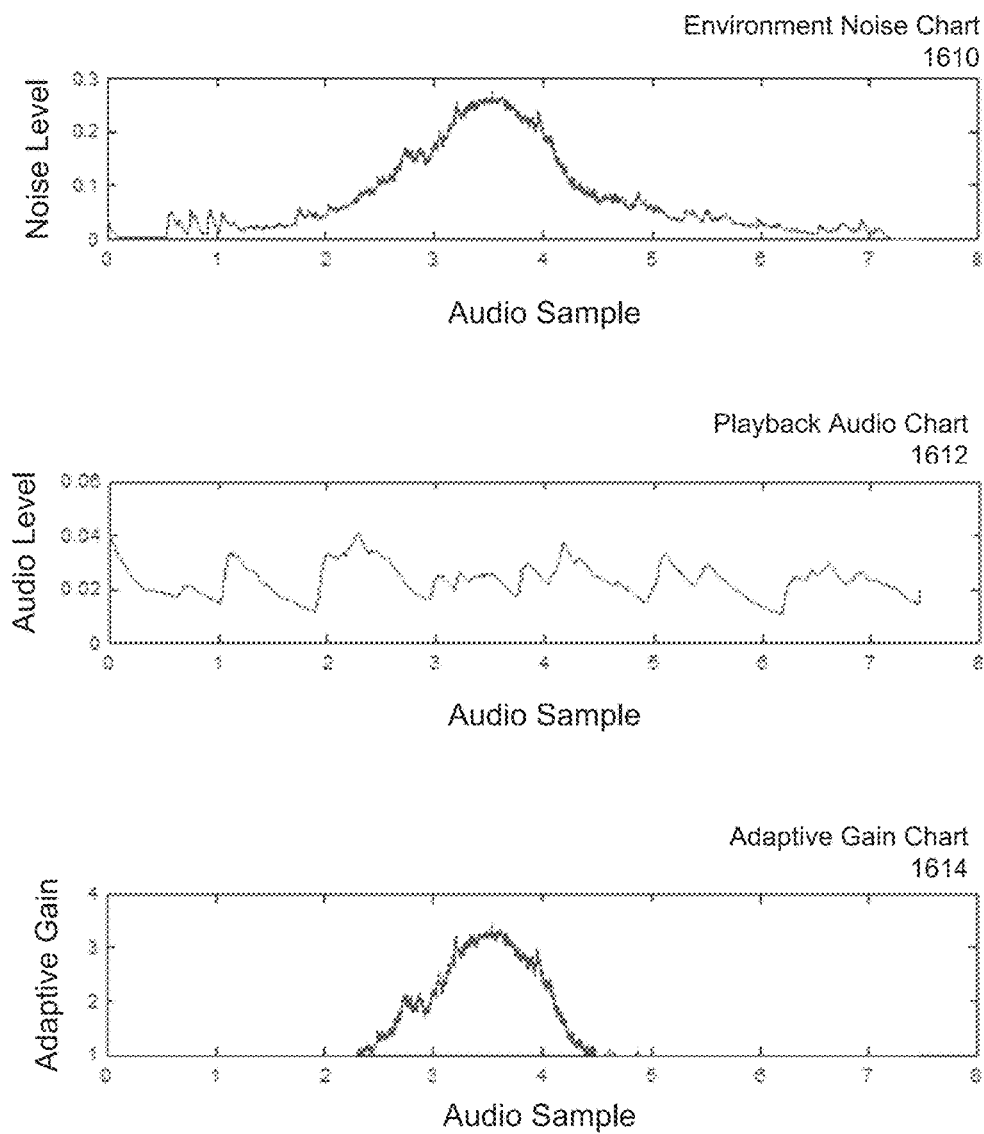
FIG. 16 illustrates an example of determining environment-aware adaptive gain according to embodiments of the present disclosure.

FIG. 16 illustrates an example of determining environment-aware adaptive gain according to embodiments of the present disclosure. As illustrated in FIG. 16, an environment noise chart 1610 represents an increased noise level associated with environment noise, a playback audio chart 1612 represents level of playback audio data, and an adaptive gain chart 1614 represents an adaptive gain determined based on the environment noise level. For example, the device 110 may determine the adaptive gain chart 1614 to compensate for the increase in the environment noise level.

Figure 17:
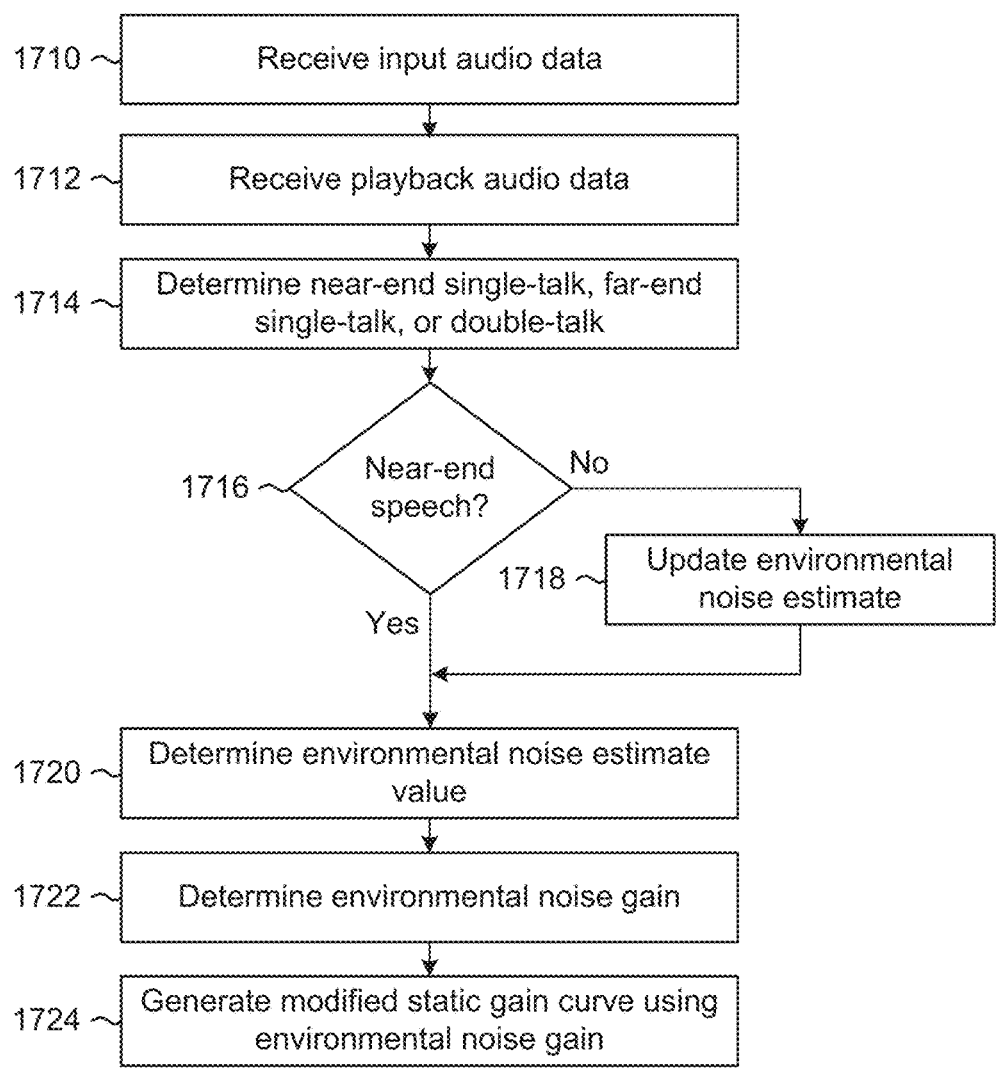
FIG. 17 is a flowchart conceptually illustrating an example method for determining environment-aware adaptive gain according to embodiments of the present disclosure.

FIG. 17 is a flowchart conceptually illustrating an example method for determining environment-aware adaptive gain according to embodiments of the present disclosure. As illustrated in FIG. 17, the device 110 may receive (1710) input audio data, may receive (1712) playback audio data, and may determine (1714) whether near-end single-talk, far-end single-talk, or double-talk conditions are present.

The device 110 may determine (1716) whether near-end speech is present (e.g., near-end single-talk and/or double-talk conditions) and, if not present, the device 110 may update (1718) an environmental noise estimate. After updating the environmental noise estimate, or if the near-end speech is present, the device 110 may determine (1720) an environmental noise estimate value, may determine (1722) an environmental noise gain, and may generate (1724) a modified static gain curve using the environmental noise gain. However, the disclosure is not limited thereto, and the device 110 may apply the environmental noise gain to the instantaneous gain value determined using the static gain curve without modifying the static gain curve without departing from the disclosure.

Figure 18:
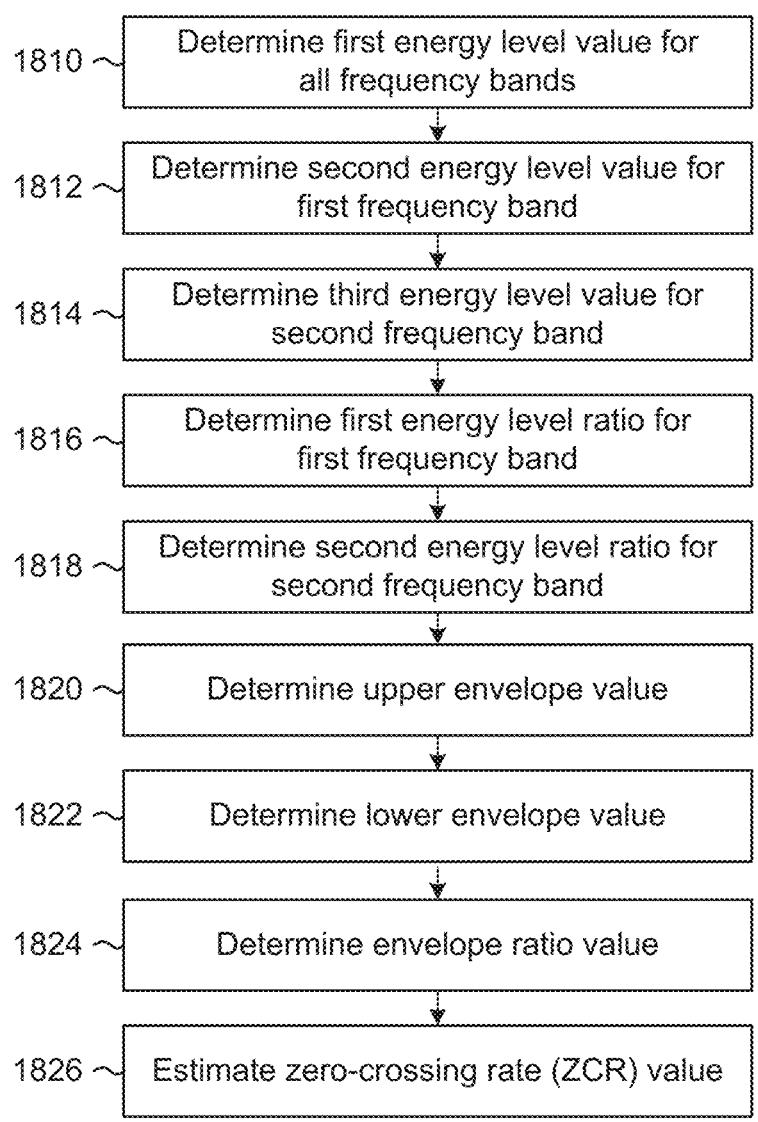
FIG. 18 is a flowchart conceptually illustrating an example method for determining feature data according to embodiments of the present disclosure.

FIG. 18 is a flowchart conceptually illustrating an example method for determining feature data according to embodiments of the present disclosure. As illustrated in FIG. 18, the device 110 may determine (1810) a first energy level value for all frequency bands of the input audio data (e.g., full-band energy level value), may determine (1812) a second energy level value for a first frequency band (e.g., 300 Hz to 3 kHz) of the input audio data, and may determine (1814) a third energy level value for a second frequency band (e.g., 8 kHz to 16 kHz) of the input audio data. The device 110 may determine (1816) a first energy level ratio between the first frequency band and the full-band (e.g., ratio between the second energy level value and the first energy level value) and may determine (1818) a second energy level ratio between the second frequency band and the full-band (e.g., ratio between the third energy level value and the first energy level value). The first energy level value (e.g., full-band energy of the input audio data) may be used to differentiate between silence and music/voice signals, whereas the first energy level ratio and the second energy level ratio may be used to differentiate between voice signals and music signals.

The device 110 may determine (1820) an upper envelope value of the input audio data and may determine (1822) a lower envelope value of the input audio data and may determine (1824) an envelope ratio value (e.g., ratio between the upper envelope value and the lower envelope value). For example, the upper envelope value corresponds to the output of a fast-attack slow-release filter with the absolute value of input audio data as the input, the lower envelope value corresponds to the output of a slow-attack fast-release filter with the absolute value of input audio data as the input, and the envelope ratio value indicates an estimate of signal-to-noise ratio of the input audio data. The envelope ratio value may be used to differentiate between noise/silence and voice signals.

The device 110 may estimate (1826) a zero-crossing rate (ZCR) value for the input audio data (e.g., rate of sign-changes along the input audio data, such as the rate at which the input audio data includes an amplitude change from a positive value to a negative value or from a negative value to a positive value). The ZCR value may be used to differentiate between noise and music/voice signals.

Figure 19A:
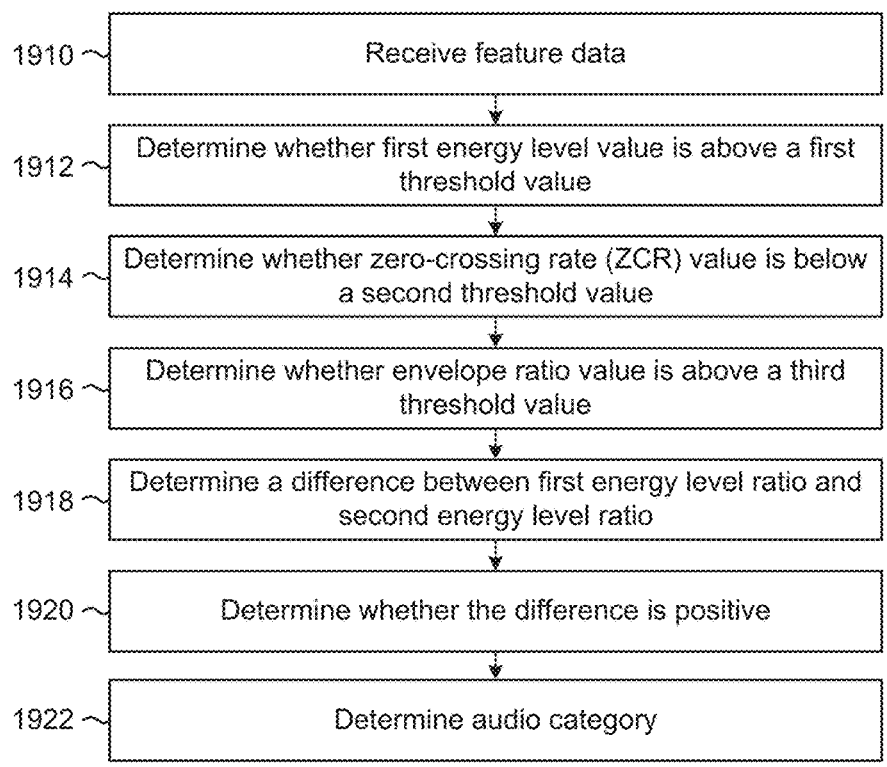
FIGS. 19A-19C are flowcharts conceptually illustrating example methods for determining an audio category according to embodiments of the present disclosure.
Figure 19B:
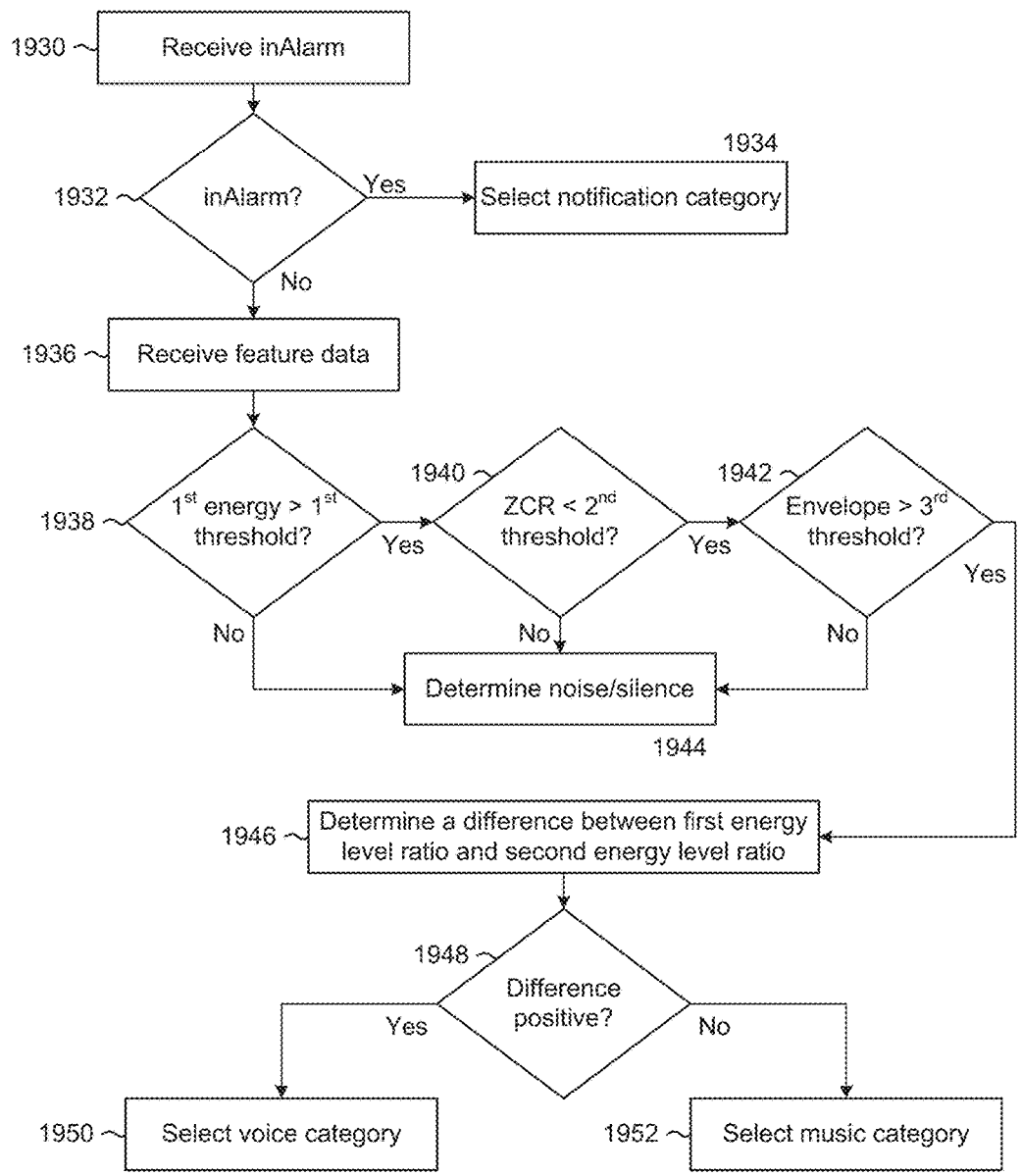
Figure 19C:
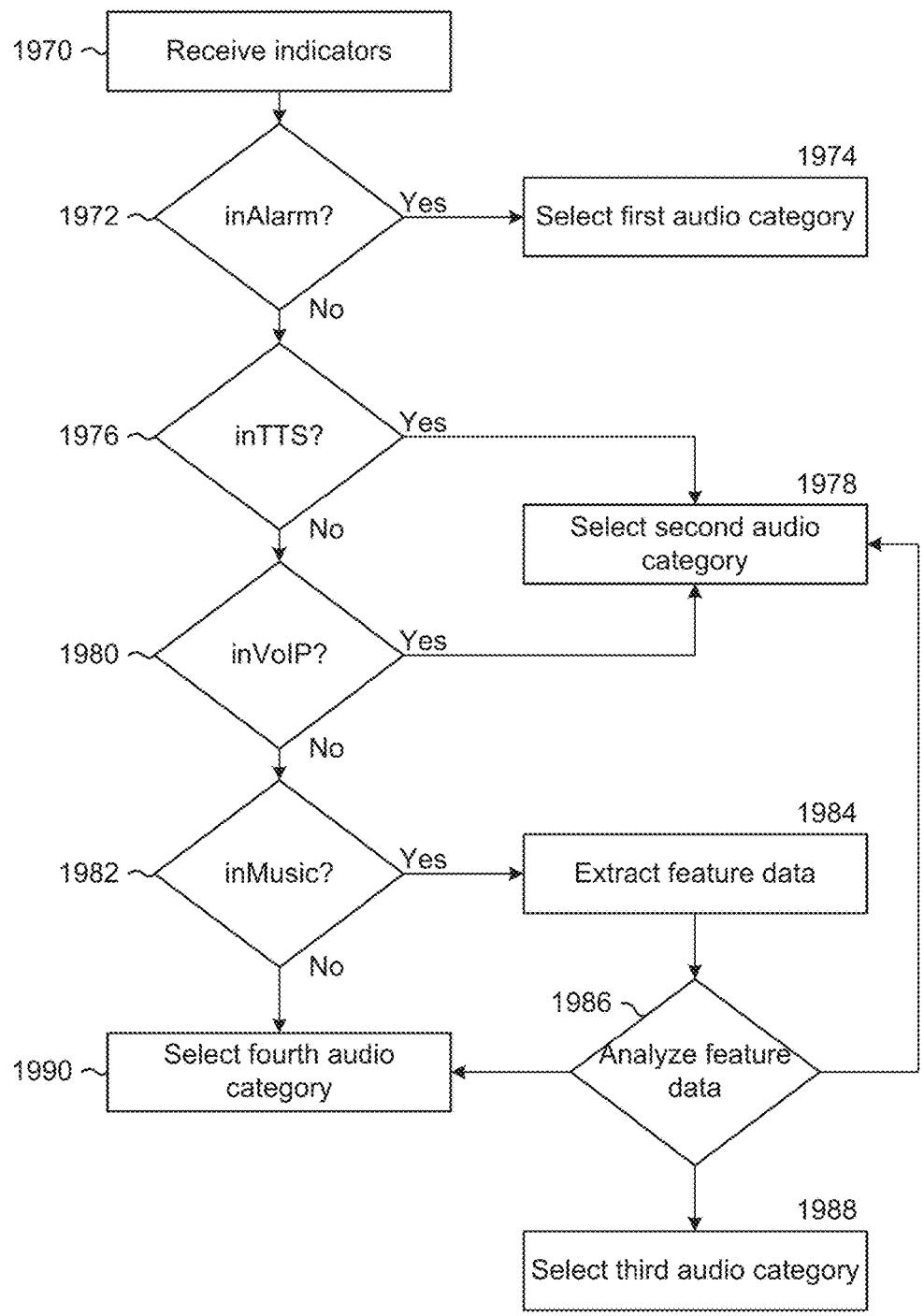

FIGS. 19A-19C are flowcharts conceptually illustrating example methods for determining an audio category according to embodiments of the present disclosure. FIG. 19A illustrates a first example method for performing audio classification to determine the audio category. As illustrated in FIG. 19A, the device 110 may receive (1910) feature data and may determine (1912) whether the first energy level value is above a first threshold value. For example, the device 110 may use the first energy level value (e.g., full-band energy of the input audio data) to differentiate between silence and music/voice signals, with the first threshold value corresponding to a value between first energy level values associated with silence and second energy levels associated with the music/voice signals (e.g., first energy level values are lower than second energy level values).

The device 110 may determine (1914) whether the ZCR value is below a second threshold value. For example, the device 110 may use the ZCR value to differentiate between noise and music/voice signals, with the second threshold value corresponding to a value between first ZCR values associated with music/voice signals and second ZCR values associated with noise (e.g., second ZCR values are higher than first ZCR values).

The device 110 may determine (1916) whether the envelope ratio value is above a third threshold value. For example, the device 110 may use the envelope ratio to differentiate between noise/silence and voice signals, with the third threshold value corresponding to a value between first envelope ratio values associated with noise/silence and second envelope ratio values associated with voice signals (e.g., second envelope ratio values are higher than first envelope ratio values).

The device 110 may determine (1918) a difference between the first energy level ratio and the second energy level ratio and determine (1920) whether the difference is positive. For example, the difference is positive when the first energy level ratio is larger than the second energy level ratio, which corresponds to voice signals, and the difference is negative when the first energy level ratio is smaller than the second energy level ratio, which corresponds to music signals. Thus, the device 110 may identify voice signals as the lower frequency bands have more energy relative to the full-band signal than music signals, and the device 110 may identify music signals as the higher frequency bands have more energy relative to the full-band signal than voice signals.

Based on steps 1910-1920, the device 110 may determine (1922) the audio category. For example, the device 110 may identify silence based on the first energy level value, may identify noise based on the ZCR value, may distinguish between silence/noise and voice signals based on the envelope ratio value, and may distinguish between voice signals and music signals based on the first energy level ratio and the second energy level ratio.

As illustrated in FIG. 5B, the device 110 may receive (1930) an inAlarm indicator, may determine (1932) whether inAlarm is true (e.g., first binary value, such as a value of one), and if so, may select (1934) a notification category (e.g., first audio category corresponding to alarm signals, which have a gain value of 0.0 dB).

If inAlarm is false (e.g., second binary value, such as a value of zero), the device 110 may receive (1936) feature data and may determine (1938) whether the first energy level value is above a first threshold value, determine (1940) whether the ZCR value is below a second threshold value, and determine (1942) whether the envelope ratio value is above a third threshold value. If any of these determinations are negative (e.g., the device 110 selects no in any of steps 1938-1942), the device 110 may determine (1944) that noise/silence is detected.

If all of the determinations are positive (e.g., the device 110 selects yes in steps 1938-1942), the device 110 may determine (1946) a difference between the first energy level ratio and the second energy level ratio and determine (1948) whether the difference is positive. If the difference is positive, the device 110 may select (1950) a voice category (e.g., second audio category corresponding to voice signals). If the difference is negative, the device 110 may select (1952) a music category (e.g., third audio category corresponding to music signals).

As illustrated in FIG. 19C, the device 110 may receive (1970) indicators. The device 110 may determine (1972) whether inAlarm is true (e.g., first binary value, such as a value of one), and if so, may select (1974) a first audio category (e.g., alarm signals, which corresponds to a gain value of 0.0 dB).

If inAlarm is false (e.g., second binary value, such as a value of zero), the device 110 may determine (1976) whether inTTS is true and, if so, may select (1978) a second audio category (e.g., voice signals). If inTTS is false, the device 110 may determine (1980) whether inVoIP is true, and if so, may select the second audio category in step 1978.

If inVoIP is false, the device 110 may determine (1982) whether inMusic is true and, if so, may extract (1984) feature data and may analyze (1986) the feature data, as discussed above with regard to FIG. 19A. By analyzing the feature data, the device 110 may determine an audio category based on the feature data. Therefore, the device 110 may select the second audio category (e.g., voice signals) in step 1978, select (1988) a third audio category (e.g., music signals), or may select (1990) a fourth audio category (e.g., noise/silence). If inMusic is false, the device 110 may select the fourth audio category in step 1990.

Figure 20:
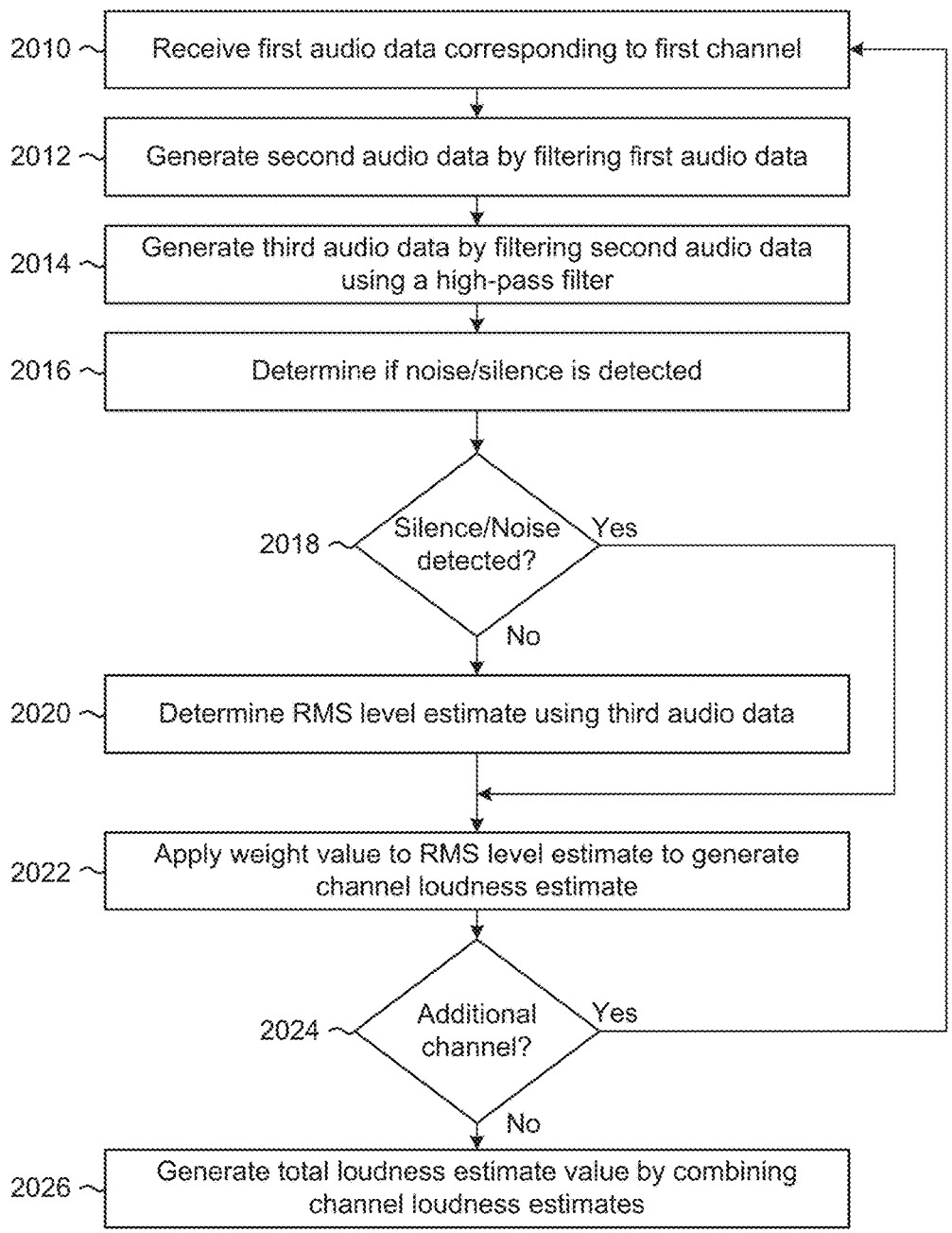
FIG. 20 is a flowchart conceptually illustrating an example method for determining a loudness estimate value according to embodiments of the present disclosure.

FIG. 20 is a flowchart conceptually illustrating an example method for determining a loudness estimate value according to embodiments of the present disclosure. As illustrated in FIG. 20, the device 110 may receive (2010) first audio data corresponding to a first channel of the input audio data, may generate (2012) second audio data by filtering the first audio data, and may generate (2014) third audio data by filtering the second audio data using a high-pass filter. For example, the device 110 may filter the first audio data using a K2-weighting filter that is a second order infinite impulse response (IIR) filter with a 100 Hz cutoff frequency, although the disclosure is not limited thereto. The high pass filter may be chosen based on a size of the loudspeaker(s) associated with the device 110, such as a 60 Hz cutoff frequency or a 300 Hz cutoff frequency.

The device 110 may determine (2016) if noise/silence is detected in the first audio data. For example, the device 110 may use the techniques discussed above with regard to the audio classifier 510 to detect noise/silence. If noise/silence is not detected, the device 110 may determine (2020) a root mean square (RMS) level estimate using the third audio data. For example, the device 110 may determine the RMS level estimate in a first time range of the third audio data. If silence/noise was detected in step 2016, the device 110 may freeze adaptation of the loudness estimate value and skip step 2020.

The device 110 may apply (2022) a weight value to the RMS level estimate to generate a channel loudness estimate. For example, for a stereo implementation, the weight value may correspond to a value of 0.5, whereas for a five-channel implementation, the weight value may correspond to a value of 0.2.

The device 110 may determine (2024) whether there is an additional channel and, if so, may loop to step 2010 and repeat steps 2010-2022 for the additional channel. If the device 110 determines that there are no additional channels in step 2024, the device 110 may generate (2026) a total loudness estimate value by combining the channel loudness estimates calculated in 2022 for each channel of the input audio data.

Figure 21A:
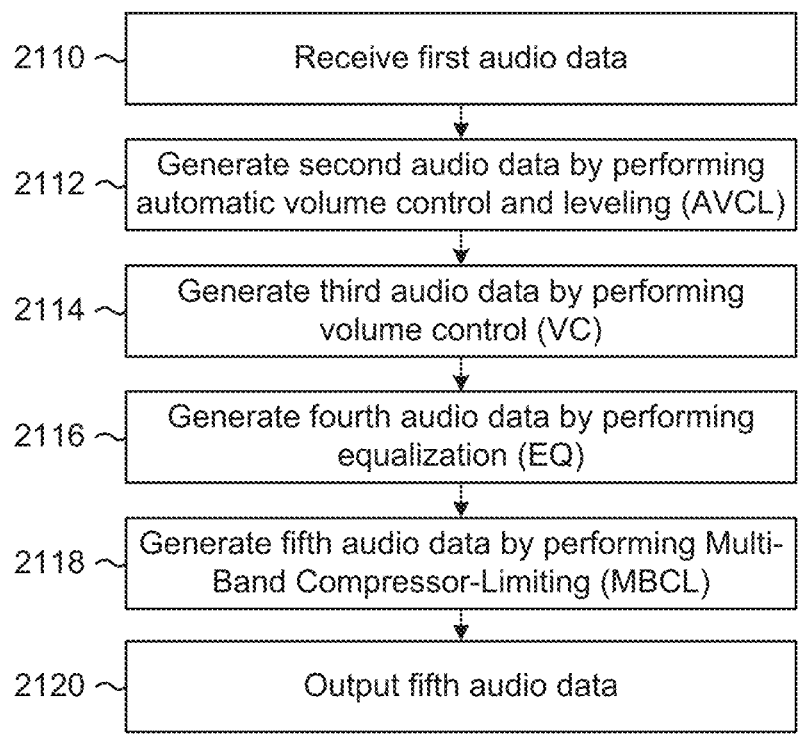
FIGS. 21A-21B are flowcharts conceptually illustrating example methods for performing automatic volume control and leveling in different audio paths according to embodiments of the present disclosure.
Figure 21B:
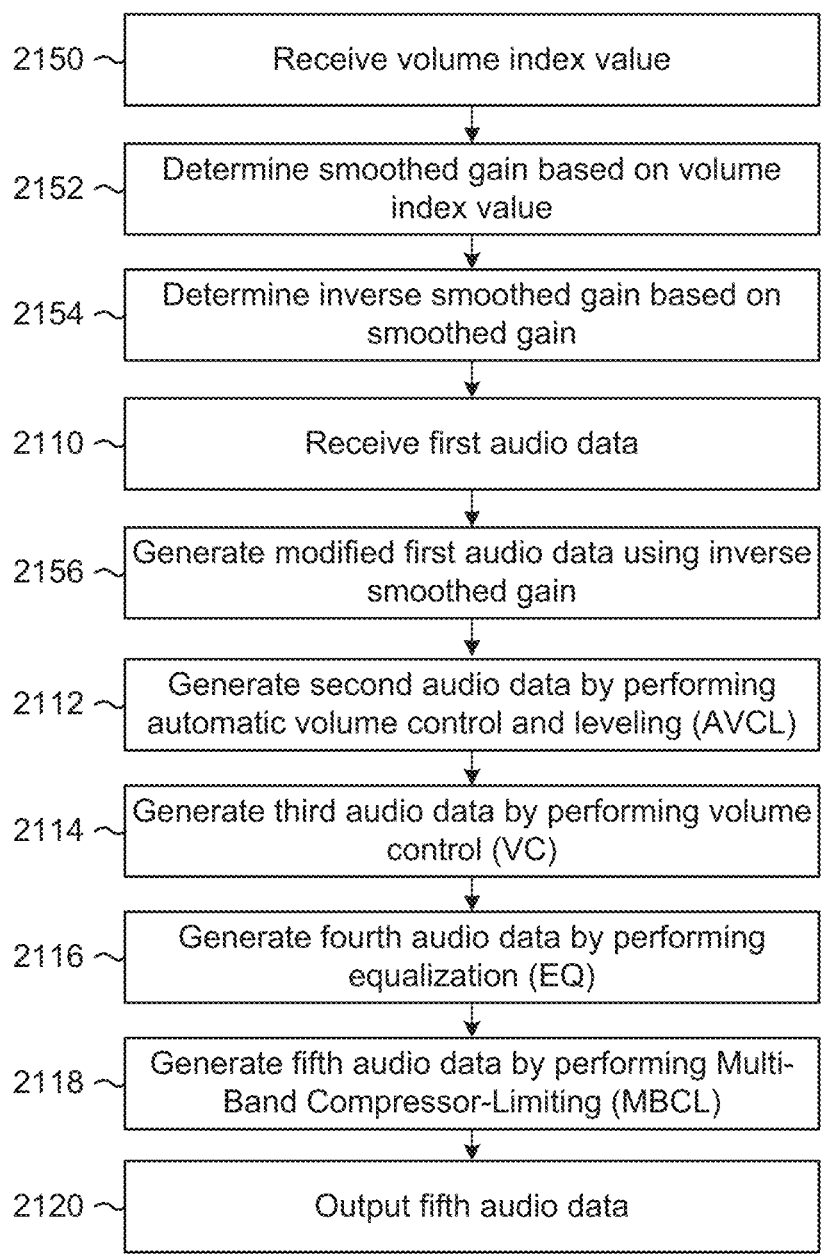

FIGS. 21A-21B are flowcharts conceptually illustrating example methods for performing automatic volume control and leveling in different audio paths according to embodiments of the present disclosure.

As illustrated in FIG. 21A, the device 110 may receive (2110) first audio data (e.g., raw input audio data) and may generate (2112) second audio data by performing automatic volume control and leveling (AVCL). For example, the AVCL 710 illustrated in FIG. 7A may receive raw input audio data and perform the AVCL to generate the second audio data, which is output to the VC 712. The AVCL 710 performs audio processing specific for the raw input audio data (or portions of the raw input audio data) based on the audio source, the audio category, the volume index value, and/or the like. Thus, the audio processing performed by the AVCL 710 changes dynamically based on the raw input audio data.

The device 110 may generate (2114) third audio data based on the second audio data by performing volume control (VC) (e.g., embedded volume control). For example, the VC 712 may perform the volume control to generate the third audio data, which is output to the equalizer (EQ) 714. The audio processing performed by the VC 712 is intended to convert volume levels from a logarithmic scale (e.g., decibels) to a linear scale (e.g., volume value between 0.0-1.0). For example, the VC 712 may correspond to embedded volume control that apply the linear scale volume to the second audio data to generate the third audio data.

The device 110 may generate (2116) fourth audio data based on the third audio data by performing equalization (EQ) (e.g., apply different gain values to different frequency bands of the third audio data). For example, the EQ 714 may perform the equalization to generate the fourth audio data, which is output to the MBCL 716. The audio processing performed by the EQ 714 depends on settings and/or user preferences stored by the device 110 and/or applications running on the device 110. For example, equalization settings may be static for the device 110, may be user-specific (e.g., equalization settings change based on user profile), may be application or process specific (e.g., each process running on the device 110 has different equalization settings), and/or may be controlled by a user interface (e.g., enabling the user 5 to easily change the equalization settings). Thus, in some examples the equalization settings may vary depending on a time of day, a source of audio, an application, a genre of music, and/or the like.

The device 110 may generate (2118) fifth audio data based on the fourth audio data by performing multi-band compressor-limiting (MBCL). For example, the MBCL 716 may perform multi-band compression/limiting (e.g., maximize loudness and bass, prevent loudspeaker audio from overflow and clipping, and reduce total harmonic distortion that is unique to one or more loudspeaker(s) associated with the device 110) to generate the fifth audio data, which is output as output audio data to be sent to one or more loudspeaker(s). The MBCL 716 performs audio processing specific for the one or more loudspeaker(s) that are associated with the device 110 and used to generate the output audio. Thus, the audio processing performed by the MBCL 716 is static for the device 110.

Finally, the device 110 may output (2120) the fifth audio data. For example, the device 110 may send the fifth audio data to the one or more loudspeaker(s) associated with the device 110 to generate output audio.

While FIG. 21A illustrates the device 110 receiving raw input audio data, the disclosure is not limited thereto and in other examples the device 110 may receive modified input audio data that has already been processed with volume control or other processing, as discussed above with regard to FIG. 7B. FIG. 21B illustrates a second example method corresponding to receiving modified input audio data, wherein the device 110 may perform an inverse operation to recover the raw input audio data prior to performing AVCL and the other audio processing to generate the output audio data.

As illustrated in FIG. 21B, the device 110 may receive (2150) a volume index value, may determine (2152) a smoothed gain based on the volume index value, and may determine (2154) inverse smoothed gain based on the smoothed gain, as discussed above with regard to FIG. 7B. For example, the inverse volume control 732 illustrated in FIG. 7B may determine an inverse smoothed gain based on the smoothed gain (e.g., InverseSmoothedGain=1.0/smoothedGain).

The device 110 may then receive (2110) the first audio data and generate (2156) modified first audio data using the inverse smoothed gain. For example, the device 110 may use the inverse smooth gain and the first audio data to recover the raw input audio data, which corresponds to the input audio data prior to volume control being performed. The device 110 may then perform steps 2112-2120 using the modified first audio data in order to generate and output the fifth audio data.

Figure 22:
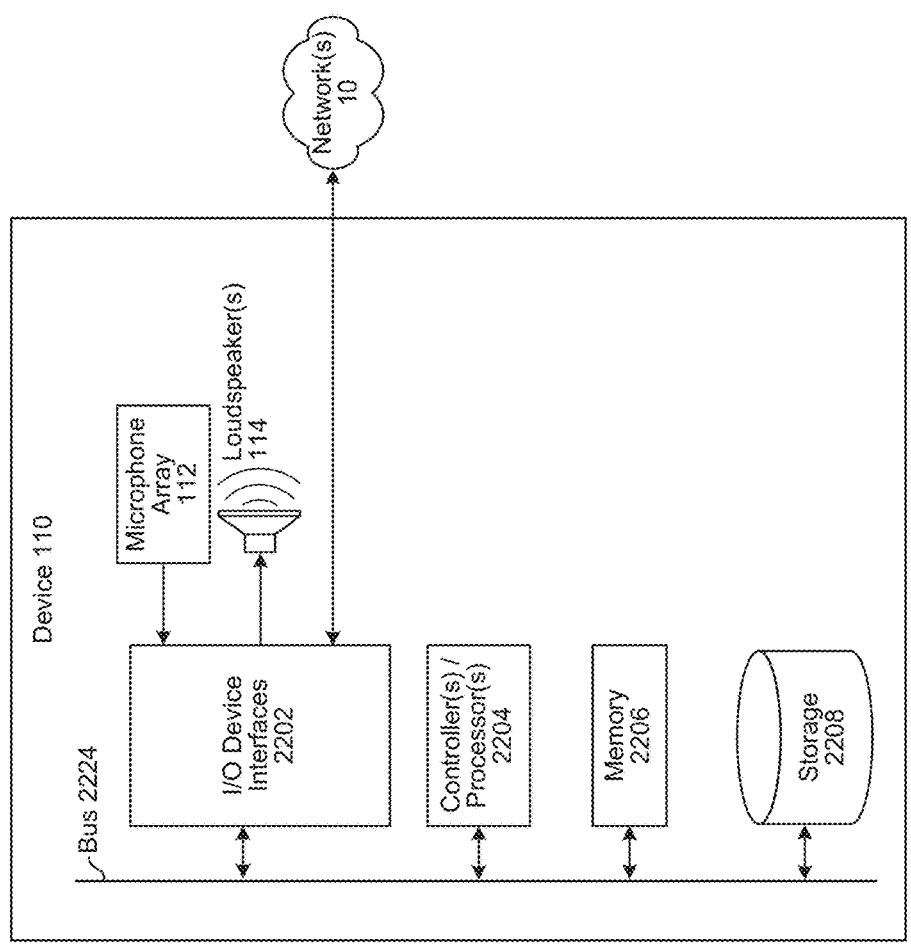
FIG. 22 is a block diagram conceptually illustrating example components of a system according to embodiments of the present disclosure.

FIG. 22 is a block diagram conceptually illustrating example components of the system 100. In operation, the system 100 may include computer-readable and computer-executable instructions that reside on the device 110, as will be discussed further below.

The device 110 may include one or more audio capture device(s), such as a microphone 112 or an array of microphones. The audio capture device(s) may be integrated into the device 110 or may be separate. The device 110 may also include an audio output device for producing sound, such as loudspeaker(s) 114. The audio output device may be integrated into the device 110 or may be separate. In some examples the device 110 may include a display, but the disclosure is not limited thereto and the device 110 may not include a display or may be connected to an external device/display without departing from the disclosure.

The device 110 may include an address/data bus 2224 for conveying data among components of the device 110. Each component within the device 110 may also be directly connected to other components in addition to (or instead of) being connected to other components across the bus 2224.

The device 110 may include one or more controllers/processors 2204, which may each include a central processing unit (CPU) for processing data and computer-readable instructions, and a memory 2206 for storing data and instructions. The memory 2206 may include volatile random access memory (RAM), non-volatile read only memory (ROM), non-volatile magnetoresistive (MRAM) and/or other types of memory. The device 110 may also include a data storage component 2208, for storing data and controller/processor-executable instructions. The data storage component 2208 may include one or more non-volatile storage types such as magnetic storage, optical storage, solid-state storage, etc. The device 110 may also be connected to removable or external non-volatile memory and/or storage (such as a removable memory card, memory key drive, networked storage, etc.) through the input/output device interfaces 2202.

Computer instructions for operating the device 110 and its various components may be executed by the controller(s)/processor(s) 2204, using the memory 2206 as temporary "working" storage at runtime. The computer instructions may be stored in a non-transitory manner in non-volatile memory 2206, storage 2208, or an external device. Alternatively, some or all of the executable instructions may be embedded in hardware or firmware in addition to or instead of software.

The device 110 includes input/output device interfaces 2202. A variety of components may be connected through the input/output device interfaces 2202, such as the microphone array 112, the loudspeaker(s) 114, and/or the display.

The input/output interfaces 2202 may include A/D converters for converting the output of the microphone array 112 into microphone audio data, if the microphone array 112 is integrated with or hardwired directly to the device 110. If the microphone array 112 is independent, the A/D converters will be included with the microphone array 112, and may be clocked independent of the clocking of the device 110. Likewise, the input/output interfaces 2202 may include D/A converters for converting output audio data into an analog current to drive the loudspeakers 114, if the loudspeakers 114 are integrated with or hardwired to the device 110. However, if the loudspeakers 114 are independent, the D/A converters will be included with the loudspeakers 114 and may be clocked independent of the clocking of the device 110 (e.g., conventional Bluetooth loudspeakers).

The input/output device interfaces 2202 may also include an interface for an external peripheral device connection such as universal serial bus (USB), FireWire, Thunderbolt or other connection protocol. The input/output device interfaces 2202 may also include a connection to one or more networks 10 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of digital signal processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method, the method comprising:

receiving a volume value for output audio, wherein the volume value indicates a percentage of a maximum output volume level;

receiving first audio data to output using at least one loudspeaker;

determining that the first audio data corresponds to a music category;

selecting, based on the volume value and the music category, a gain curve that includes a plurality of gain values, wherein the gain curve includes:
- a first energy range from a first input level to a second input level, the first energy range including a first set of gain values of the plurality of gain values, each gain value of the first set of gain values being below 0 dB,
- a second energy range from the second input level to a third input level, the second energy range including a second set of gain values of the plurality of gain values, each gain value of the second set of gain values being above 0 dB,
- a third energy range from the third input level to a fourth input level, the third energy range including a third set of gain values of the plurality of gain values, each gain value of the third set of gain values having a value of 0 dB, and
- a fourth energy range from the fourth input level to a fifth input level, the fourth energy range including a fourth set of gain values of the plurality of gain values, each gain value of the fourth set of gain values being below 0 dB;

determining a first loudness value corresponding to a first portion of the first audio data, the first loudness value being equal to a root mean square amplitude of a plurality of amplitude values within the first portion of the first audio data;

determining that the first loudness value is between the first input level and the second input level, indicating that the first loudness value corresponds to the first energy range of the gain curve;

determining a first gain value of the plurality of gain values, wherein the first gain value is based on the first loudness value and the first energy range;

determining a second loudness value corresponding to a second portion of the first audio data;

determining that the second loudness value is between the second input level and the third input level, indicating that the second loudness value corresponds to the second energy range of the gain curve;

determining a second gain value of the plurality of gain values, wherein the second gain value is based on the second loudness value and the second energy range;

generating second audio data by applying the first gain value to the first portion of the first audio data and the second gain value to the second portion of the first audio data; and sending the second audio data to the at least one loudspeaker.

2. The computer-implemented method of claim 1, wherein determining the second gain value further comprises:
determining a slope value associated with a portion of the second set of gain values;
determining a maximum gain value associated with the second set of gain values;
determining a threshold value indicating a minimum input level associated with the maximum gain value;
determining a difference between the second loudness value and the threshold value;
determining a product by multiplying the difference by the slope value, the product having a negative value indicating a gain reduction below the maximum gain value; and
determining the second gain value by adding the product to the maximum gain value.

3. The computer-implemented method of claim 1, wherein selecting the gain curve further comprises:
determining a third loudness value associated with the first audio data, the third loudness value corresponding to a maximum amplitude of the first audio data;
determining a noise value associated with the first audio data, the noise value corresponding to an average value of noise represented in the first audio data;
determining a signal-to-noise ratio (SNR) value associated with the first audio data by dividing the third loudness value by the noise value; and
selecting the gain curve based on the volume value, the first audio category, and the SNR value.

4. The computer-implemented method of claim 1, wherein determining the first gain value further comprises:
selecting, from the first set of gain values, a second gain value corresponding to the first loudness value;
determining that near-end speech is not present during a first time window in third audio data generated by at least one microphone;
updating, using a third portion of the first audio data that corresponds to the first time window, an environmental noise estimate;
determining a noise floor value of the environmental noise estimate;
determining, based on the environmental noise estimate, an environmental noise estimate value corresponding to the first portion of the first audio data;
determining, by dividing the environmental noise estimate value by the noise floor value, a third gain value; and
determining the first gain value by summing the second gain value and the third gain value.

5. A computer-implemented method comprising:
receiving a volume value indicating a desired output volume;
receiving first audio data;
determining a first audio category associated with the first audio data;
determining, based on the volume value and the first audio category, a gain curve that includes a plurality of gain values;
determining a first loudness value corresponding to a first portion of the first audio data;
determining that the first loudness value is within a first energy range of the gain curve, the first energy range corresponding to attenuation;
determining a first gain value of the plurality of gain values, wherein the first gain value is based on the first loudness value and the first energy range;
generating second audio data corresponding to the first audio data based on the first gain value; and
sending the second audio data to a loudspeaker.

6. The computer-implemented method of claim 5, further comprising:
determining a second loudness value corresponding to a second portion of the first audio data;
determining that the second loudness value is within a second energy range of the gain curve, the second energy range corresponding to expansion and associated with input levels that are greater than the first energy range;

determining a second gain value of the plurality of gain values, wherein the second gain value is based on the second loudness value and the second energy range; and generating the second audio data based on the first gain value and the second gain value.

7. The computer-implemented method of claim 6, further comprising:

determining a third loudness value corresponding to a third portion of the first audio data;

determining that the third loudness value is within a third energy range of the gain curve, the third energy range corresponding to a linear processing region and associated with input levels that are greater than the second energy range;

determining a third gain value of the plurality of gain values, wherein the third gain value is based on the third loudness value and the third energy range and corresponds to a value of 0 dB;

determining a fourth loudness value corresponding to a fourth portion of the first audio data;

determining that the fourth loudness value is within a fourth energy range of the gain curve, the fourth energy range corresponding to compression and associated with input levels greater than the third energy range;

determining a fourth gain value of the plurality of gain values, wherein the fourth gain value is based on the fourth loudness value and the fourth energy range; and generating the second audio data based on the first gain value, the second gain value, the third gain value, and the fourth gain value.

8. The computer-implemented method of claim 5, wherein the gain curve includes:

the first energy range from a first input level to a second input level, the first energy range including a first set of gain values of the plurality of gain values, each gain value of the first set of gain values being below 0 dB;

a second energy range from the second input level to a third input level, the second energy range including a second set of gain values of the plurality of gain values, each gain value of the second set of gain values being above 0 dB;

a third energy range from the third input level to a fourth input level, the third energy range including a third set of gain values of the plurality of gain values, each gain value of the third set of gain values having a value of 0.0 dB; and a fourth energy range from the fourth input level to a fifth input level, the fourth energy range including a fourth set of gain values of the plurality of gain values, each gain value of the fourth set of gain values being below 0 dB.

9. The computer-implemented method of claim 5, further comprising:

receiving a second volume value;

determining a second gain curve, wherein the second gain curve is based on the second volume value and the first audio category and includes a second plurality of gain values;

determining that the first loudness value is within a second energy range of the gain curve, the second energy range corresponding to expansion;

determining a second gain value of the second plurality of gain values, wherein the second gain value is based on the first loudness value and the second energy range; and generating third audio data corresponding to the first audio data based on the second gain value.

10. The computer-implemented method of claim 5, wherein determining the first gain value further comprises:

determining a slope value associated with the first energy range;

determining a threshold value associated with the first energy range;

determining a maximum gain value associated with the first energy range; and determining a difference between the first loudness value and the threshold value;

determining a product by multiplying the difference by the slope value; and determining the first gain value by adding the product to the maximum gain value.

11. The computer-implemented method of claim 5, wherein determining the gain curve further comprises:

determining, based on the first audio category and the volume value, a first threshold value that separates the first energy range from a second energy range; and determining, based on the first audio category and the volume value, a second threshold value that separates the second energy range from a third energy range.

12. The computer-implemented method of claim 5, wherein determining the gain curve further comprises:

determining a signal-to-noise ratio (SNR) value associated with the first portion of the first audio data; and determining the plurality of values associated with the gain curve based on the volume value, the first audio category, and the SNR value.

13. The computer-implemented method of claim 5, wherein determining the gain curve further comprises:

selecting a second plurality of values based on the volume value and the first audio category, the second plurality of values corresponding to a first positive slope value, a first maximum gain value, a first negative slope value, and a first noise gate value;

determining a signal-to-noise ratio (SNR) value associated with the first portion of the first audio data;

determining, based on the SNR value, a second positive slope value;

determining, based on the SNR value, a second maximum gain value;

determining, based on the SNR value, a second negative slope value;

determining, based on the SNR value, a second noise gate value; and generating the plurality of values based on the second plurality of values, the plurality of values corresponding to the second positive slope value, the second maximum gain value, the second negative slope value, and the second noise gate value.

14. The computer-implemented method of claim 5, wherein determining the gain curve further comprises:

selecting a second plurality of values based on the volume value and the first audio category;

determining an environment noise estimate value corresponding to environment noise represented in the first portion of the first audio data;

determining, based on the environment noise estimate value, a second gain value; and generating the plurality of values by summing the second plurality of values and the second gain value.

15. The computer-implemented method of claim 5, wherein determining the first gain value further comprises:
determining, based on the first loudness value and the first energy range of the gain curve, a second gain value;
determining an environment noise estimate value corresponding to environment noise represented in the first portion of the first audio data;
determining, based on the environment noise estimate value, a third gain value; and
determining the first gain value by summing the second gain value and the third gain value.

16. A system, comprising:
at least one processor;
memory including instructions operable to be executed by the at least one processor to cause the system to:
receive a volume value indicating a desired output volume;
receive first audio data;
determine a first audio category associated with the first audio data;
determine, based on the volume value and the first audio category, a gain curve that includes a plurality of gain values;
determine a first loudness value corresponding to a first portion of the first audio data;
determine that the first loudness value is within a first energy range of the gain curve, the first energy range corresponding to attenuation;
determine a first gain value of the plurality of gain values, wherein the first gain value is based on the first loudness value and the first energy range;
generate second audio data corresponding to the first audio data based on the first gain value; and
send the second audio data to a loudspeaker.

17. The system of claim 16, wherein the memory further comprises instructions that, when executed by the at least one processor, further cause the system to:
determine a second loudness value corresponding to a second portion of the first audio data;
determine that the second loudness value is within a second energy range of the gain curve, the second energy range corresponding to expansion and associated with input levels that are greater than the first energy range;
determine a second gain value of the plurality of gain values, wherein the second gain value is based on the second loudness value and the second energy range; and
generate the second audio data based on the first gain value and the second gain value.

18. The system of claim 16, wherein the gain curve includes:
the first energy range from a first input level to a second input level, the first energy range including a first set of gain values of the plurality of gain values, each gain value of the first set of gain values being below 0 dB;
a second energy range from the second input level to a third input level, the second energy range including a second set of gain values of the plurality of gain values, each gain value of the second set of gain values being above 0 dB;
a third energy range from the third input level to a fourth input level, the third energy range including a third set of gain values of the plurality of gain values, each gain value of the third set of gain values having a value of 0 dB; and
a fourth energy range from the fourth input level to a fifth input level, the fourth energy range including a fourth set of gain values of the plurality of gain values, each gain value of the fourth set of gain values being below 0 dB.

19. The system of claim 16, wherein the memory further comprises instructions that, when executed by the at least one processor, further cause the system to:
determine a signal-to-noise ratio (SNR) value associated with the first portion of the first audio data; and
determine the plurality of values associated with the gain curve based on the volume value, the first audio category, and the SNR value.

20. The system of claim 16, wherein the memory further comprises instructions that, when executed by the at least one processor, further cause the system to:
select a second plurality of values based on the volume value and the first audio category, the second plurality of values corresponding to a first positive slope value, a first maximum gain value, a first negative slope value, and a first noise gate value;
determine a signal-to-noise ratio (SNR) value associated with the first portion of the first audio data;
determine, based on the SNR value, a second positive slope value;
determine, based on the SNR value, a second maximum gain value;
determine, based on the SNR value, a second negative slope value;
determine, based on the SNR value, a second noise gate value; and
generate the plurality of values based on the second plurality of values, the plurality of values corresponding to the second positive slope value, the second maximum gain value, the second negative slope value, and the second noise gate value.

* * * * *